US012562669B2

(12) United States Patent

Moslehi

(10) Patent No.: US 12,562,669 B2

(45) Date of Patent: Feb. 24, 2026

(54) RAPIDLY DEPLOYABLE AND TRANSPORTABLE HIGH-POWER-DENSITY SMART POWER GENERATORS

(71) Applicant: Sigmagen, Inc., Los Altos, CA (US)

(72) Inventor: Mehrdad M. Moslehi, Los Altos, CA (US)

(73) Assignee: Sigmagen, Inc., Los Altos, CA (US)

( * ) Notice: Subject to any disclaimer, the term of this patent is extended or adjusted under 35 U.S.C. 154(b) by 0 days.

(21) Appl. No.: 18/773,024

(22) Filed: Jul. 15, 2024

(65) Prior Publication Data

US 2025/0015747 A1 Jan. 9, 2025

Related U.S. Application Data

(63) Continuation of application No. 18/103,358, filed on Jan. 30, 2023, now Pat. No. 12,051,989, which is a (Continued)

(51) Int. Cl.

| | |
|---|---|
| *H02S 10/40* | (2014.01) |
| *H02S 30/10* | (2014.01) |
| *H02S 30/20* | (2014.01) |
| *H02S 40/32* | (2014.01) |
| *H02S 40/36* | (2014.01) |
| *H02S 40/38* | (2014.01) |

(Continued)

(52) U.S. Cl.

CPC .............. *H02S 10/40* (2014.12); *H02S 30/10* (2014.12); *H02S 30/20* (2014.12); *H02S 40/32* (2014.12); *H02S 40/36* (2014.12); *H02S 40/38* (2014.12); *H10F 10/148* (2025.01); *H10F 10/164* (2025.01); *H10F 19/804* (2025.01); *H10F 19/902* (2025.01)

(58) Field of Classification Search

CPC ......... H01L 31/048–049; H01L 31/042–0475; H01L 31/05–0516; H01L 31/0684; H01L 31/0488; E06B 2009/2476; H02S 40/30–38; H02S 20/22; H02S 20/26; H02S 30/20

See application file for complete search history.

(56) References Cited

U.S. PATENT DOCUMENTS

| | | |
|---|---|---|
| 3,268,366 A | 8/1966 | Guyot |
| 4,848,437 A | 7/1989 | Laniado et al. |

(Continued)

OTHER PUBLICATIONS

Patent Cooperation Treaty, International Search Report for PCT/ US2018/025548, Jun. 25, 2018, pp. 1-2.

*Primary Examiner* — Ryan S Cannon

(74) *Attorney, Agent, or Firm* — Pillsbury Winthrop Shaw Pittman LLP

(57) ABSTRACT

A portable solar photovoltaic (PV) electricity generator module comprises a plurality of smart power slat (SPS) units, each SPS unit comprising a plurality of solar cells electrically connected together based on a specified cell interconnection design, and, at least one power maximizing integrated circuit collecting electricity generated by the plurality of solar cells. The plurality of SPS units are mechanically connected such that the SPS units can be retracted for volume compaction of the module, and can be expanded for increasing PV electricity generation by the module. The module can be used as part of an electric power supply with a maximum power point tracking (MPPT) power optimizer, storage battery and leads to connect to a load. The load can be AC or DC.

20 Claims, 41 Drawing Sheets

Related U.S. Application Data continuation of application No. 16/605,650, filed as application No. PCT/US2018/025548 on Mar. 30, 2018, now Pat. No. 11,569,778.

(60) Provisional application No. 62/483,333, filed on Apr. 8, 2017.

(51) Int. Cl.

| | | |
|---|---|---|
| *H10F 10/14* | (2025.01) | |
| *H10F 10/164* | (2025.01) | |
| *H10F 19/80* | (2025.01) | |
| *H10F 19/90* | (2025.01) | |

(56) References Cited

U.S. PATENT DOCUMENTS

| | | | |
|---|---|---|---|
| 8,399,283 | B2 | 3/2013 | Fork et al. |
| 2009/0078306 | A1 | 3/2009 | Nagengast et al. |
| 2009/0218887 | A1 | 9/2009 | Ledenev et al. |
| 2010/0101562 | A1 | 4/2010 | Pellegrino |
| 2011/0240094 | A1 | 10/2011 | Hoffman |
| 2011/0253193 | A1 | 10/2011 | Korman et al. |
| 2012/0128877 | A1 | 5/2012 | Jain et al. |
| 2012/0313569 | A1 | 12/2012 | Curran |
| 2013/0153008 | A1 | 6/2013 | Garreau-Iles |
| 2014/0060610 | A1 | 3/2014 | Moslehi et al. |
| 2014/0326295 | A1 | 11/2014 | Moslehi |
| 2015/0096607 | A1 | 4/2015 | Yong |
| 2015/0101761 | A1 | 4/2015 | Moslehi et al. |
| 2015/0129031 | A1 | 5/2015 | Moslehi et al. |
| 2015/0349708 | A1 | 12/2015 | Moslehi |
| 2016/0076718 | A1 | 3/2016 | Gardiner |
| 2016/0197575 | A1 | 7/2016 | Armstrong et al. |
| 2016/0329452 | A1 | 11/2016 | Hahn et al. |
| 2017/0359016 | A1 | 12/2017 | Kim et al. |
| 2018/0076759 | A1 | 3/2018 | Yoshida et al. |
| 2018/0204967 | A1 | 7/2018 | Hall et al. |
| 2018/0363366 | A1 | 12/2018 | Ammerlaan et al. |

$0° < \Theta \le 90°$

Light Capture Face 2

Light Capture Face 1

Light Capture Face 2

Light Capture Face 1

G ≈ W

G ≈ W

101

110

$\Theta$ is adjustable between 0° and 90°

Light Capture Face 1

Light Capture Face 2

$\Theta$ is adjustable between 0° and 90°

101

115

$\Theta 1$ $\Theta 2$ $\Theta 2$ $\Theta 3$

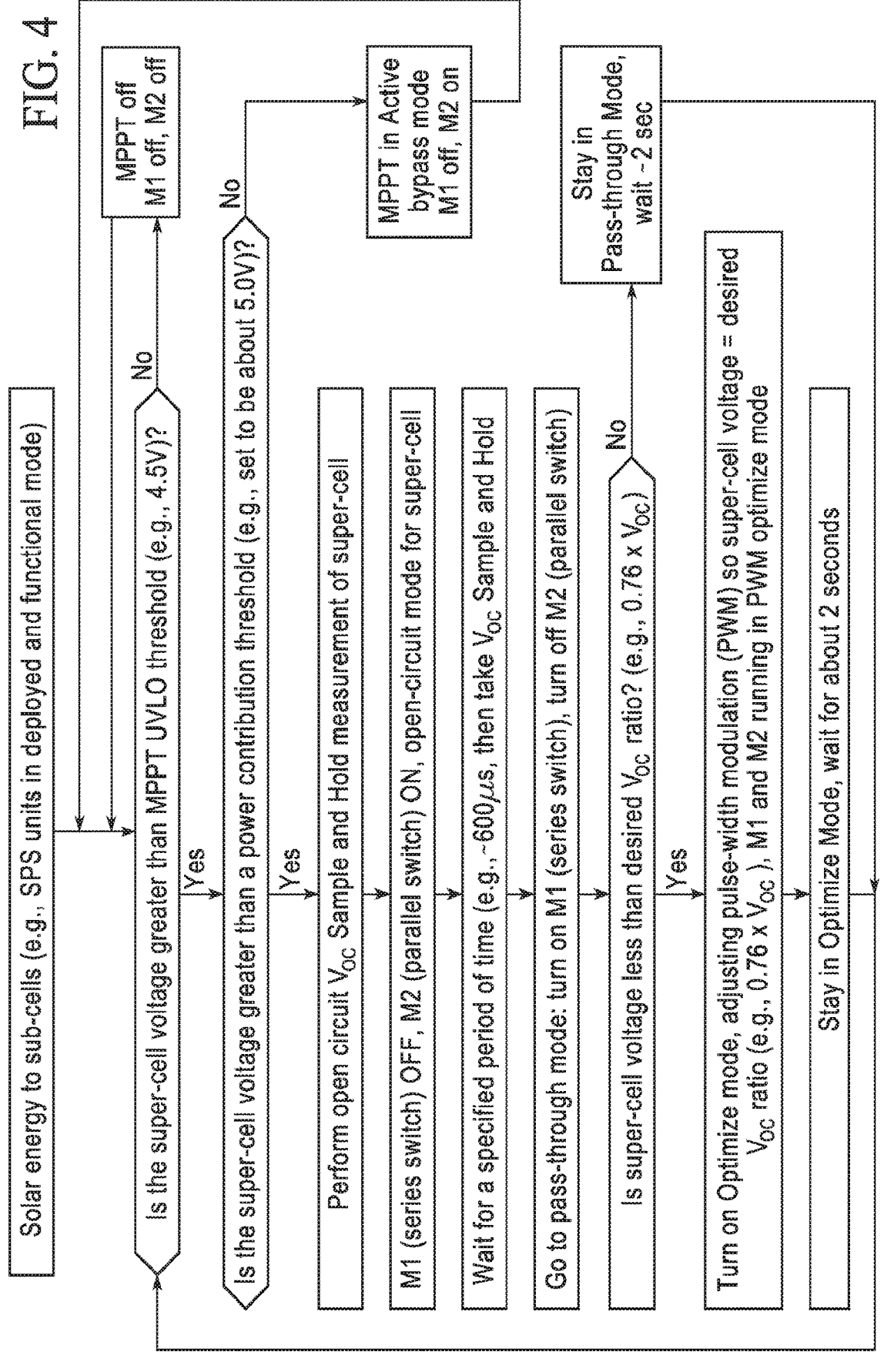

FIG. 4

Solar energy to sub-cells (e.g., SPS units in deployed and functional mode)

Is the super-cell voltage greater than MPPT UVLO threshold (e.g., 4.5V)?

No → MPPT off M1 off, M2 off

Yes

Is the super-cell voltage greater than a power contribution threshold (e.g., set to be about 5.0V)?

No → MPPT in Active bypass mode M1 off, M2 on

Yes

Perform open circuit $V_{OC}$ Sample and Hold measurement of super-cell

M1 (series switch) OFF, M2 (parallel switch) ON, open-circuit mode for super-cell Wait for a specified period of time (e.g., ~600μs, then take $V_{OC}$ Sample and Hold Go to pass-through mode: turn on M1 (series switch), turn off M2 (parallel switch)

Is super-cell voltage less than desired $V_{OC}$ ratio? (e.g., 0.76 x $V_{OC}$)

No → Stay in Pass-through Mode, wait ~2 sec

Yes

Turn on Optimize mode, adjusting pulse-width modulation (PWM) so super-cell voltage = desired $V_{OC}$ ratio (e.g., 0.76 x $V_{OC}$), M1 and M2 running in PWM optimize mode Stay in Optimize Mode, wait for about 2 seconds

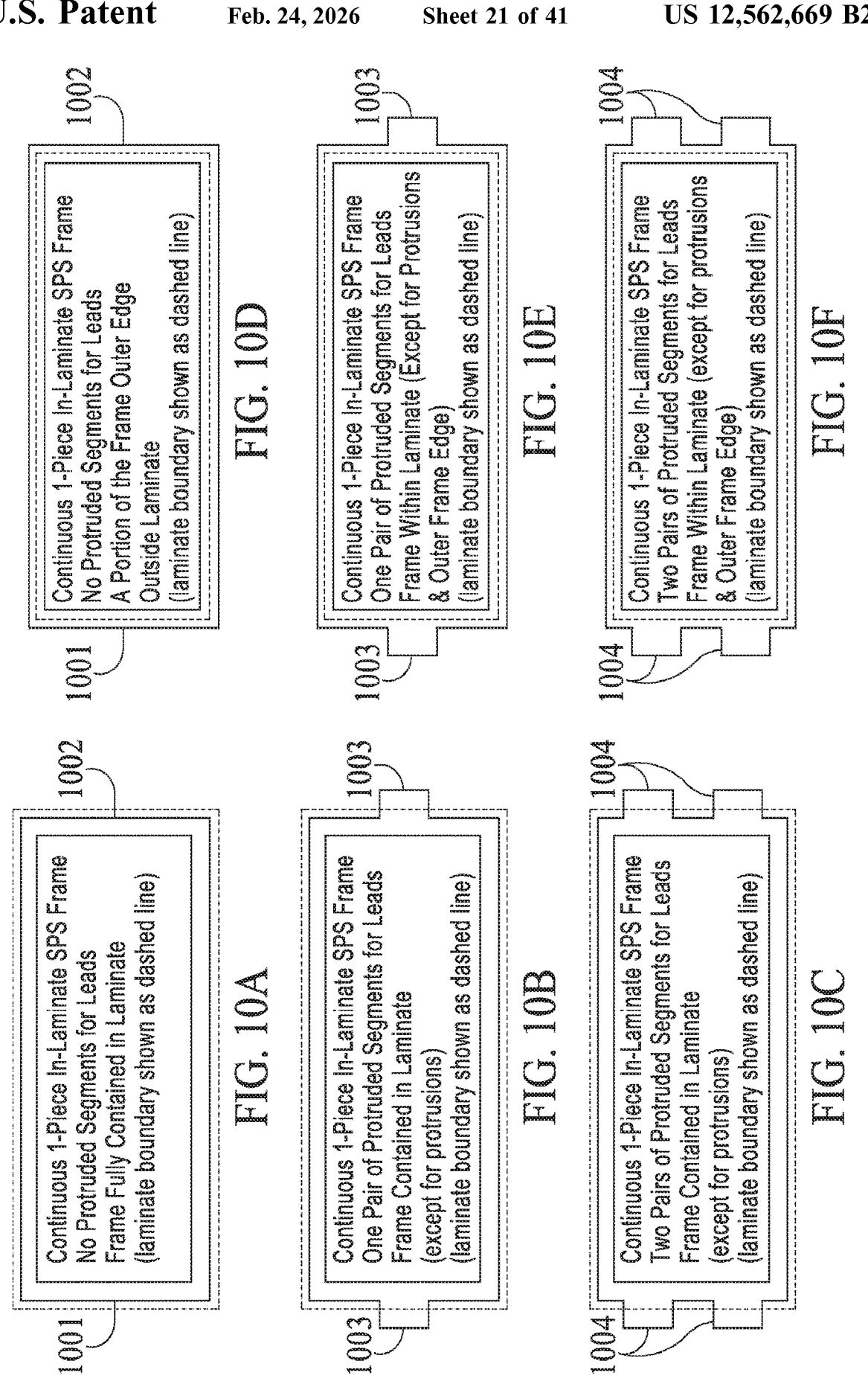

1002

Continuous 1-Piece In-Laminate SPS Frame
No Protruded Segments for Leads
Frame Fully Contained in Laminate
(laminate boundary shown as dashed line)

Continuous 1-Piece In-Laminate SPS Frame
One Pair of Protruded Segments for Leads
Frame Contained in Laminate
(except for protrusions)
(laminate boundary shown as dashed line)

Continuous 1-Piece In-Laminate SPS Frame
Two Pairs of Protruded Segments for Leads
Frame Contained in Laminate
(except for protrusions)
(laminate boundary shown as dashed line)

Continuous 1-Piece In-Laminate SPS Frame
No Protruded Segments for Leads
A Portion of the Frame Outer Edge
Outside Laminate
(laminate boundary shown as dashed line)

Continuous 1-Piece In-Laminate SPS Frame
One Pair of Protruded Segments for Leads
Frame Within Laminate (Except for Protrusions)
& Outer Frame Edge)
(laminate boundary shown as dashed line)

Continuous 1-Piece In-Laminate SPS Frame
Two Pairs of Protruded Segments for Leads
Frame Within Laminate (except for protrusions)
& Outer Frame Edge)
(laminate boundary shown as dashed line)

Figure 13:
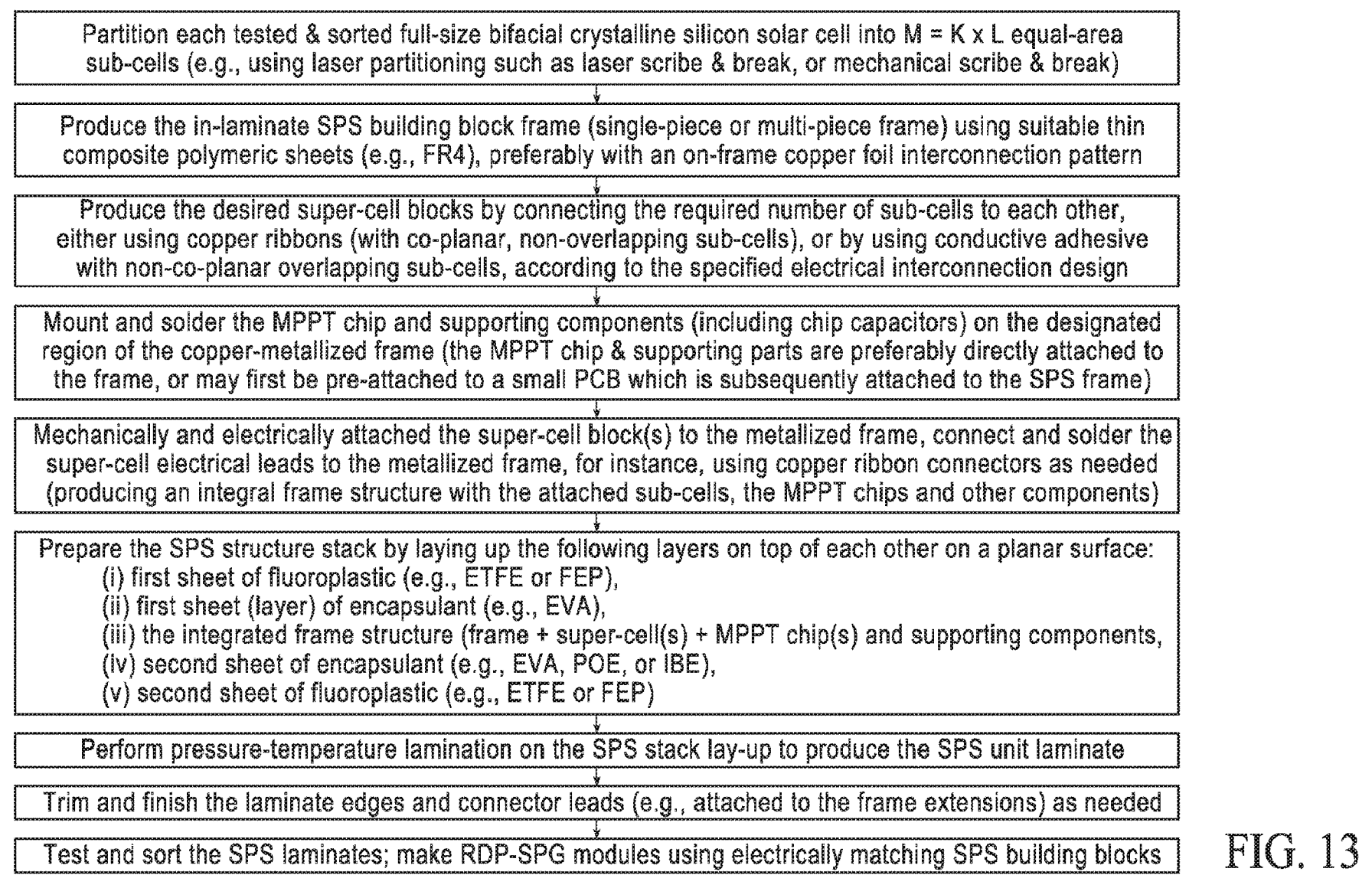

Partition each tested & sorted full-size bifacial crystalline silicon solar cell into M = K x L equal-area sub-cells (e.g., using laser partitioning such as laser scribe & break, or mechanical scribe & break)

Produce the in-laminate SPS building block frame (single-piece or multi-piece frame) using suitable thin composite polymeric sheets (e.g., FR4), preferably with an on-frame copper foil interconnection pattern Produce the desired super-cell blocks by connecting the required number of sub-cells to each other, either using copper ribbons (with co-planar, non-overlapping sub-cells), or by using conductive adhesive with non-co-planar overlapping sub-cells, according to the specified electrical interconnection design Mount and solder the MPPT chip and supporting components (including chip capacitors) on the designated region of the copper-metallized frame (the MPPT chip & supporting parts are preferably directly attached to the frame, or may first be pre-attached to a small PCB which is subsequently attached to the SPS frame)

Mechanically and electrically attached the super-cell block(s) to the metallized frame, connect and solder the super-cell electrical leads to the metallized frame, for instance, using copper ribbon connectors as needed (producing an integral frame structure with the attached sub-cells, the MPPT chips and other components)

Prepare the SPS structure stack by laying up the following layers on top of each other on a planar surface:
(i) first sheet of fluoroplastic (e.g., ETFE or FEP),
(ii) first sheet (layer) of encapsulant (e.g., EVA),
(iii) the integrated frame structure (frame + super-cell(s) + MPPT chip(s) and supporting components,
(iv) second sheet of encapsulant (e.g., EVA, POE, or IBE),
(v) second sheet of fluoroplastic (e.g., ETFE or FEP)

Perform pressure-temperature lamination on the SPS stack lay-up to produce the SPS unit laminate Trim and finish the laminate edges and connector leads (e.g., attached to the frame extensions) as needed Test and sort the SPS laminates; make RDP-SPG modules using electrically matching SPS building blocks $0° < \Theta \leq 90°$ (non-perpendicular: $\Theta \neq 90°$)

| RDP-SPG Modules Design Examples (Approximate Weight and Size) | # of Solar Cells in 1-Cell-Wide Super-Cell (S) | Partitioning of Solar Cells (M = K x L) | # of Super Cells in 1-Cell-Wide SPS Unit (Z) | # of SPS Units in RDP-SPG (U) and # of MPPT Chips | $V_{oc}$ and $I_{sc}$ of SPS Unit | Peak Power ($W_p$) of SPS Unit | Peak Power ($W_p$) of RDP-SPG |
|---|---|---|---|---|---|---|---|
| A. ~50 $W_p$ portable charger ~0.6 kg, ~18 x 35 x 1 cm³ | S = 2 | M = 3 x 2 = 6, 3 E-cuts + 0 M-cuts | Z = 1 | U = 5 SPS Units 5 MPPT Chips | $V_{oc}$ ~ 8.4 V $I_{sc}$ ≈ 1.6 A | ~10 $W_p$ | ~50 $W_p$ |
| B. ~60 $W_p$ portable charger ~0.7 kg, ~18 x 50 x 0.8 cm³ | S = 3 | M = 4 x 2 = 6, 3 E-cuts + 1 M-cuts | Z = 1 | U = 4 SPS Units 4 MPPT Chips | $V_{oc}$ ~ 8.4 V $I_{sc}$ ≈ 2.4 A | ~15 $W_p$ | ~60 $W_p$ |
| C. ~100 $W_p$ portable charger ~1.2 kg, ~18 x 66 x 1 cm³ | S = 4 | M = 3 x 3 = 9, 2 E-cuts + 2 M-cuts | Z = 1 | U = 5 SPS Units 5 MPPT Chips | $V_{oc}$ ~ 8.4 V $I_{sc}$ ≈ 3.2 A | ~20 $W_p$ | ~100 $W_p$ |
| D. ~140 $W_p$ transportable module ~1.7 kg, ~18 x 77 x 1.2 cm³ | S = 4 + 2/3 | M = 3 x 3 = 9, 2 E-cuts + 2 M-cuts | Z = 1 | U = 6 SPS Units 6 MPPT Chips | $V_{oc}$ ~ 9.8 V $I_{sc}$ ≈ 3.2 A | ~23.3 $W_p$ | ~140 $W_p$ |
| E. ~360 $W_p$ transportable module ~4.2 kg, ~18 x 195 x 1.2 cm³ | S = 4 | M = 3 x 3 = 9, 2 E-cuts + 2 M-cuts | Z = 3 | U = 6 SPS Units 18 MPPT Chips | $V_{oc}$ ~ 25.2 V $I_{sc}$ ≈ 3.2 A | ~60 $W_p$ | ~360 $W_p$ |
| F. ~400 $W_p$ transportable module ~4.8 kg, ~18 x 195 x 1.2 cm³ | S = 4 | M = 3 x 3 = 9, 2 E-cuts + 2 M-cuts | Z = 1 | U = 20 SPS Units 20 MPPT Chips | $V_{oc}$ ~ 25.2 V $I_{sc}$ ≈ 3.2 A | ~20 $W_p$ | ~400 $W_p$ |
| G. ~1,050 $W_p$ transportable module ~12.3 kg, ~18 x 227 x 3 cm³ | S = 4 + 2/3 | M = 3 x 3 = 9, 2 E-cuts + 2 M-cuts | Z = 3 | U = 15 SPS Units 45 MPPT Chips | $V_{oc}$ ~ 29.4 V $I_{sc}$ ≈ 3.2 A | ~70 $W_p$ | ~1,050 $W_p$ |
| H. ~1,080 $W_p$ transportable module ~12.6 kg, ~18 x 195 x 3.6 cm³ | S = 4 | M = 3 x 3 = 9, 2 E-cuts + 2 M-cuts | Z = 3 | U = 18 SPS Units 54 MPPT Chips | $V_{oc}$ ~ 25.2 V $I_{sc}$ ≈ 3.2 A | ~60 $W_p$ | ~1,080 $W_p$ |
| I. ~1,500 $W_p$ transportable module ~17.6 kg, ~18 x 195 x 5 cm³ | S = 4 | M = 3 x 3 = 9, 2 E-cuts + 2 M-cuts | Z = 3 | U = 25 SPS Units 75 MPPT Chips | $V_{oc}$ ~ 25.2 V $I_{sc}$ ≈ 3.2 A | ~60 $W_p$ | ~1,500 $W_p$ |
| J. ~2,400 $W_p$ transportable module ~12.3 kg, ~18 x 195 x 8 cm³ | S = 4 | M = 3 x 3 = 9, 2 E-cuts + 2 M-cuts | Z = 3 | U = 40 SPS Units 120 MPPT Chips | $V_{oc}$ ~ 25.2 V $I_{sc}$ ≈ 3.2 A | ~60 $W_p$ | ~2,400 $W_p$ |
| K. ~3,010 $W_p$ transportable module ~30.2 kg, ~18 x 195 x 8.6 cm³ | S = 4 + 2/3 | M = 3 x 3 = 9, 2 E-cuts + 2 M-cuts | Z = 3 | U = 43 SPS Units 129 MPPT Chips | $V_{oc}$ ~ 29.4 V $I_{sc}$ ≈ 3.2 A | ~70 $W_p$ | ~3,010 $W_p$ |

FIG. 21

RAPIDLY DEPLOYABLE AND TRANSPORTABLE HIGH-POWER-DENSITY SMART POWER GENERATORS

RELATED APPLICATIONS

This application is a continuation of U.S. patent application Ser. No. 18/103,358, filed Jan. 30, 2023, which is a continuation of U.S. patent application Ser. No. 16/605,650, filed Oct. 16, 2019, now U.S. Pat. No. 11,569,778, which is a U.S. National Phase patent application of PCT/US2018/025548, filed Mar. 30, 2018, which claims priority to U.S. Provisional Patent Application No. 62/483,333 filed Apr. 8, 2017, all of which are hereby incorporated by reference in their entirety.

TECHNICAL BACKGROUND

The present disclosure relates generally to a solar photovoltaic electricity generator and electric power supply, and specifically to compact design of solar photovoltaic electricity generator for rapid deployment and case of transportation. Conventional glass-covered solar PV modules may capture light only from one face (monofacial), and power generation varies widely based on various factors, such as non-uniform light conditions and presence of various localized and full shading conditions affecting portions or all of the module.

SUMMARY

Disclosed herein is electric power generation modules for various applications based on innovative integration of solar photovoltaic (PV) cells and semiconductor microelectronics. This disclosure describes various structures and manufacturing methods for Rapidly Deployable & Portable Smart Power Generators (abbreviated as "RDP-SPG" and sometimes referred to as generator modules) comprising a plurality of modular and scalable electric power-generating building blocks, known as Smart Power Slat (SPS) units.

Specifically, this disclosure describes a portable solar photovoltaic (PV) electricity generator module (i.e., the RDP-SPG module) comprising a plurality of smart power slat (SPS) units, each SPS unit comprising a plurality of solar cells electrically connected together based on a specified solar cell partitioning pattern and electrical interconnection design, and, at least one multi-modal power-maximizing semiconductor integrated circuit collecting and delivering electricity generated by the plurality of solar cells. The plurality of SPS units are mechanically or structurally connected such that the SPS units can be retracted for significant volume and surface area compaction of the power-generating module, and can be rapidly expanded or deployed for enabling solar PV electricity generation by the module.

The RDP-SPG modules of this disclosure provide a number of major benefits, including but not limited to the following:

They use relatively lightweight structures, and provide very high electric power densities and solar electric energy densities (electric power and energy generation per unit weight);

They are rapidly and easily retractable into compact volumes and compact surface areas for case of portability and transportation.

They are rapidly and easily expandable (expansive modules) into expanded three-dimensional (3D) bifacial light capture surface areas for rapid deployment and efficient power generation in target applications The "Compaction Ratio" (the ratio of the module virtual enclosure volumes when fully expanded to when fully retracted) of the RDP-SPG modules of this disclosure is at least 10, and typically in the range of at least 10 up to about 100 (typical compaction ratios are >50).

The modules of this invention can be designed for various target applications to provide maximum electric power levels in the range of about 10 watts ($W_p$) up to ~3 kilo-watts ($kW_p$) per RDP-SPG module. The modules use building blocks (i.e. the SPS units) with distributed maximum power harvesting electronics. The building blocks can be made for various power scales (e.g., ~10 to ~100 $W_p$). Optionally, a storage battery unit is attached to the RDP-SPG module or an array of RDP-SPG modules for electricity storage and uninterrupted electricity supply depending on the application.

In another aspect, this disclosure teaches an electric power supply comprising: a portable or transportable solar PV electricity generator module (i.e. the RDP-SPG module described above, or an array of the RDP-SPG modules connected together to provide higher power levels); an MPPT power optimizer for the generator module that receives electricity from the multi-modal power maximizing integrated circuits from each of the SPS units and generates aggregated power; an electricity storage device connected to the MPPT power optimizer, receiving at least a portion of the aggregated power from the MPPT power optimizer; and, output leads to deliver uninterrupted electricity to a load connected to the electric power supply.

Compared to the conventional prior art PV modules, the generator module using the bifacial SPS building block units of this disclosure are much more capable of generating maximum electrical power under variable and non-uniform light (e.g., sunlight, diffuse daylight, or low light) conditions and also in presence of various localized and full shading or non-uniform irradiance conditions affecting portions or all of the RDP-SPG module.

BRIEF DESCRIPTION OF THE DRAWINGS

The following description and associated figures teach illustrative embodiments of the disclosure. For the purpose of teaching inventive principles, some conventional aspects of the illustrative examples can be simplified or omitted. The claims should be considered as part of the disclosure. Note that some aspects of the best mode may not fall within the scope of the disclosure as specified by the claims. Thus, those skilled in the art will appreciate variations from the claimed embodiments that fall within the scope of the disclosure. Those skilled in the art will appreciate that the features described below can be combined in various ways to form multiple variations of the disclosure. As a result, the disclosure is not limited to the specific examples described below.

Please note that in the figures, relative geometrical dimensions are not necessarily shown to scale.

FIG. 3 shows a Smart Power Slat (SPS) unit with series-connected multi-modal MPPT chips (or alternatively, several SPS units with each SPS unit having one multi-modal MPPT chip and the outputs of the multi-modal MPPT chips connected in electrical series).

FIG. 4 shows a flowchart showing the operation for distributed SPS and RDP-SPG power optimization using multi-modal maximum-power-point-tracking (MPPT) integrated circuits.

FIGS. 10A-10F show examples of SPS in-laminate composite (including fiber-reinforced polymer or FRP) frame design.

FIG. 13 shows an example flowchart showing the manufacturing process flow for making the SPS building block units for RDP-SPG modules.

FIG. 21 shows a table showing various representative preferred SPS building block unit and RDP-SPG module designs.

DETAILED DESCRIPTION OF THE EXEMPLARY EMBODIMENTS

Figures 1A, 1B, 1C:
FIG. 1A shows a plurality of Smart Power Slat (SPS) units interconnected and stacked together when the RDP-SPG module is in a fully retracted state for ease of portability and transportation.
FIGS. 1B and 1C show RDP-SPG module is in at least partially expanded or deployed state for electric power generation, with FIG. 1B showing an open-structure configuration (with through-slat open gaps between adjacent SPS units when expanded), and FIG. 1B showing a closed-structure configuration (without through-slat open gaps between adjacent SPS units).

Embodiments of the present disclosure will now be described in detail with reference to the drawings, which are provided as illustrative examples of the disclosure so as to enable those skilled in the art to practice the disclosure. Notably, the figures and examples below are not meant to limit the scope of the present disclosure to a single embodiment, but other embodiments are possible by way of interchange of some or all of the described or illustrated elements.

Moreover, where certain elements of the present disclosure can be partially or fully implemented using known components, only those portions of such known components that are necessary for an understanding of the present disclosure will be described, and detailed descriptions of other portions of such known components will be omitted so as not to obscure the disclosure. In the present specification, an embodiment showing a singular component should not be considered limiting; rather, the disclosure is intended to encompass other embodiments including a plurality of the same component or nested stages, and vice-versa, unless explicitly stated otherwise herein. Moreover, applicants do not intend for any term in the specification or claims to be ascribed an uncommon or special meaning unless explicitly set forth as such. Further, the present disclosure encompasses present and future known equivalents to the known components referred to herein by way of illustration.

Physical dimensions, directionality, shapes, voltages, currents, power generation amounts, number of sub-components used in a bigger component are not limiting to the scope of the disclosure. They are used in the illustrative examples to facilitate the reader grasp the inventive concept and visualize the physical structure of the power generator. Modular Bifacial Smart Power Slat Building Blocks for High-Density PV Power Generation The primary unit building block of the RDP-SPG module of this disclosure is the Smart Power Slat (SPS) or the SPS building block unit, that is a relatively lightweight, relatively thin, bifacial solar photovoltaic (PV) electric power generating laminate, capable of efficiently converting light (sunlight or daylight photons) received on both its opposite surfaces, including direct sunlight, direct or reflected light from the ambience and diffused daylight, to electrical power.

Preferably, an SPS building block is: (i) relatively thin with a thickness of less than about 3 mm and preferably in the range of about 0.5 mm up to 2.5 mm, (ii) substantially planar, (iii) rigid or semi-rigid with sufficient structural strength to retain its planar shape and to protect the partitioned solar cells within the laminate, (iv) elongated-shaped (e.g., such as rectangular-shaped) with aspect ratio (i.e., average length to width ratio) in the approximate range of about 2 up to 20 (and more preferably between about 2 and 12; aspect ratios smaller than 2 or larger than 12 are also possible), and (v) very lightweight with electric power density (defined as peak PV power amount generated by each SPS unit divided by weight of each SPS unit) in the range of about 50 $W_p$ per kg to more than 200 $W_p$ per kg.

An SPS laminate building block unit is a bifacially light-receiving laminate having one or a plurality of bifacial solar cells (preferably such as at least two ~156 mm×~156 mm or nearly 6"×6" bifacial solar cells, each partitioned into at least two sub-cells), and with each bifacial solar cell partitioned into a plurality of (at least two) smaller sub-cells to obtain optimum electrical and mechanical properties.

An SPS laminate building block unit may comprise multiple (N) bifacial solar cells, with each cell mechanically (such as using laser cutting or mechanical scribing or dicing) partitioned into a plurality of (M) electrically-connected sub-cells (e.g., ~157 mm×157 mm crystalline silicon bifacial solar cells), hence, the SPS unit having a quantity of N×M sub-cells. Depending on the design, N is preferably an integer (or an integer plus a simple fraction) between 2 and 20, and M is an integer, preferably between 2 and 16 (i.e., each cell partitioned into 2 to 16 sub-cells). More preferably M=3 to 12. The sub-cells preferably have equal surface areas.

An SPS laminate building block unit SPS preferably has a slat active area (i.e., solar cell area) width between ~half-cell-wide and 2-cells-wide, with the cell-wide measure referring to the full side dimension of a pre-partitioned crystalline silicon solar cell (although smaller or larger SPS laminate widths may be used). The most preferred active area width is a 1-cell-wide SPS. For instance, a one-cell wide slat has an active area width of about 157 mm (if the solar cells used for the slat have pre-partitioned areas of 157 mm×157 mm).

The SPS building block unit power is in the range of ~10 $W_p$ (e.g., for N=2) and ~100 $W_p$ (e.g., for N=20). The peak power generation per SPS unit depends on the peak power per solar cell and the number of pre-partitioned solar cells used in the SPS slat laminate. For various products, a single RDP-SPG module may provide peak power in the range of ~20 $W_p$ to ~3 $kW_p$ per module.

A single RDP-SPG module of this disclosure uses 2 to 45 (or even more) SPS laminate building block units. The number SPS of building block units in the RDP-SPG module is defined as 'U.'

The solar cells used in the SPS building block laminate are relatively low-cost mass-produced high-efficiency (preferably having >21% conversion efficiency under the Standard Test Condition or STC) bifacial solar cells. The bifaciality factor of the bifacial solar cells should preferably be over 60% and more preferably over 90% for enhanced electricity generation.

Examples of solar cells for making the SPS building blocks include (but are not limited to): bifacial monocrystalline or multi-crystalline solar cells such as bifacial PERC (Passivated-Emitter Rear Contact) type solar cells and bifacial mono-crystalline Silicon Hetero Junction (SHJ; also known as HIT) solar cells. Other choices of solar cells for the SPS building block unit include high-efficiency tandem solar cells comprising a combination of the above monocrystalline silicon solar cells with efficiency-enhancing widebandgap semiconductor cell stacks such as those made of perovskites.

The SPS laminate unit with the laminated-embedded solar cells preferably provides effective SPS building block conversion efficiency of ≥19% (under STC) along with enhanced bifacial electricity generation.

Each full solar cell has a pre-partitioning size of at least ~15.6 cm×15.6 cm (area≥240 cm²). SPS unit may be nearly half-cell-wide (~8 to 12 cm) up to 2-cells-wide (~32 to 36 cm), though smaller fractional widths (e.g., ⅓-cell-wide or ~6 to 10 cm) may be used for smaller SPS units.

FIG. 1A shows a plurality of SPS units 101 stacked together when the RDP-SPG module is in a fully retracted and compacted state. FIGS. 1B and 1C show RDP-SPG module is in expanded state for power generation. FIG. 1A shows expanded Open-Structure Design (bifacial SPS units are preferably parallel to one another and the adjacent SPS units have through-slat gaps between them) and FIG. 1B shows expanded Closed-Structure Design (the adjacent bifacial SPS units are non-parallel to each other and do not have through-slat openings between them). In the open-structure design, angle θ may be fixed or adjustable. In the closed design, angle θ is adjustable (from 0° to 90°). 110 and 112 are virtual (imaginary) planes on opposite sides of the slats for the open structure (passing through the longer sides of the SPS units). 115 is the folding or pivoting axes for the closed structure.

During the SPS building block manufacturing process, each full-size (e.g., with dimensions of at least ~15.6 cm×15.6 cm, or full cell area≥240 cm²) bifacial crystalline silicon solar cell is partitioned into a plurality of (M is an integer, preferably between 2 and 16) smaller equal-area sub-cells, such that the completed SPS building block unit has a plurality of N×M sub-cells in the laminate.

Partitioning (by laser cutting or mechanical dicing/scribing) of the full-size solar cells into smaller area sub-cells serves multiple objectives, including: (1) to scale down the SPS building block unit electrical current for reducing the electrical ohmic losses and improving the overall power generation efficiency, (2) to improve mechanical crack resistance of the laminated sub-cells and enhance the overall mechanical resilience of the SPS laminate, and (3) to enable the use of SPS-laminate-attached multi-modal MPPT power optimization chips.

Since the high-efficiency (>21% efficiency) monocrystalline silicon solar cells produce current (STC short-circuit current $I_{sc}$ and maximum-power current $I_{mp}$) on the order of ~9.6 A (or approximately 10 A), partitioning of each solar cell into M sub-cells and electrical interconnections of the sub-cells are done such that the SPS building block current is lower than the full cell current by at least a factor of 2. The preferred SPS current scaling factor (compared to a non-partitioned full-cell current) is from 2 to 6, resulting in maximum SPS building block current in the order of ~4.8 A (for factor of 2 current down-scaling, assuming full-cell maximum current of about 9.6 A) down to ~1.6 A (for factor of 6 current down-scaling).

For sufficient mechanical resilience of the SPS building block unit and crack resistance of the laminated solar cells, each full-size solar cell may be partitioned into at least 4 sub-cells (for further enhanced mechanical resilience of SPS laminate (for enhanced mechanical resilience, optimal partitioning is 4 to 12 sub-cells per cell).

During manufacturing of the SPS building blocks, each full-size bifacial solar cell is partitioned (for instance, using laser cutting, laser scribe and cell break, mechanical scribe and cell break, or mechanical dicing of cells) into a pre-specified number of (M) sub-cells. M is an integer between 2 and 16 resulting equal-area sub-cells per full bifacial solar cell (e.g., crystalline silicon), and preferably between 3 and 12 resulting bifacial sub-cells per full bifacial solar cell.

M is an integer and preferably may be expressed as multiple of 2 integers between 1 and 8, such as:
M=K×L where K and L are between 1 and 8; for instance, M=2×3=6 or M=3×3=9 or M=2×2=4, etc. The most preferred designs use M=3×1=3 or M=4×1=4 or M=2×

2=4 or M=3×2=6 or M=3×3=9 or M=4×2=8 or M=6×2=12 or M=6×1=6 or M=4×3.

The sub-cells are formed according to a design pattern corresponding to M=K×L, and preferably have equal areas (for instance, partitioning of a full area bifacial solar cell with an area of 240 cm$^2$ into M=6 sub-cells results in an area of ~40 cm$^2$ for all the resulting sub-cells. The number of partitioning cuts depends on M=K×L. Partitioning of each full solar cell into M=2×2=4 or M=3×3 sub-cells requires 2 or 4 cell partitioning cuts (preferably cuts along straight lines), respectively. For M=K×L, the total number (P) of partitioning cuts is P=(K+L−2).

The cell partitioning cuts are either electrical cuts or mechanical cuts. Each electrical cut contributes to current reduction factor, and improves mechanical resilience & crack suppression. Each mechanical cut improves mechanical resilience & crack suppression, but has no impact on current scaling.

When the PV current flows in the same direction in all sub-cells resulting from a full-size cell, the partitioning cuts parallel to or perpendicular to the current flow direction are mechanical cuts and electrical cuts, respectively. When the PV current flow alternates in the opposite (180°) directions between adjacent rows of sub-cells (with rows being parallel to the current direction), all the partitioning cuts parallel to and perpendicular to the current flow direction are electrical cuts (i.e., contribute to both electrical current reduction factor and mechanical resilience).

Figure 2A:
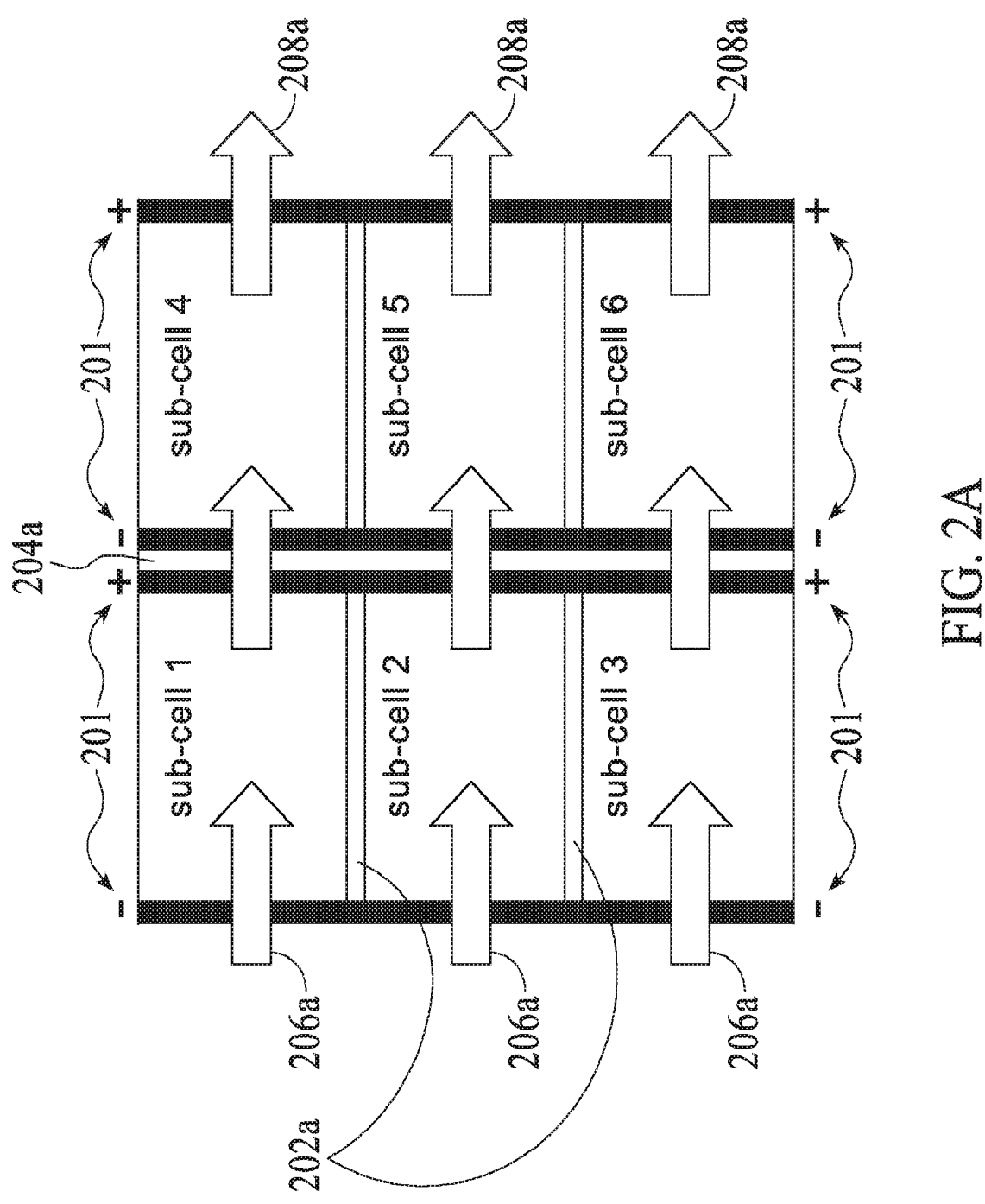
FIG. 2A-2E show several representative solar cell partitioning designs showing bifacial high-efficiency solar cells partitioned into a plurality of sub-cells capable of scaling current (scaling down the electrical current by a positive integer factor).

FIG. 2A shows a representative design showing M=2×3=6 sub-cells and current reduction factor of 2. Adjacent opposite-polarity busbars (or positive and negative polarity leads of each sub-cell; the sub-cells may or may not have busbars but for descriptions of the electrical connections among the sub-cells in an SPS unit, the representative examples described here show sub-cells with busbars) 201 of adjacent sub-cells are electrically connected together in series (i.e., positive leads of sub-cells 1-3 connected to negative leads of sub-cells 4-6). In this design, 3 sub-cells in each column are electrically connected in parallel and 2 columns are electrically connected in series for 2× current reduction.

An SPS building block laminate has N sets of these partitioned sub-cells, electrically connected to one another in either electrical series or in hybrid electrical parallel and series (N is an integer or an integer+a fraction).

Among the three partitioning cuts, the two mechanical cuts are shown as 202a and the only electrical cut is shown as 204a. Current flow in alternate rows of sub-cells is in the same direction (arrows 206a and 208a).

Figure 2B:
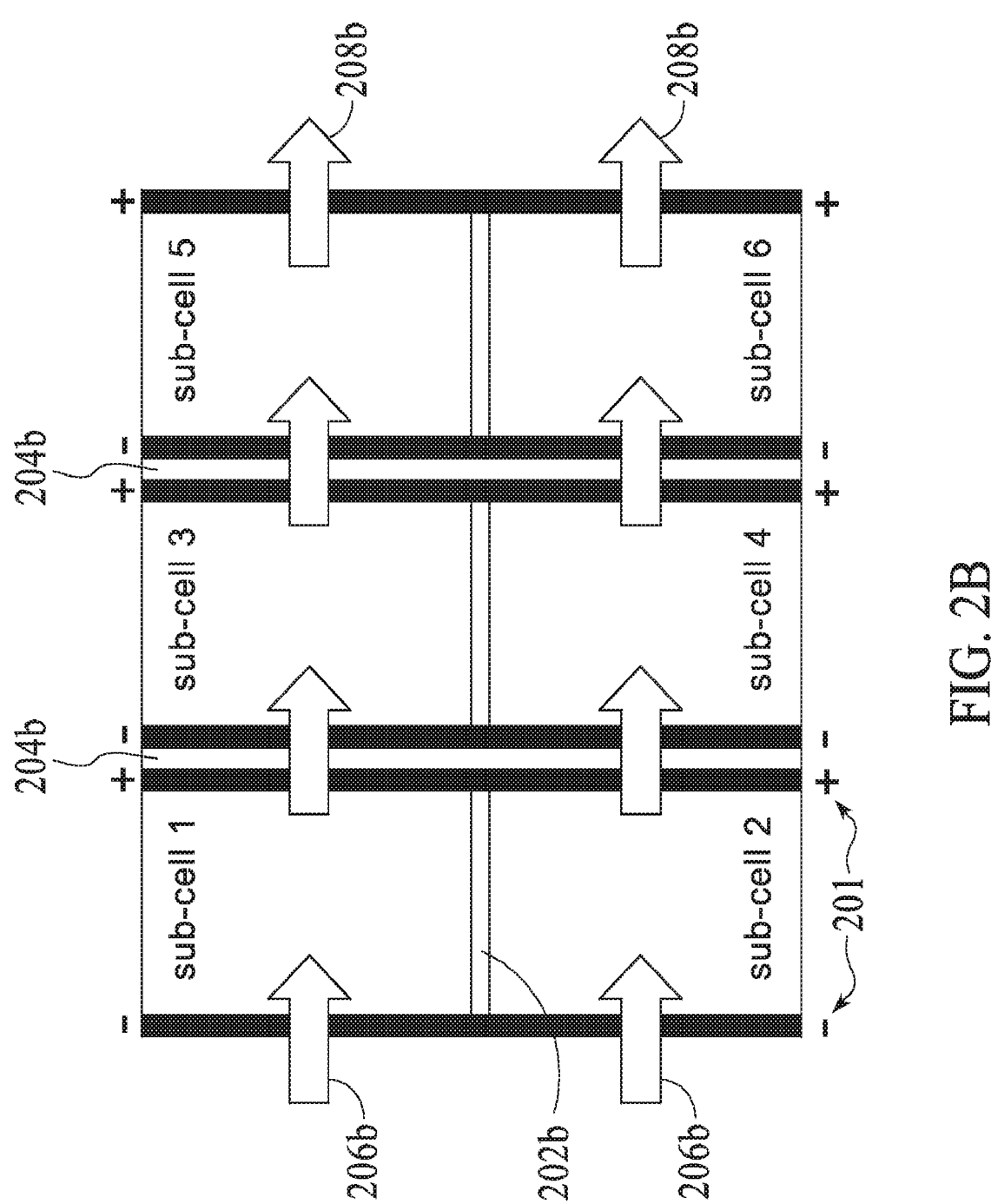

FIG. 2B shows another representative design showing M=3×2=6 sub-cells and current reduction factor of 3. Adjacent opposite-polarity busbars (or electrical leads) of adjacent sub-cells are electrically connected together in series (i.e., positive leads of sub-cells 1-2 connected to negative leads of sub-cells 3-4, positive leads of sub-cells 3-4 connected to negative leads of sub-cells 5-6). In this design, 2 sub-cells in each column are connected in electrical parallel, and 3 columns are connected in electrical series for 3× current reduction. Among the three partitioning cuts, the only mechanical cut is shown as 202b and the two electrical cuts are shown as 204b. Current flow in alternate rows of sub-cells is in the same direction (arrows 206b and 208b).

Figure 2C:
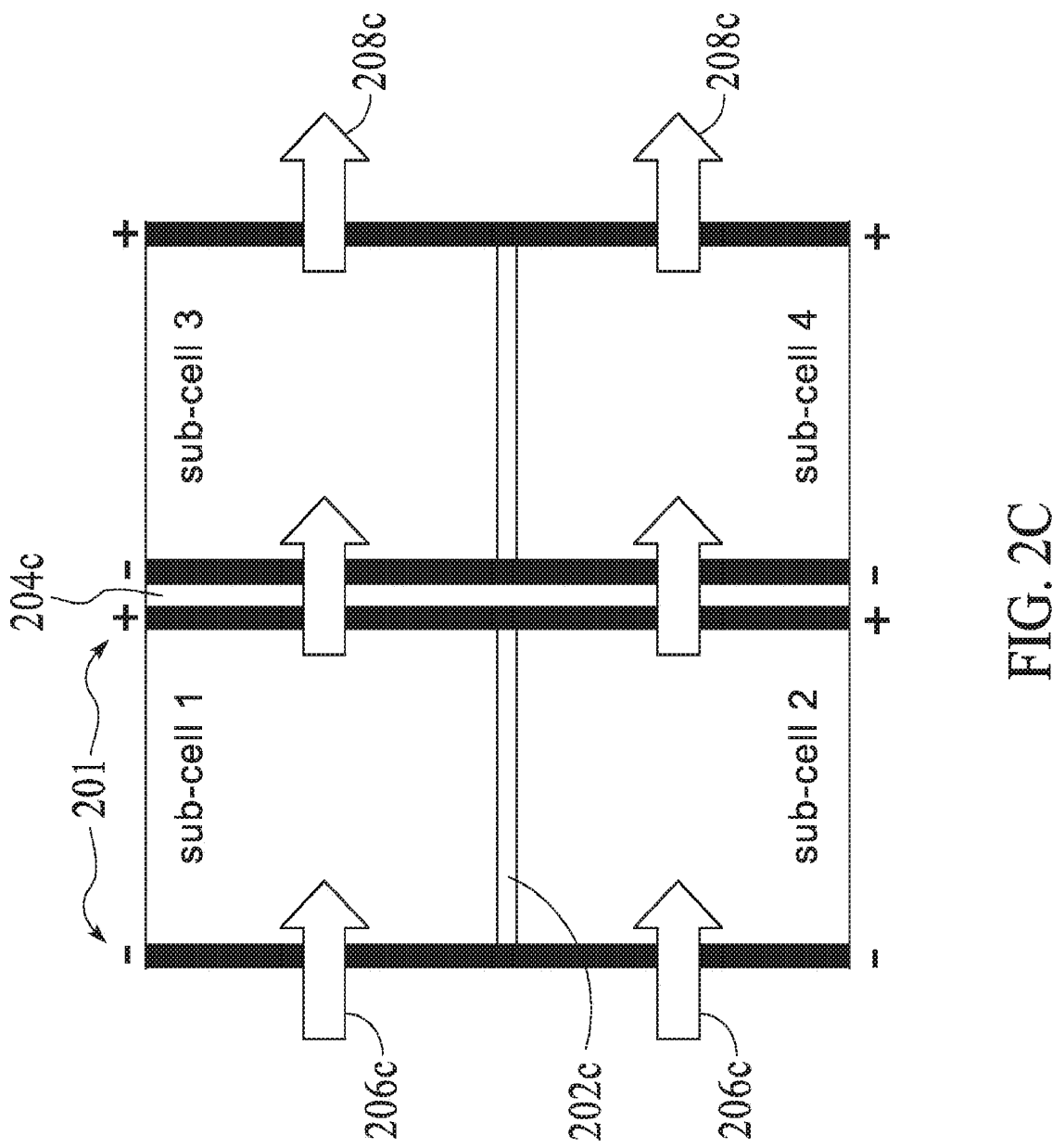

FIG. 2C shows a third representative design showing M=2×2=4 sub-cells and current reduction factor of 2. Adjacent opposite-polarity busbars (or electrical leads) of adjacent sub-cells are electrically connected together in series (i.e., positive leads of sub-cells 1-2 connected to negative leads of sub-cells 3-4). Here, 2 sub-cells in each column are connected in electrical parallel and 2 columns are connected in electrical series for 2× current reduction. Among the two partitioning cuts, the only mechanical cut is shown as 202c and the only electrical cut is shown as 204b. Current flow in alternate rows of sub-cells is in the same direction (arrows 206c and 208c).

Figure 2D:
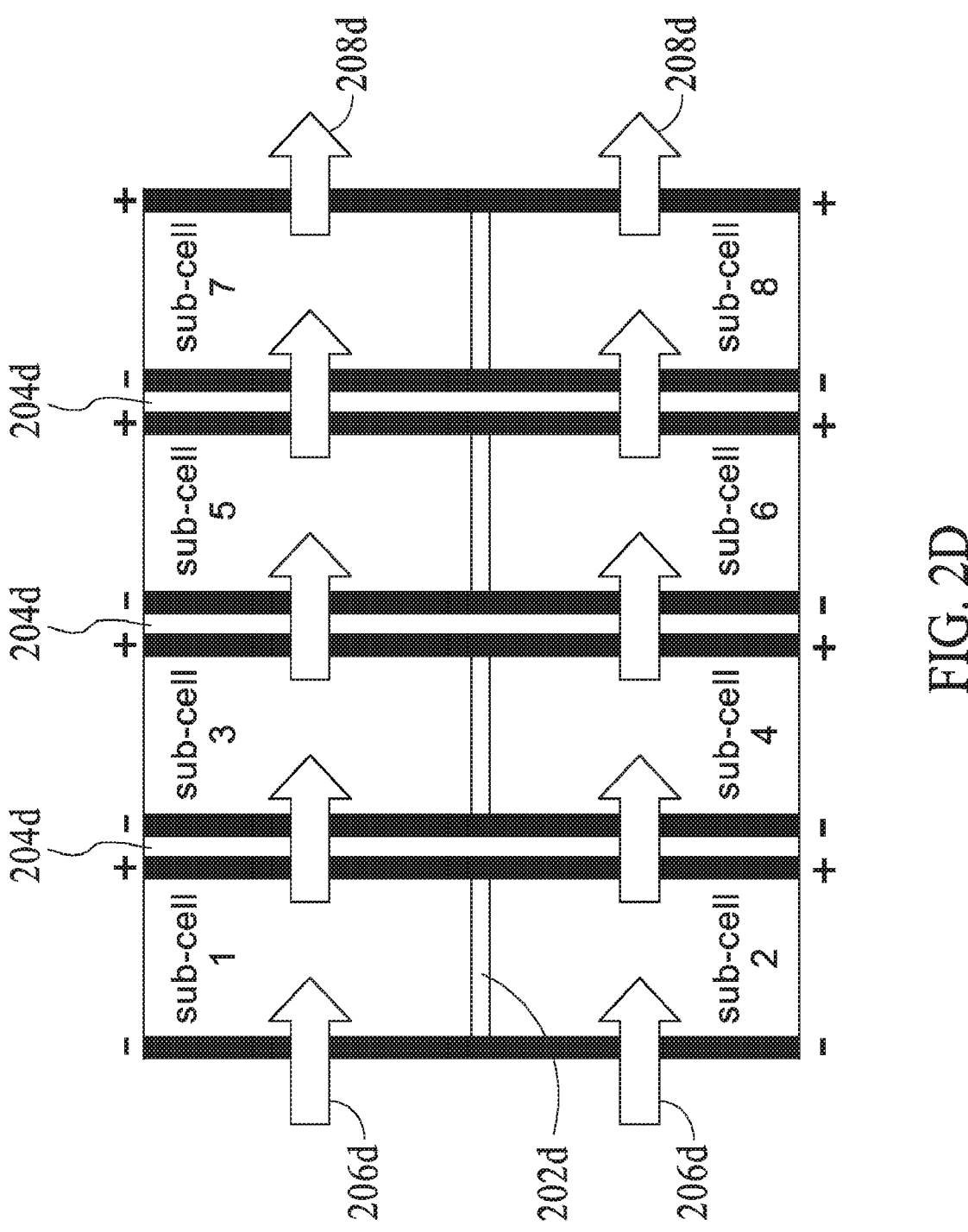

FIG. 2D shows a third representative design showing M=4×2=8 sub-cells and current reduction factor of 4. Adjacent opposite-polarity busbars (or electrical leads) of adjacent sub-cells are electrically connected together in series (i.e., positive leads of sub-cells 1-2 connected to negative leads of sub-cells 3-4, positive leads of sub-cells 3-4 connected to negative leads of sub-cells 5-6, positive leads of sub-cells 5-6 connected to negative leads of sub-cells 7-8). Here, 2 sub-cells in each column are connected in electrical parallel, and 4 columns connected in electrical series for 4× current reduction. Among the four partitioning cuts, the only mechanical cut is shown as 202d and the three electrical cuts are shown as 204d. Current flow in alternate rows of sub-cells is in the same direction (arrows 206d and 208d).

Figure 2E:
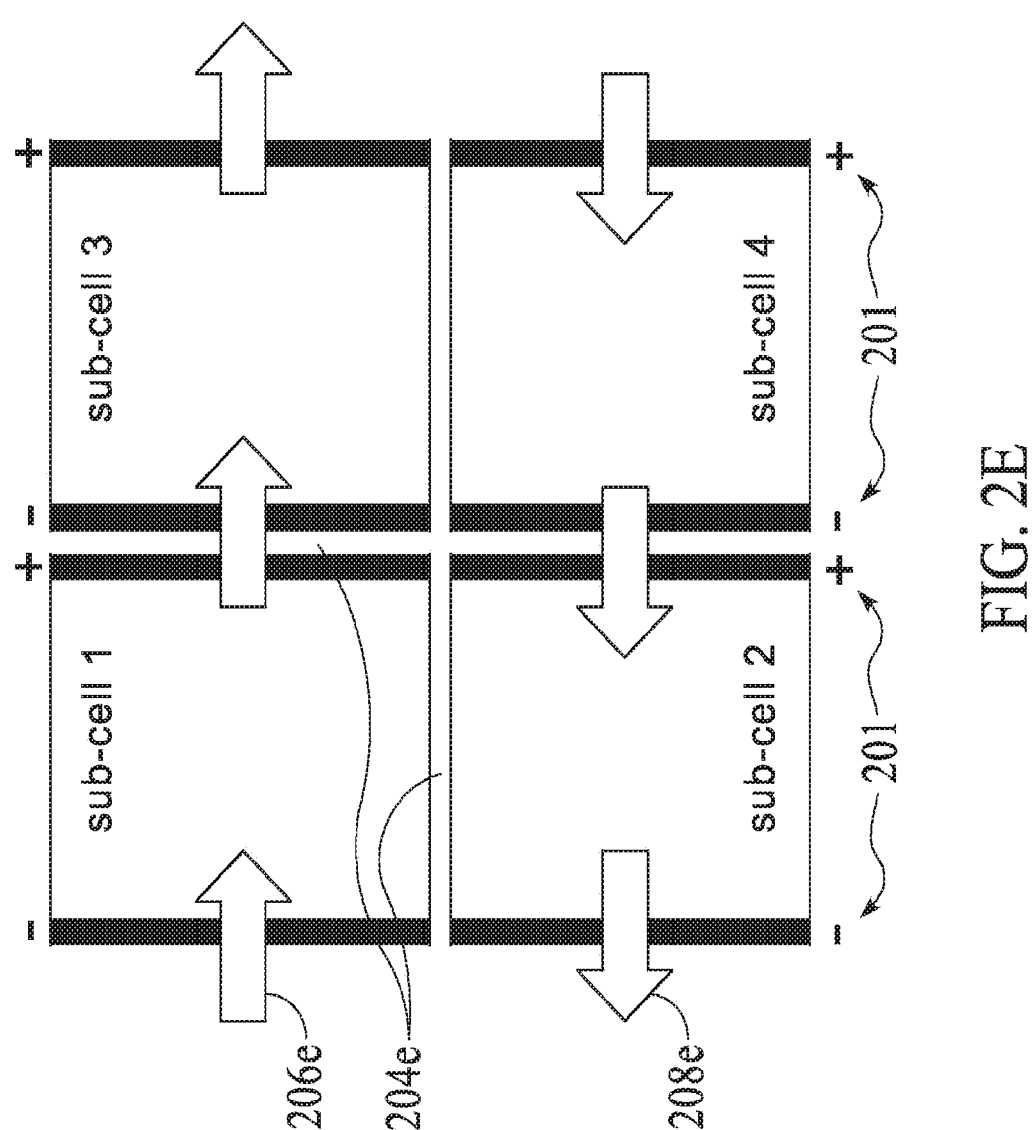

FIG. 2E shows a fourth representative design showing M=2×2=4 sub-cells and current reduction factor of 4. Adjacent opposite-polarity busbars (or electrical leads) of adjacent sub-cells are electrically connected together in series (i.e., positive lead of sub-cell 1 connected to negative lead of sub-cells 3, positive lead of sub-cell 4 connected to negative lead of sub-cells 2). Here, 2 sub-cells in each column are not connected in parallel, and all four sub-cells are connected in electrical series for 4× current reduction. Among the two partitioning cuts, there are no mechanical cuts, and there are two electrical cut shown as 204e. Current flow in alternate rows of sub-cells is in the opposite direction (arrows 206e and 208e are in opposite directions).

Super-Cell Structure and Electrical Connections in an SPS Building Block

A super-cell structure is made of a plurality of sub-cells (which much preferably have equal areas) which are formed from partitioning of full-size solar cells, such as crystalline silicon solar cells. Each super-cell structure has several (S=an integer or an integer+a fraction, 2≤S≤6) full cells, with each full cell partitioned into M=K×L sub-cells; a super-cell has S×M=S×K×L sub-cells. The plurality of equal-area sub-cells in a super-cell are electrically connected to one another either in an all-series or in a hybrid parallel-series pattern, based on the desired super-cell values for its maximum power ($P_{SC\text{-}max}$), its current scale-down factor $F_{SC\text{-}I}$ (relative to a single full-size cell), and its voltage scale-up factor $F_{SC\text{-}V}$ (relative to a single full-size solar cell). The $P_{SC\text{-}max}$, $F_{SC\text{-}I}$, and $F_{SC\text{-}V}$ values are set by the S, K, and L values, and the electrical cuts. The preferred ranges for the super-cell current and voltage scaling factors (current scale-down and voltage scale-up factors) are: $2 \leq F_{SC\text{-}I} \leq 6$ and $10 \leq F_{SC\text{-}V} \leq 16$ (e.g., $F_{SC\text{-}I}=3$, $F_{SC\text{-}V}=12$).

Assuming each non-partitioned full-size solar cell has ~5 $W_p$ maximum power and 2≤S≤6, the super-cell maximum power is in the range of 10 $W_p \leq P_{SC\text{-}max} \leq 30$ $W_p$ (most preferably 10 to 25 $W_p$). Each super-cell has at least one pair of electrical power leads (positive and negative leads).

In the Agile Smart Power™ products embodying the teaching of this disclosure, the electrical leads of each super-cell are preferably connected to the input leads of a multi-modal maximum-power-point-tracking (MPPT) integrated circuit chip to enhance electrical power and energy generation by the RDP-SPG modules. Each bifacial SPS building block has at least one super-cell connected to one MPPT chip. Each RDP-SPG module has a plurality (U) of bifacial SPS building block units.

There are several optimum super-cell designs (i.e., number of full cells & partitioning pattern) for achieving a good combination of distributed power harvesting optimization granularity and cost associated with the number of multi-modal MPPT chips used in the RDP-SPG modules.

The preferred super-cell voltage scaling factor (i.e., number of sub-cells or groups of sub-cells connected in series) is 12 to 14 (may be as small as 10 and as large as 16) and the preferred super-cell current reduction scaling factor is at least 2 (preferably 3 or larger). The combination of 12× voltage scale-up and 3× current scale-down factors provide one optimum super-cell design for the combination of optimal MPPT chip operation, higher power conditioning capacity per MPPT chip, and excellent distributed power harvesting granularity.

Several representative optimum or near-optimum super-cell design examples are shown below:

S=4, M=3×2=6; 2 electrical cuts, 1 mechanical cut, pairs of columnar sub-cells connected in parallel, 12 pairs of sub-cells connected in series, 12× voltage scale-up, 3× current scale-down, ~20 $W_p$ S=3, M=4×2=8; 3 electrical cuts, 1 mechanical cut, pairs of columnar sub-cells connected in parallel, 12 pairs of sub-cells connected in series, 12× voltage scale-up, 4× current scale-down, ~15 $W_p$ S=3, M=2×2=4; 2 electrical cuts, 0 mechanical cut, two adjacent sub-cell rows connected in series, 12 sub-cells in 2 rows connected in series, 12× voltage scale-up, 4× current scale-down, ~15 $W_p$ S=5, M=3×2=6; 2 electrical cuts, 1 mechanical cut, pairs of columnar sub-cells connected in parallel, 15 pairs of sub-cells connected in series, 15× voltage scale-up, 3× current scale-down, ~25 $W_p$ S=6, M=2×2=4; 1 electrical cuts, 1 mechanical cut, pairs of columnar sub-cells connected in parallel, 12 pairs of sub-cells connected in series, 12× voltage scale-up, 2× current scale-down, ~30 $W_p$ S=4⅔, M=3×2=6; 2 electrical cuts, 1 mechanical cut, pairs of columnar sub-cells connected in parallel, 14 pairs of sub-cells connected in series, 14× voltage scale-up, 3× current scale-down, 23.3 $W_p$ S=4⅓, M=3×2=6; 2 electrical cuts, 1 mechanical cut, pairs of columnar sub-cells connected in parallel, 13 pairs of sub-cells connected in series, 13× voltage scale-up, 3× current scale-down, 21.7 $W_p$ S=2, M=3×2=6; 3 electrical cuts, 0 mechanical cut, two adjacent sub-cell rows connected in series, 12 sub-cells in 2 rows connected in series, 12× voltage scale-up, 6× current scale-down, ~10 $W_p$ Laminate-Attached (Super-Cell-Connected) Multi-Modal MPPT Chips for SPS Building Blocks Each SPS unit preferably has at least one multi-modal MPPT chip either within or connected to the SPS laminate and associated with a super-cell having a specified plurality of partitioned bifacial sub-cells. Each super-cell has several partitioned and electrically-connected (all-series or hybrid parallel-series) sub-cells, and output positive and negative leads for connection to the input leads of the multi-modal MPPT chip. Preferably, each super-cell may have from S=2 to S=6 solar cells (e.g., 2≤S≤6, with ~240 cm² area solar cells, ≥5 $W_p$ power), corresponding to S multiplied by M (or S×M) sub-cells in the super-cell block. For 2≤ S≤6 and full-cell power of ~5 $W_p$, the super-cell peak power is ~10 $W_p$ to 30 $W_p$ for each MPPT chip. More preferably 2≤S≤5

(super-cell power of ~10 $W_p$ to 25 $W_p$) for optimum performance & cost. For 2≤S≤6 and 2≤M≤16, S and M are preferably chosen for S×M to be ≥10, to allow for sufficient cell voltage scaling factor of at least 10 if and when all sub-cells in the super-cell are connected in series.

The preferred super-cell output voltage range for optimum multi-modal MPPT chip operation is in the range of about 4.5 V to 12 V (and more preferably ~5 V to ~10 V), and the preferred super-cell voltage scaling factor is 10 to 16 (with the optimum super-cell voltage scaling factor being 12, 13, or 14).

The preferred super-cell output current reduction factor for the multi-modal MPPT chip is 2 to 6 (at least 3 is an optimum factor), since the maximum super-cell current for the reduction factor of 3× and 6× is about ~3.2 A and ~1.6 A, respectively, well within the preferred operating range of the multi-modal MPPT chip Each super-cell is attached to one MPPT chip (power leads of super-cell connected to the input power leads of the multi-modal MPPT chip), each SPS unit is made of Z super-cells (Z is an integer equal to or greater than 1), and each SPS uses Z MPPT chips, embedded in or attached to the SPS unit structure.

The output leads of each super-cell are attached to the input leads of one multi-modal MPPT chip and the output leads of multiple MPPT chips within each SPS building block and/or a plurality of SPS building blocks in an RDP-SPG module are connected together in electrical series or series-parallel.

Assuming the RDP-SPG module uses a U number of SPS building blocks (U is an integer, preferably in the range of 2 to 45), the RDP-SPG module uses a total of U×Z super-cells and U×Z MPPT chips.

Series-Connected Multi-Modal Maximum Power-Point Tracking (MPPT) Chips

Figure 3:
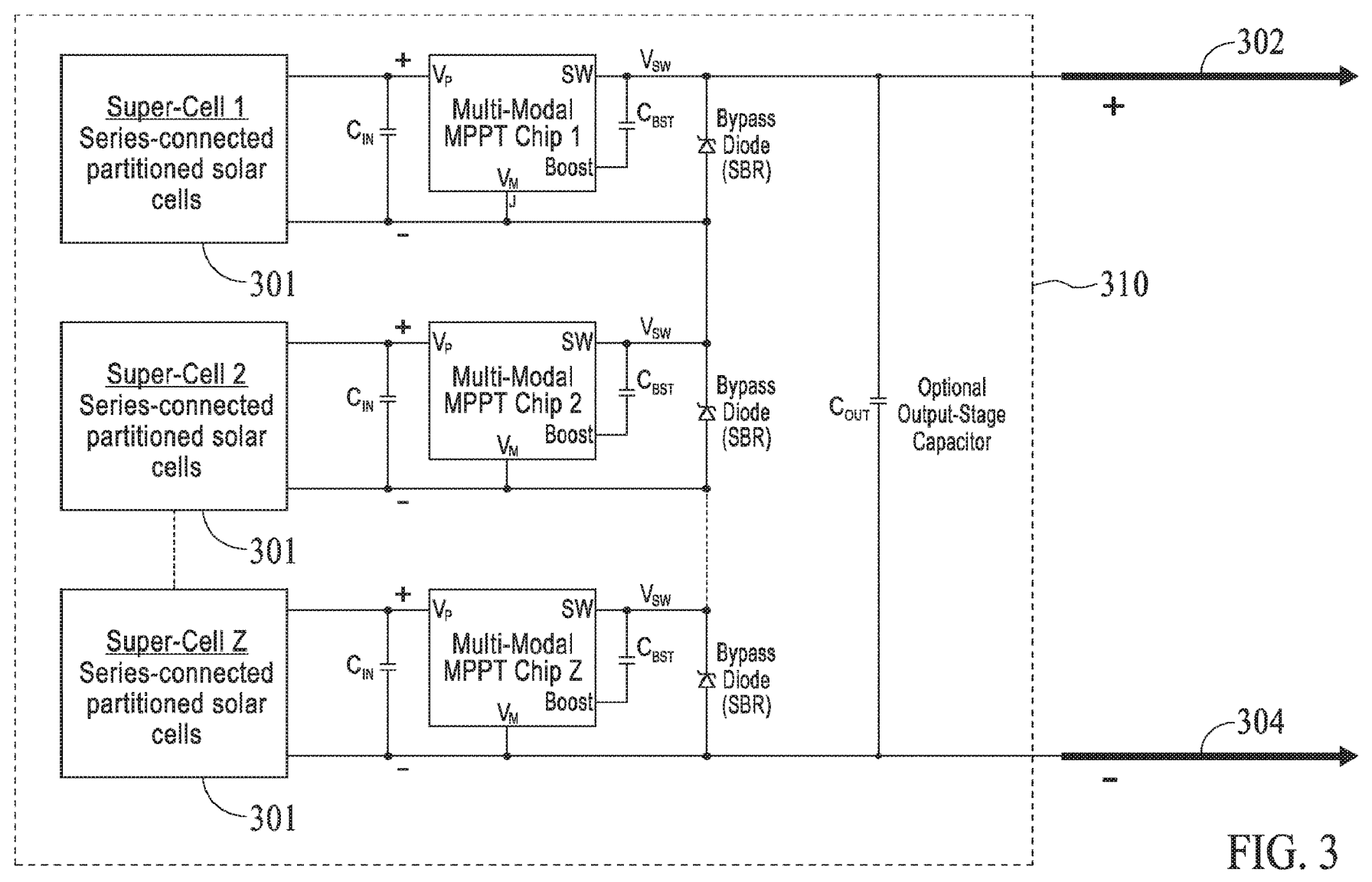

A bifacial Smart Power Slat (SPS) building block unit uses at least 1 multi-modal MPPT chip (preferably at least one SPS-laminate-attached MPPT chip). The example in FIG. 3 shows multiple MPPT chips in the SPS building block unit 310 within the dashed enclosure, with positive and negative electrical terminals 302 and 304. Each MPPT chip connected to a plurality (e.g., 10 to 16) of partitioned solar sub-cells. The example here is shown with multiple series-connected multi-modal MPPT chips (one MPPT chip for each super-cell).

There are N×M partitioned sub-cells in the SPS building block laminate. N bifacial solar cells are shown as 301, with each solar cell partitioned into M equal-area sub-cells (M=K×L). There are (N×M)/Z partitioned sub-cells in each super-cell, with a plurality of sub-cells connected in series.

The multi-modal MPPT chip provides a high (at least 90% and preferably >98%) effective power optimization efficiency. The SPS multi-modal MPPT chips work in cooperation with the RDP-SPG module level or PV system level MPPT power optimizer, such as module or system level power converters or inverters with MPPT.

The multi-modal MPPT chip for distributed maximum-power harvesting in the SPS building block units provides the following essential multiple modes of operation (hence, multi-modal MPPT design):

Pass-through mode of operation: whenever there is no localized weakening or disturbance of power generation by the solar cells attached to the MPPT chip with respect to most of the other solar cells in the RDP-SPG module, corresponding to when the cells connected to the MPPT chip operate at or near their maximum-power-point (MPP).

Optimizing mode of operation: which is a DC-to-DC switching mode of operation, whenever there is some degree of localized weakening or disturbance of power generation by the sub-cells attached to the MPPT chip with respect to most the other solar cells in the RDP-SPG module, corresponding to when the sub-cells connected to the MPPT chip operate beyond a threshold allowance away from their maximum-power-point (MPP) condition.

Sleep mode: corresponds to when the sub-cells attached to the MPPT chip are not producing electric power and the MPPT chip is not powered up, e.g., when the RPG-SPG module is retracted into a non-deployed small volume or when there is no sunlight or daylight.

The multi-modal MPPT chip for distributed maximum-power harvesting in the SPS building block units may also preferably provide the following additional optional modes of operation:

Active bypass mode of operation: occurs when the sub-cells attached to the MPPT chip produce negligible power with respect to most of the other sub-cells in the RDP-SPG module but are capable of powering up the MPPT chip.

Schottky Barrier Rectifier (SBR) bypass mode of operation: occurs when the sub-cells attached to the MPPT chip produce no power and the MPPT chip is not powered up, while most of the other sub-cells in the RDP-SPG module are producing power (or alternatively, when there is an electrical connection failure within an SPS building block, preventing power generation by the defective SPS unit).

FIG. 4 shows a flowchart showing the operation or algorithm for distributed SPS and RDP-SPG power optimization. One or more series switch M1 and one or more parallel switch M2 are used to control the mode of operation within the multi-modal MPPT chip.

When the RDP-SPG module is in the retracted or contracted state and in its compact volume (or not deployed for power generation in its expanded operating mode), the laminated-embedded bifacial solar sub-cells are not receiving any power generating light. e multi-modal MPPT chips in the SPS building blocks are not powered up by the dark sub-cells since the strings of electrically connected sub-cells attached to the MPPT chips are not producing any voltage and power. The multi-modal MPPT chips are fully powered down and, therefore, are in the Sleep Mode (shut down mode).

When the RDP-SPG module is in the expanded or deployed state (i.e., deployed for power generation in its partially or fully expanded operating mode in its intended application), the laminate-attached MPPT chips in the SPS building block units are powered up by the super-cells as long as the strings of electrically interconnected sub-cells attached to the MPPT chips are receiving sunlight or daylight to produce sufficient string voltage and power at the MPPT chips inputs. The MPPT chips are powered up and operate in one of the multi-modal functional states, as follows:

1. All multi-modal MPPT chips operate in the pass-through mode whenever the strings of sub-cells in the SPS building blocks are producing relatively electrically matched, comparable, and normal electrical power amount within the RDP-SPG module.

2. One of more multi-modal MPPT chips operate in the optimizing mode (switching optimization mode), for the multi-modal MPPT chip(s) associated with one or more super-cells receiving less light and producing less power than most of the other super-cells in the SPS building blocks of the RDP-SPG module, while the remaining multi-modal MPPT chips associated with the normally operating super-cells (a majority of the multi-modal MPPT chips) operate in the pass-through mode.

3. One of more multi-moda MPPT chips operate in the active or passive bypass mode for the multi-modal MPPT chip(s) associated with one or more super-cells receiving little to no light and producing little power (for active bypass mode) to no power (for passive bypass mode) compared to the other super-cells in the SPS building blocks of the RDP-SPG module, while the other multi-modal MPPT chips (a majority of the MPPT chips) operate in the pass-through mode.

Sometimes a hybrid of 2 & 3 above is adopted, where some multi-modal MPPT chips are in bypass mode, some in optimizing mode, most in pass-through mode.

Figure 5A:
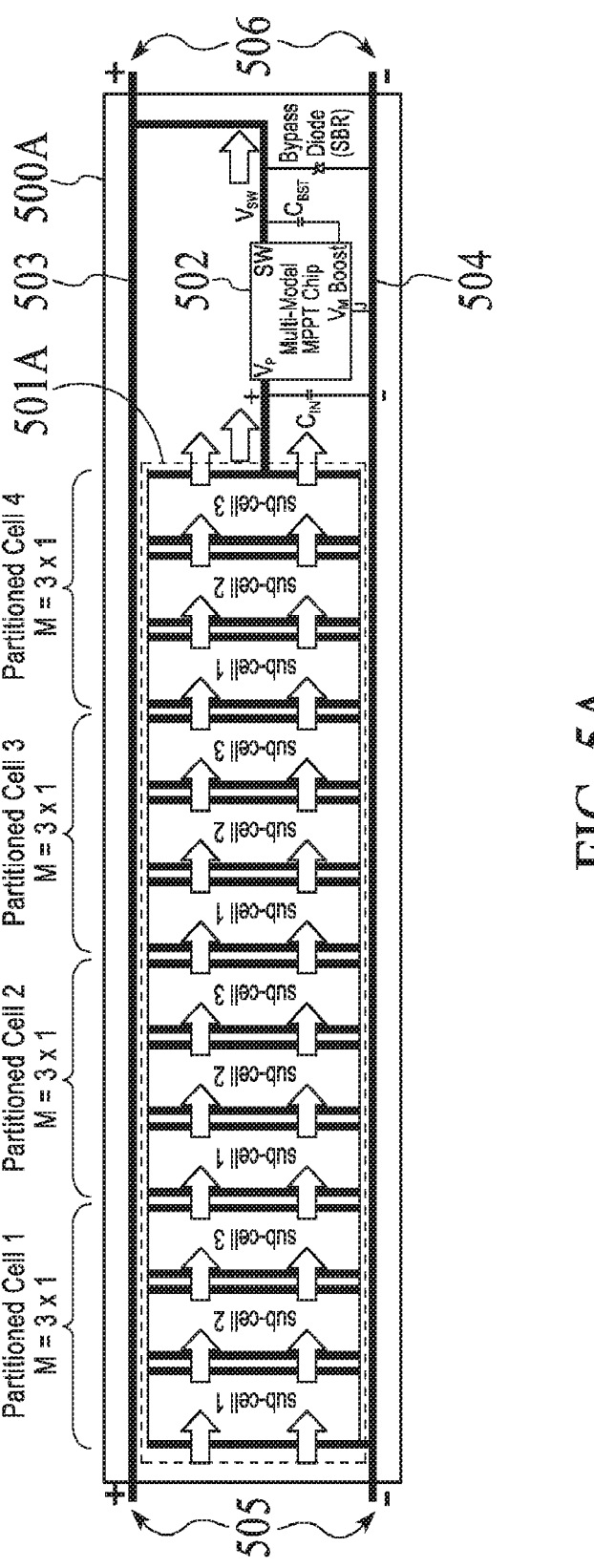
FIGS. 5A-5E show examples of SPS units with one super-cell comprising a plurality of electrically connected partitioned sub-cells and one multi-modal MPPT chip per SPS unit.

FIG. 5A shows a design example for Smart Power Slat (SPS) Building Block 500A with 1 Super-Cell 501A and 1 MPPT Chip 502. SPS is a bifacial, thin, elongated, planar, rigid or semi-rigid, lightweight laminate having at least one super-cell (number of super-cells in the SPS laminate is an integer $Z{\le}1$), and a plurality of N bifacial solar cells (wherein $N{=}Z{\times}S$, and $2{\le}N{\le}20$ depending on the SPS design needs), with each bifacial solar cell partitioned into M equal-area sub-cells (M=an integer between 2 and 16, preferably between 3 and 12).

The SPS unit may have its output positive & negative electrical rails 503 and 504 connected to the output leads 505 and 506 on both ends, though output leads can be on one end of SPS laminate only.

The example in FIG. 5A shows a rectangular SPS unit (maximum power of ~20 $W_p$), having Z=1 super-cell, 1 MPPT chip: N=S=4, M=3×1. This design shows the positive & negative leads on both ends of the SPS laminate, same current flow direction in adjacent sub-cell rows. Larger and higher power SPS units may be made using Z>2, for instance 2 supercells with 2 multi-modal MPPT chips connected in electrical series.

In the example shown in FIG. 5A, there are 4×3=12 sub-cells in this SPS design (1-cell wide by 4 cells long, corresponding to 1 sub-cell wide by 12 sub-cells long with M=3×1 design). There are 2 electrical cuts and no mechanical cuts per cell. The SPS has 12× voltage scale up and 3× current scale down. Single row of sub-cells connected in electrical series; using one multi-modal MPPT chip for 12 series-connected sub-cells. Relative dimensions are not shown to scale (for instance, the multi-modal MPPT chip & support components, and partitioning gaps are much smaller than shown above). Approximate dimensions of the SPS building block laminate with Z=1 super-cell represented in this design are: Width≈16 to 20 cm, Length≈65 to 70 cm.

Photo-generated PV electrical current flows in the direction of into the negative busbars (or negative power leads) and out of the positive busbars (or positive power leads), from negative towards positive leads.

Figure 5B:
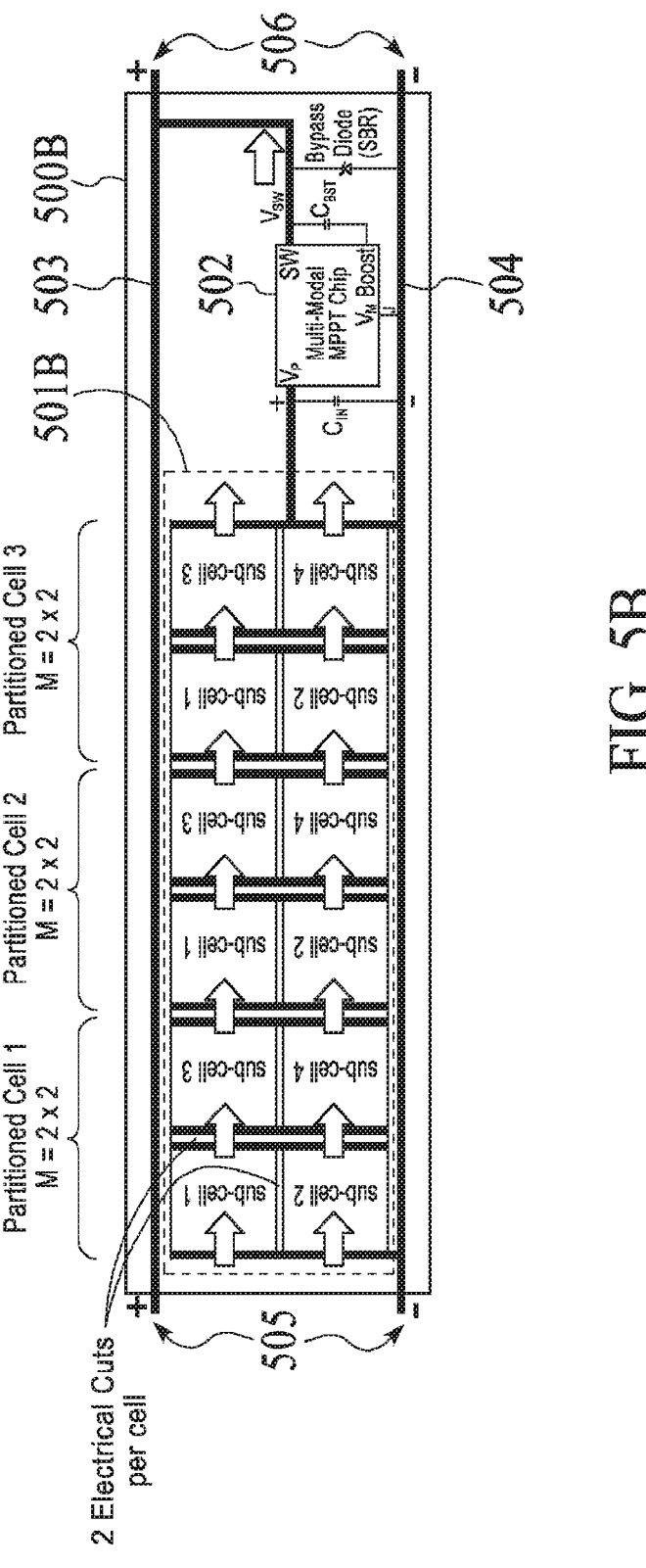

FIG. 5B shows an alternative SPS design example for Smart Power Slat (SPS) Building Block 500B with 1 Super-Cell 501B and 1 MPPT Chip 502. The rectangular SPS unit (~15 $W_p$) has Z=1 super-cell, 1 multi-modal MPPT chip: N=S=3, M=2×2. This design shows the positive & negative leads on both ends of the SPS laminate, opposite current flow direction in adjacent sub-cell rows.

There are 3×4=12 sub-cells in this SPS design (1-cell wide by 3 cells long, corresponding to 2 sub-cells wide by 6 sub-cells long with M=2×2 design). Two adjacent rows of sub-cells are connected in electrical series; current flows in opposite directions in 2 adjacent sub-cell rows.

This design uses one multi-modal MPPT chip for 12 series-connected sub-cells in 2 rows of sub-cells (current scaling down by 4× and voltage scaling up by 12×). There are 2 electrical cuts and no mechanical cuts per cell. Photo-generated PV electrical current flows in the direction of into the negative busbars (or negative power leads) and out of the positive busbars (or positive power leads, from negative towards positive leads. Approximate dimensions of the SPS building block laminate with Z=1 super-cell represented in this design are: Width=16 to 20 cm, Length≈49 to 54 cm.

Figure 5C:
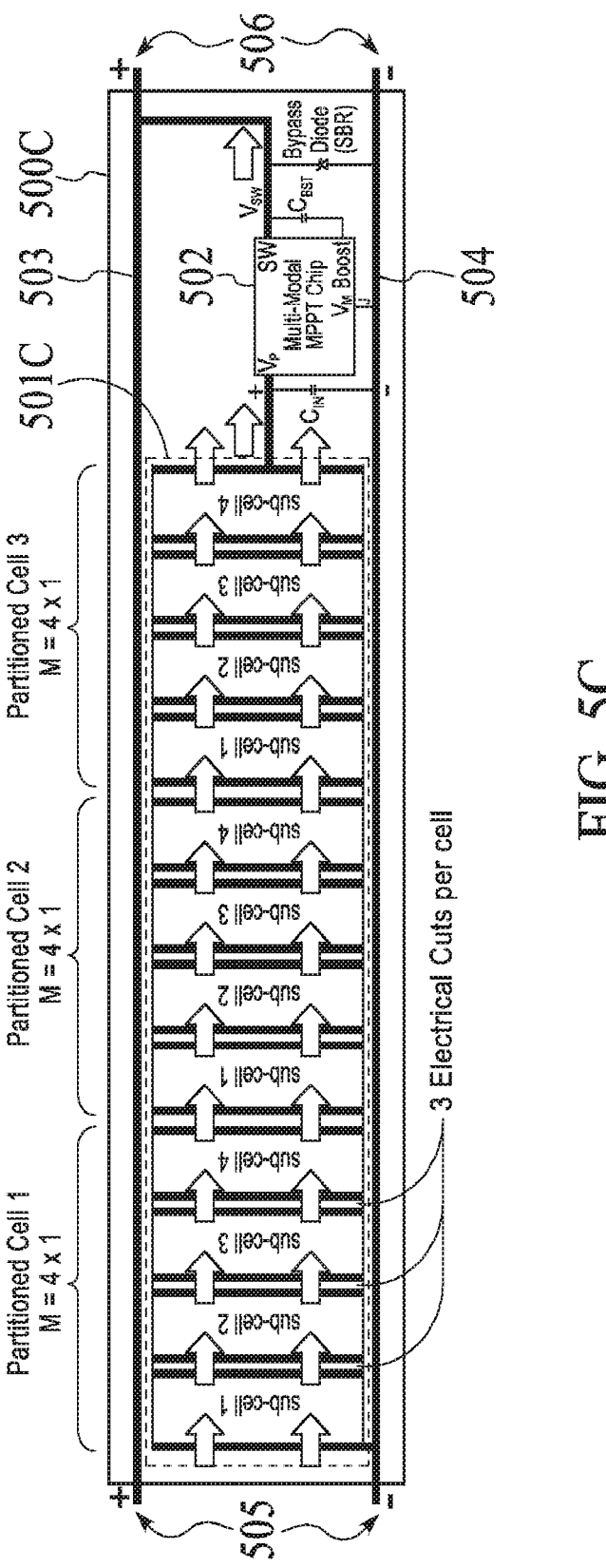

FIG. 5C shows another alternative design example for Smart Power Slat (SPS) Building Block 500C with 1 Super-Cell 501C and 1 multi-modal MPPT Chip 502. A rectangular SPS unit (~15 $W_p$), having Z=1 super-cell, 1 multi-modal MPPT chip: N=S=3, M=4×1.

There are 3×4=12 sub-cells in this SPS design (active PV generation area of 1-cell wide by 3 cells long, corresponding to 1 sub-cell wide by 12 sub-cells long with M=4×1 design). Single row of sub-cells are connected in electrical series; using one multi-modal MPPT chip for 12 series-connected sub-cells, current scaling down by 4× and voltage scaling up by 12×. Photo-generated PV electrical current flows in the direction of into the negative busbars (or negative power leads) and out of the positive busbars (or positive power leads), from negative towards positive leads. Approximate dimensions of the SPS building block laminate with Z=1 super-cell represented in this design are: Width≈16 to 20 cm, Length≈49 to 54 cm. There are three electrical cuts and no mechanical cut per cell.

Figure 5D:
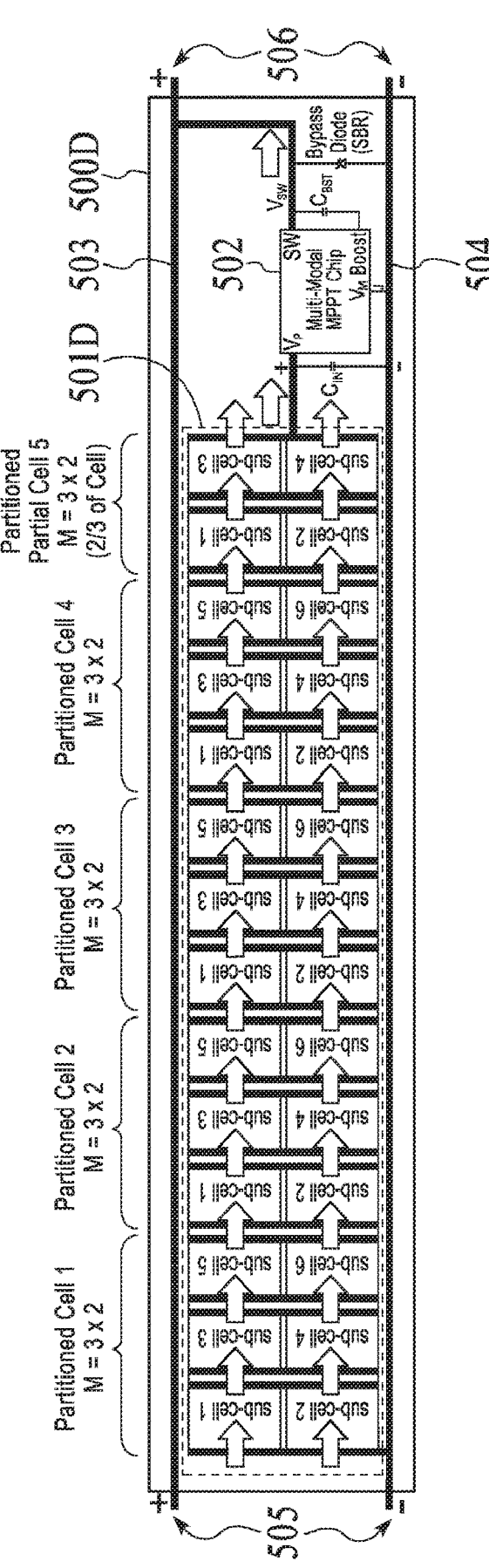

FIG. 5D shows yet another alternative design example for Smart Power Slat (SPS) Building Block 500D with 1 Super-Cell 501D and 1 multi-modal MPPT Chip 502. The SPS laminate may have its positive and negative electrical leads on one or both ends. A rectangular SPS (~23.3 $W_p$), having Z=1 super-cell, 1 MPPT chip: N=S=4⅔, M=3×2. Same current flow direction in adjacent sub-cell rows.

There are (4⅔=14/3)×6=28 sub-cells in this SPS design (1-cell wide by 4⅔ cells long, corresponding to 2 sub-cells wide by 14 sub-cells long with M=3×2 design).

Columns of 2 sub-cells are connected in electrical parallel, rows of sub-cells are connected in electrical series; using one multi-modal MPPT chip for 14 pairs of series-connected sub-cells. There are 2 electrical cuts and one mechanical cut per cell. Photo-generated PV electrical current flows in the direction of into the negative busbars (or negative power leads) and out of the positive busbars (or positive power leads), from negative towards positive leads. Approximate dimensions of the SPS building block laminate with Z=1 super-cell represented in this design are: Width≈16 to 20 cm, Length≈75 to 80 cm.

Figure 5E:
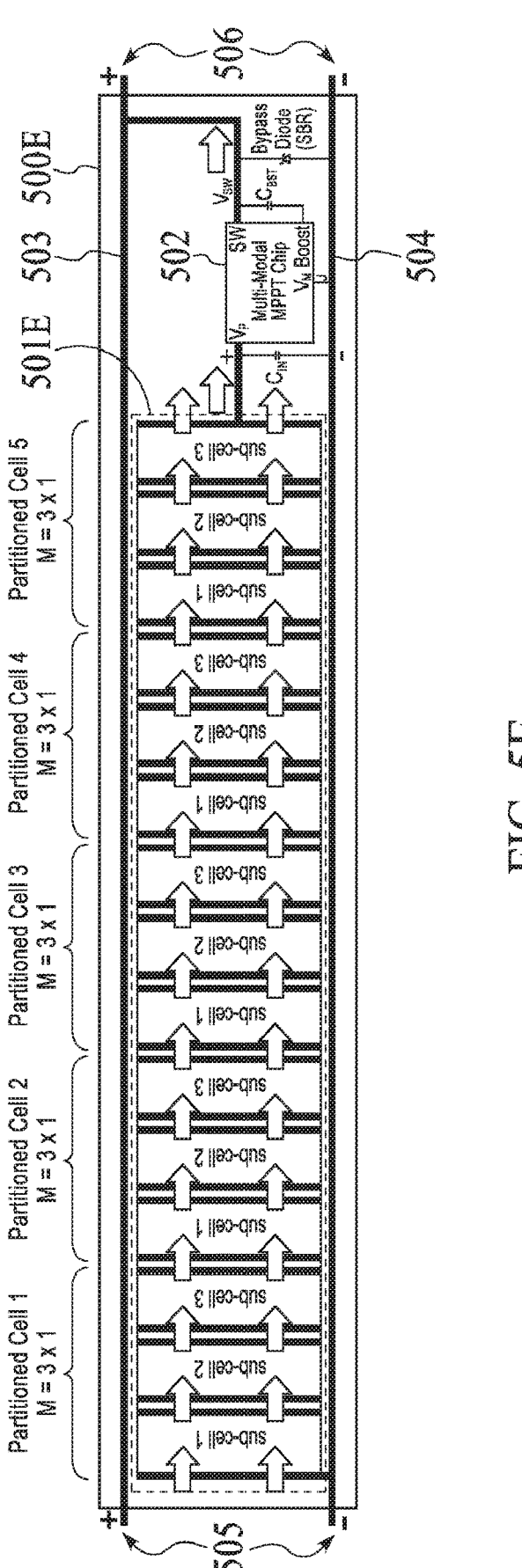

FIG. 5E shows yet another alternative design example for Smart Power Slat (SPS) Building Block 500E with 1 Super-Cell 501E and 1 multi-modal MPPT Chip 502. A rectangular SPS (~25 $W_p$), having Z=1 super-cell, 1 multi-modal MPPT chip: N=S=5, M=3×1. In this SPS design (1-cell wide by 5 cells long, corresponding to 1 sub-cell wide by 15 sub-cells long with M=3×1 design), single row of sub-cells are connected in electrical series; using one multi-modal MPPT chip for 15 series-connected sub-cells.

Photo-generated PV electrical current flows in the direction of into the negative busbars (negative power leads) and out of the positive busbars (positive power leads), from negative towards positive leads. Approximate dimensions of the SPS building block laminate with Z=1 super-cell represented in this design are: Width≈16 to 20 cm, Length≈81 to 86 cm. Per cell has 2 electrical cuts and no mechanical cut.

The representative design examples above indicate that numerous other SPS building block designs are possible based on the teachings of this disclosure.

Preferred RDP-SPG Module and SPS Building Block Unit Designs

Optimal partitioning of each full-size bifacial solar cell into a plurality of M=K×L sub-cells using a combination of electrical cuts (resulting in electrical current & voltage scaling and improved mechanical resilience and crack resistance of the resulting SPS) and mechanical cuts (resulting in further improved mechanical resilience and crack resistance of the resulting SPS laminate) provides multiple enabling benefits, such as:

Scaling up the super-cell voltage (by $F_{sc\_V}$) for the multi-modal MPPT chip input voltage to be in an optimal range (~5 to ~10 V);

Scaling down the super-cell current (by $F_{sc\_I}$) to reduce the power dissipation losses & enhance the RDP-SPG power;

Improving the overall mechanical resilience and sub-cell crack resistance in the SPS units and RDP-SPG modules;

Allowance for using low-cost multi-modal MPPT chip with each super-cell for distributed enhanced power generation and distributed power maximization;

As discussed above, an SPS unit has Z super-cells and Z multi-modal MPPT chips (Z=an integer, preferably 1≤Z≤5), and each super-cell has S bifacial solar cells (S=an integer or an integer plus a fraction, preferably 2≤S≤6, and more preferably 2≤S≤5), and each cell partitioned into M=K×L sub-cells via K+L−2 partitioning electrical and mechanical cuts (hence, each super-cell in an SPS unit having S×M=S×K×L sub-cells).

The numbers of sub-cells in each SPS unit and RDP-SPG module are Z×S×K×L and U×Z×S×K×L, respectively (and all the sub-cells preferably have equal areas, and have rectangular or square shapes)

As a representative example, a portable RDP-SPG module with ~60 $W_p$ rated peak power based on this disclosure may use 1-cell-wide SPS units, U=4, Z=1, S=3, M=2×2 (with 2 electrical cuts), resulting in RDP-SPG module (using 4 multi-modal MPPT chips) retracted dimensions of ~17 cm×~65 cm×~0.8 cm.

As another representative example, a transportable RDP-SPG module with ~600 $W_p$ rated peak power based on this disclosure may use 1-cell-wide SPS units, U=10, Z=3, S=4, M=3×2 (with 2 electrical cuts+1 mechanical cut), resulting in RDP-SPG module (using 30 multi-modal MPPT chips) retracted dimensions of ~18 cm×208 cm×~2.5 cm and a projected module weight of about ~6 kg to ~10 kg.

Bifacial SPS Building Block With Multi-Modal MPPT Chip Power Optimization

In expanded/deployed mode, the RDP-SPG modules having bifacial SPS building block units with laminate-embedded (or laminate-attached) multi-modal MPPT chips produce much more PV electric power and cumulative electric energy compared to either mono-facial building blocks (with or without multi-modal MPPT chip-assisted distributed power optimization) or bifacial building blocks without multi-modal MPPT chip-assisted distributed power optimization.

An SPS building block made using a combination of at least one super-cell having partitioned and electrically-connected bifacial sub-cells (partitioned from bifacial solar cells), and at least one multi-modal MPPT chip provides a high-performance power generating building block which is very resilient and efficient for various RDP-SPG power scales and operating conditions.

Compared to the conventional prior art PV modules, the bifacial SPS building block units of this disclosure are much more capable of generating maximum electrical power under variable and non-uniform light (e.g., sunlight, diffuse daylight, or low light) conditions and also in presence of various localized and full shading conditions affecting portions or all of the RDP-SPG module.

In an RDP-SPG module using a plurality of SPS units, the overall module PV power generation is further increased by the synergistic combination of the enhanced bifacial SPS light capture and conversion from its two opposite light-receiving faces, and distributed multi-modal MMPT power harvest.

Figures 6A, 6B:
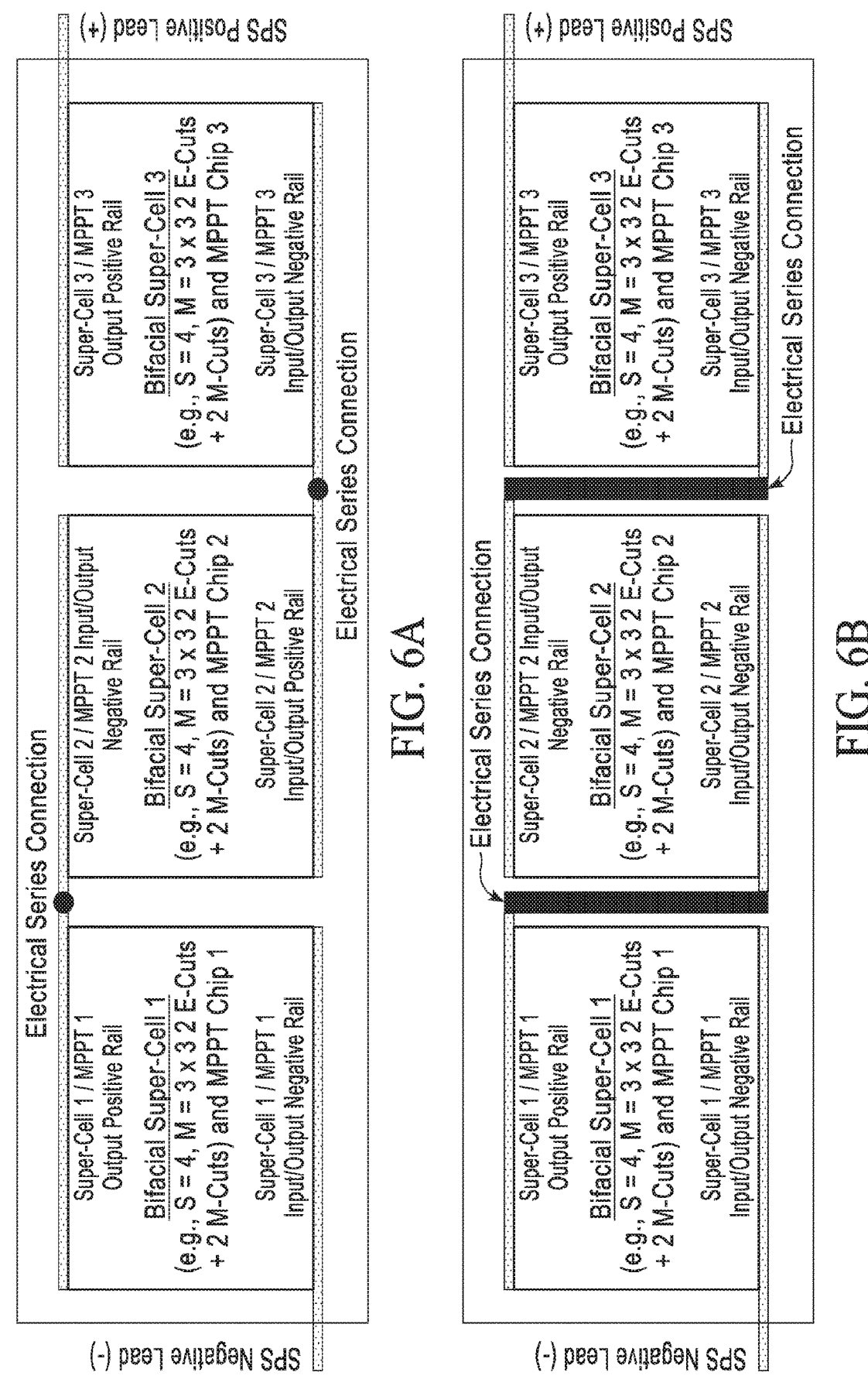
FIGS. 6A-6B show examples of SPS units with multiple super-cells and multiple multi-modal MPPT integrated circuits (so-called MPPT chips) connected in electrical series.

The multi-modal MPPT chips attached to the super-cells raise the SPS and RDP-SPG power generation via distributed optimization & mitigation of mismatch effects among various super-cells & SPS units Connecting SPS Super-Cells in Series for $Z \geq 2$ FIGS. 6A and 6B show three SPS super-cells (i.e. $Z=3$) connected in electrical series. Example 1 shown in FIG. 6A shows SPS building block using 3 super-cells and 3 multi-modal MPPT chips (dimensions not shown to scale; sub-cell details and multi-modal MPPT chip to super-cell connections not shown).

If there are more than 1 super-cells in an SPS unit, the plurality of super-cells are preferably connect together in electrical series (by connecting their associated multi-modal MPPT chip outputs in electrical series). Middle super-cell block (Super-Cell 2) rotated 180 degrees vs Super-Cell 1 and Super-Cell 3 to allow for straight series connections of three super-cell blocks.

For electrical series connections of super-cells, positive rail of super-cell 1 (MPPT1) is connected to negative rail of super-cell 2, and positive rail of super-cell 2 (MPPT2) connected to negative rail of super-cell 3.

Example 2, shown in FIG. 6B, shows another type of series connections of super-cells where positive rail of super-cell 1 (MPPT1) is connected to negative rail of super-cell 2, and positive rail of super-cell 2 (MPPT2) connected to negative rail of super-cell 3.

Mitigating Wind Resistance/Lift and Water Accumulation

Some of the applications of the RDP-SPG modules of this disclosure include outdoor deployment of the expanded modules on the ground or on various building rooftops. For the applications which require outdoor deployment of the RDP-SPG module for an extended period of time (for instance, power generation on a building rooftop), having a module design with negligible wind resistance/lift will reduce the deployment cost.

When deployed for power generation in their fully expanded states, the Open-Structure RDP-SPG modules of this disclosure experience negligible wind resistance/lift forces due to their relatively open structures with the plurality of SPS units spaced apart from one another (SPS-to-SPS spacing on the order of the width of the SPS units). The negligible wind-resistance/lift property of the RDP-SPG modules of this disclosure eliminates the need for ground or rooftop penetration, or for ballasting of the modules, enabling fast and labor-light drop-in-place deployment of the expanded RDP-SPG modules. The Open-Structure RDP-SPG modules of this disclosure (along with the vertical or angled orientation of the SPS units) also eliminates any rain water or snow accumulation.

Figure 7A:
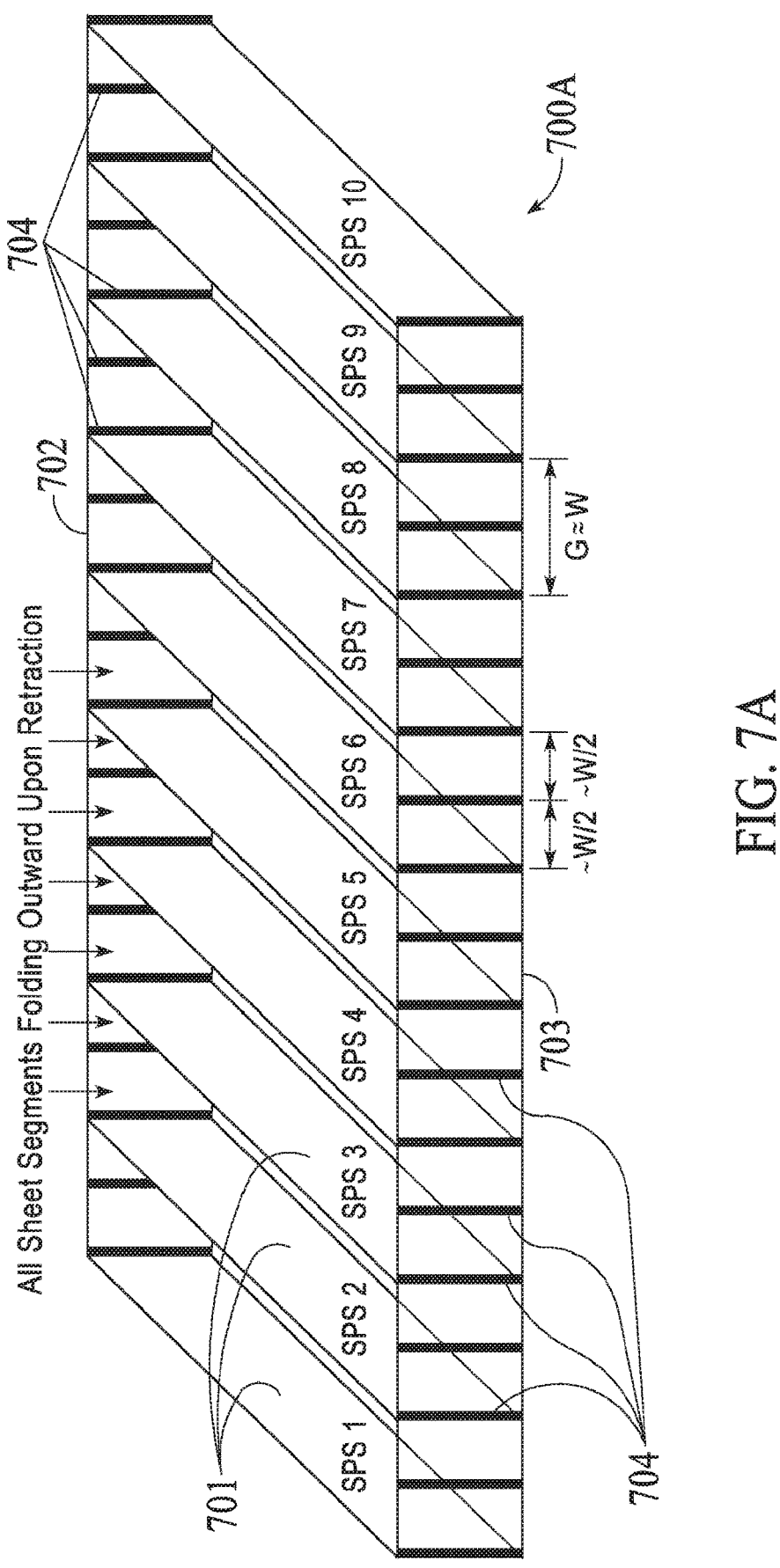
FIGS. 7A-7B show examples of expanded open-structure modules with two different SPS tilt angles to maximize bifacial light harvesting with negligible wind resistance and water accumulation.
Figure 7B:
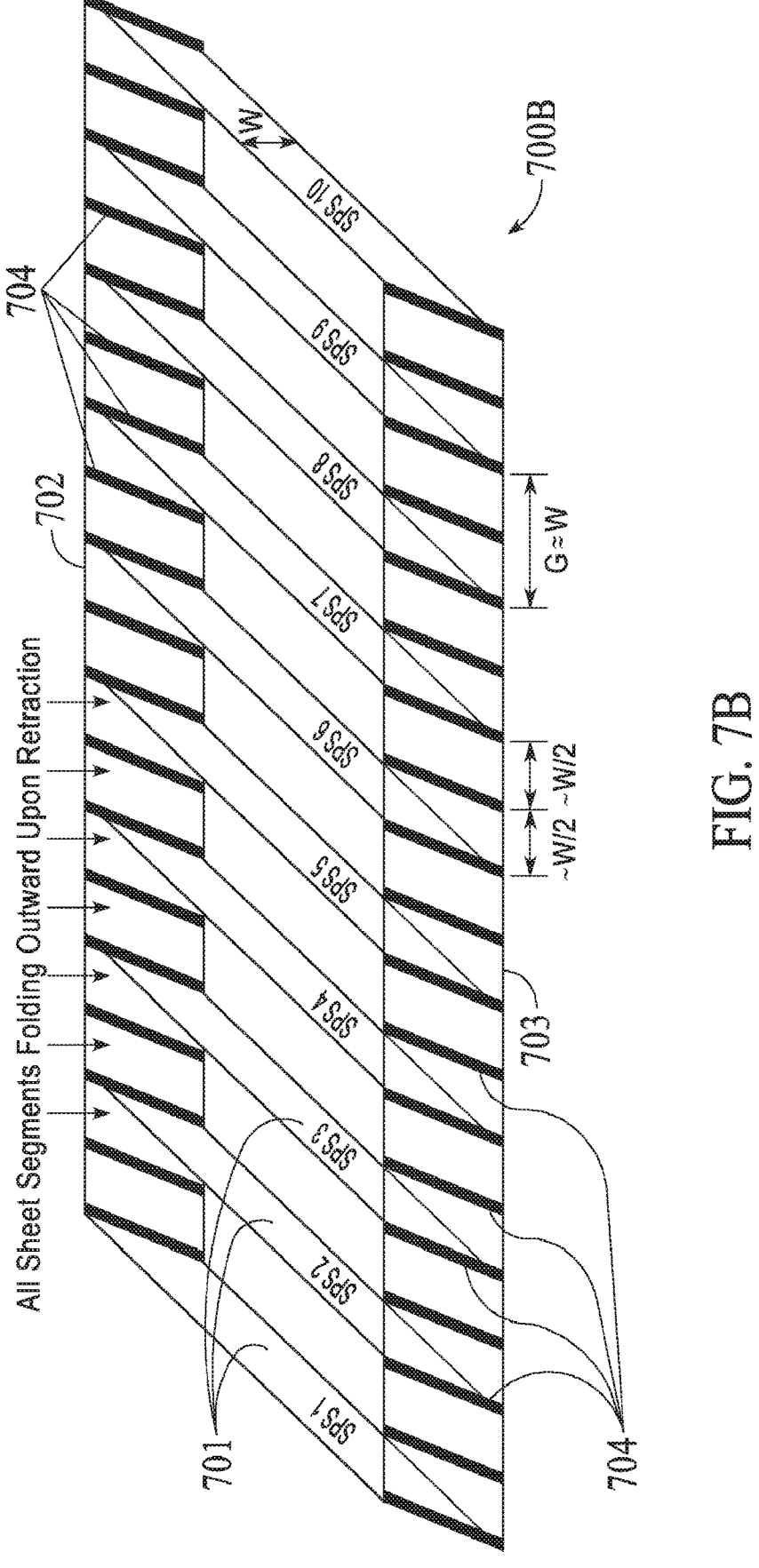

FIG. 7A shows an Open-Structure RDP-SPG Module example with U=10 SPS building block units (fully expanded mode), i.e. having vertical orientation with respect to the virtual planes of the RDP-SPG module 700A. Adjustable folding or pivoting sheet connectors 702 and 703 may be made of perforated sheet or framed sheet for negligible wind resistance & drag. In FIG. 7A, all the sheet segments between the folding and pivoting axes 704 fold outwards upon retraction. Also in FIG. 7A, W is width of each SPS unit 701, and G is the spacing between adjacent parallel SPS units. The spacing G between two SPS units is G, which may be equal to W. In FIG. 7B, SPS units are parallel to each other, but are not perpendicular to the virtual plane of the RDP-SPG module 700B (each open structure RDP-SPG virtual plane contains one group of the longer sides of the SPS building blocks).

Transparent Cover Sheets for the SPS Building Block Units

The preferred transparent cover sheet materials for the bifacial SPS building block units of this disclosure include thin (~0.025 mm to ~0.50 mm) fluoroplastic or fluoropolymer materials.

One suitable transparent fluoropolymer sheet material is the Ethylene Tetra-Fluoro-Ethylene (ETFE) sheet, such as Tefzel or Teflon ETFE sheet, with the following properties:

Continuous service temperature: −100 to 150° C. (−150 to 300° F.); good adhesion to EVA High resistance to impact & tearing; inert to outdoor exposure; excellent weathering resistance;

Self-cleaning material with substantially mitigated need for cleaning;

High optical transmittance from UV through IR (except for far IR); effective protection against moisture;

Typical sheet thicknesses from 25 μm to 125 μm; excellent anti-stick and low frictional properties;

V-0 flammability classification (flame retardant).

Another suitable transparent fluoropolymer sheet material is the Fluorinated Ethylene Propylene (FEP) sheet, such as Teflon FEP sheet, with the following properties:

Continuous service temperature: −240 to 205° C. (−400 to 400° F.); good adhesion to EVA;

Excellent protection against moisture (about 5 times better than ETFE);

Teflon FEP is about 2% more transmissive than ETFE and much more transmissive than glass;

Typical sheet thicknesses from 25 μm to 125 μm; excellent anti-stick and low frictional properties;

V-0 flammability classification (flame retardant).

The fluoropolymers ETFE and FEP films are excellent candidates for the bifacial SPS building block cover sheets because of their excellent optical transparency over a wide spectral range (for example, superior to low-iron float glass). Although thin (e.g., ~0.025 to 0.125 mm thickness) fluoroplastic materials (e.g., ETFE or FEP) are the preferred cover sheet material choices, thin (preferably ≤0.85 mm), high-transparency, low-iron glass is an alternative cover sheet material option for the SPS units of this disclosure.

One suitable thin glass material candidate is the LEO-FLEX™ glass from AGC, which is a chemically-tempered (or strengthened using potassium ion exchange) alumino-silicate glass which is supplied in the thickness range of ~0.55 mm to 1.3 mm (the lower end of the range is most suitable for the SPS units of this disclosure), capable of tolerating bending radius down to ~100 mm without glass breakage. The LEOFLEX™ glass provides optical transmission of 91.6% (for 0.85 mm thick glass), comparable to standard 3.2 mm thick low-iron glass (91.1%), but inferior to the transmissivity values of ETFE and FEP.

Other alternative thin-glass cover sheet options include the Alkaline earth boro-aluminosilicate glass products, known as Corning® Eagle XG®, Corning® Eagle XG® Slim, and Corning® Willow® Glass brand glass products from Corning; these glasses are as drawn to the desired final glass thickness which eliminates surface grinding & polishing processes that add cost and may introduce surface flaws. The thin Corning glass products are produced in the thickness range of 0.1 mm to 1.1 mm (with the lower end of the thickness range being most suitable for the SPS building block units of this disclosure). The coefficient of thermal expansion (CTE~3-3.5 ppm/° C.) of Corning glass is well matched to silicon. The Corning Alkaline earth boro-aluminosilicate glass provides good optical transmissivity of ~92% for the entire thickness range of 0.1 to 1.1 mm, comparable to LEOFLEX, but inferior to FEP and ETFE.

Suitable Encapsulant Materials for the Bifacial SPS Building Block Laminates

The bifacial SPS building block units use encapsulant sheets below the transparent covers (fluoroplastics such as ETFE or FEP) to encapsulate the sub-cells and frame on both light-receiving sides. The primary encapsulant materials suitable for the SPS building block units are Ethylene Vinyl Acetate copolymer (EVA), PolyOlefin Elastomer (POE), and Ionomer-Based Encapsulants (IBE). EVA (such as PHOTOCAP® 15580P from STR Solar) is the most commonly used solar encapsulant material with vacuum lamination temperature of ~145° C. to ~150° C. and good optical transmission properties in the spectral range of interest (~400 nm to 1200 nm). POE (such as ENGAGE POE from The DOW Chemical Co.) is a viable alternative to EVA, and provides superior long-term power generation due to lower degradation rate, higher electrical resistivity, better protection against moisture, and no acetic acid formation compared to EVA. IBE (such as PV5400 Series from DuPont) is another alternative to EVA, which is much stronger than EVA, and is 5 times stronger and up to 100 times stiffer than polyvinyl butyral or PVB encapsulants); these IBE materials provide good adhesion to the cover sheets, are highly transparent, need no curing, are non-yellowing, and provide excellent moisture ingress protection and module strength. Similar to POE, IBE does not produce any acetic acid.

While the bifacial SPS building blocks may use any of the above encapsulant sheets in their laminates, the IBE material provides the added benefit of additional mechanical stiffness and strength, making it a somewhat superior encapsulant material for making the SPS laminates.

Bifacial SPS Building Block Unit Laminate Structure

Figures 8A, 8B:
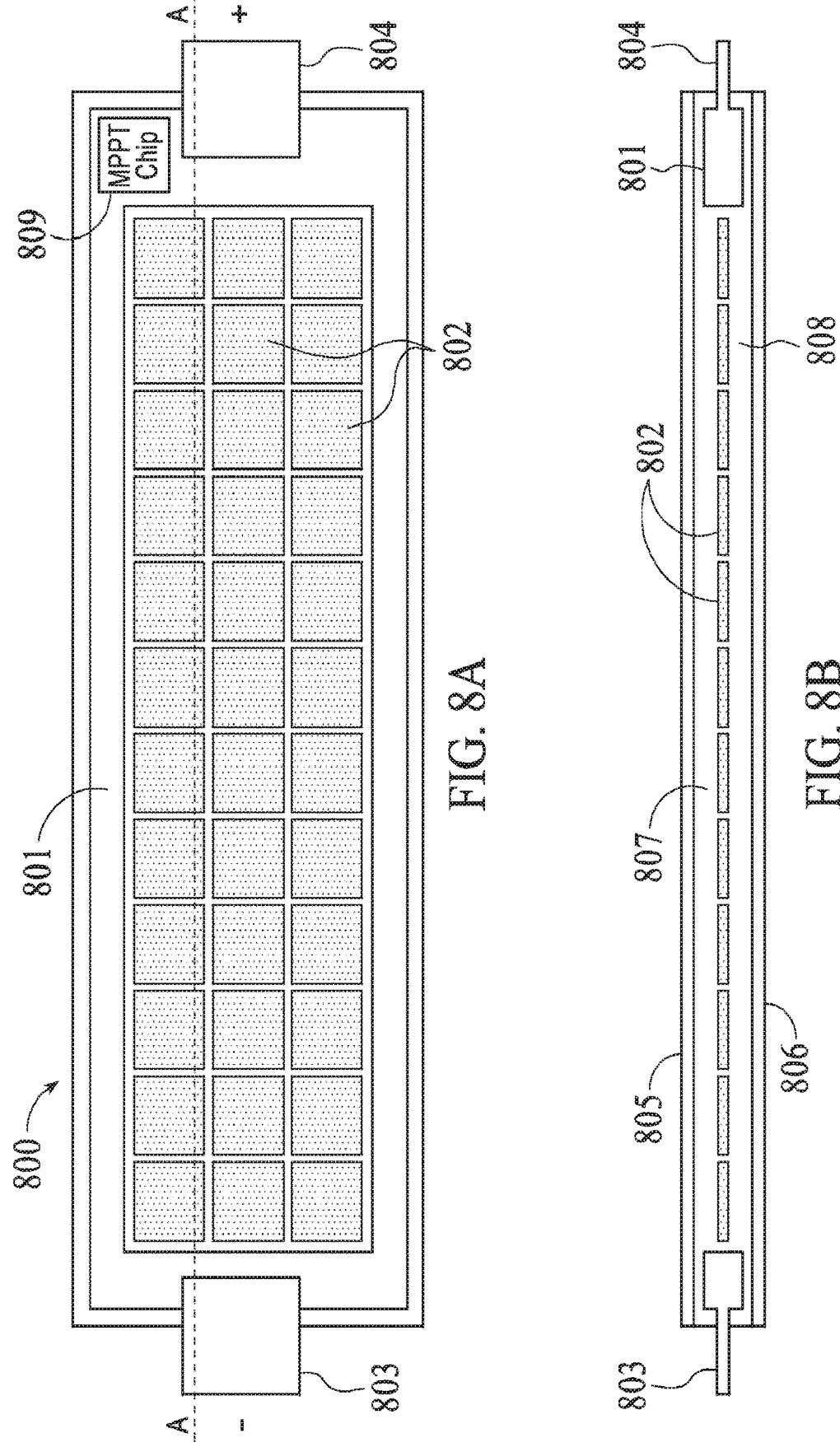
FIGS. 8A-8B show a bifacial SPS building block unit with in-laminate frame providing structural strength and other features for the laminate.

FIG. 8A-8B show an example SPS unit 800 comprising an elongated (e.g., rectangular), thin (~1 to 3 mm), planar, semi-rigid (or rigid), lightweight (~0.1 to 0.5 g/cm²), high power density (~50 to 200 $W_p$/kg), bifacial SPS laminate using an in-laminate thin composite polymeric frame 801 (for strength) and cover sheets 805 and 806 on the first and second SPS bifacial light-receiving surfaces. FIG. 8B is the cross-sectional view along the AA cutline. In this example, Z=1, S=4, M=3×3=9. Multi-modal MPPT chip and cell connection details are not shown for clarity.

A thin (e.g., ~0.5 to 3 mm) planar rigid composite polymer peripheral in-laminate frame 801 provides mechanical support and provides electrical lead feedthroughs. A thin (e.g., 0.025 to 0.500 mm) transparent ETFE or FEP cover sheet 805 on Face 1 and 806 on Face 2 provides mechanical and environmental protection while being optically transparent. In an alternative embodiment, thin (e.g., ~0.1 to 0.8 mm) anti-reflection (AR)-coated high-transparency glass cover sheet may be used on the SPS faces. Solar encapsulant layers 807 and 808 on bifacial sides 1 and 2 of the sub-cells 802 are also optically transparent (materials used may be e.g., EVA, POE, or IBE). SPS negative lead 803 and SPS positive lead 804 protrude from the frame 801.

Electrical Connections of the SPS Building Block Units in RDP-SPG Modules

Depending on the product specifications (e.g., RDP-SPG voltage and current requirements) and other factors such as the end-user maximum DC-voltage safety considerations, the electrical interconnections among the electrical leads of the SPS building block units in an RDP-SPG module may be in electrical series, parallel, or a hybrid series-parallel combination In order to ensure user safety and eliminate the odds of electric shocks, the maximum open-circuit DC voltage ($V_{oc}$) of the RDP-SPG module (used in various applications) should be preferably limited to about 60 V (and in most applications most preferably limited to ≤50 V).

Assuming a maximum open-circuit voltage ($V_{oc}$) of 0.70 V for each crystalline silicon bifacial sub-cell, the maximum open-circuit voltage ($V_{oc}$) of the SPS building block unit can be calculate as follows: $V_{oc(SPS)} \approx 0.70 \times Z \times S \times$(Super-Cell Current Scaled-Down Factor). As an example, for an SPS with Z=1, S=4, M=3×3 (2 Electrical-Cuts+2 Mechanical-Cuts; current scale-down factor of 3): $V_{oc(SPS)} \approx 0.70 \times 1 \times 4 \times 3 = 8.4$ V; therefore, for this SPS design, up to 6 SPS building blocks can be connected in electrical series in an RDP-SPG module, resulting in a series-connected multi-SPS string open-circuit voltage value of 8.4×6≈50.4 V, meeting the safety requirement.

In multiple SPS units, all-series connections scale up the voltage, all-parallel connections scale up the current, and hybrid series-parallel connections scale up both the voltage and current.

Figure 9A:
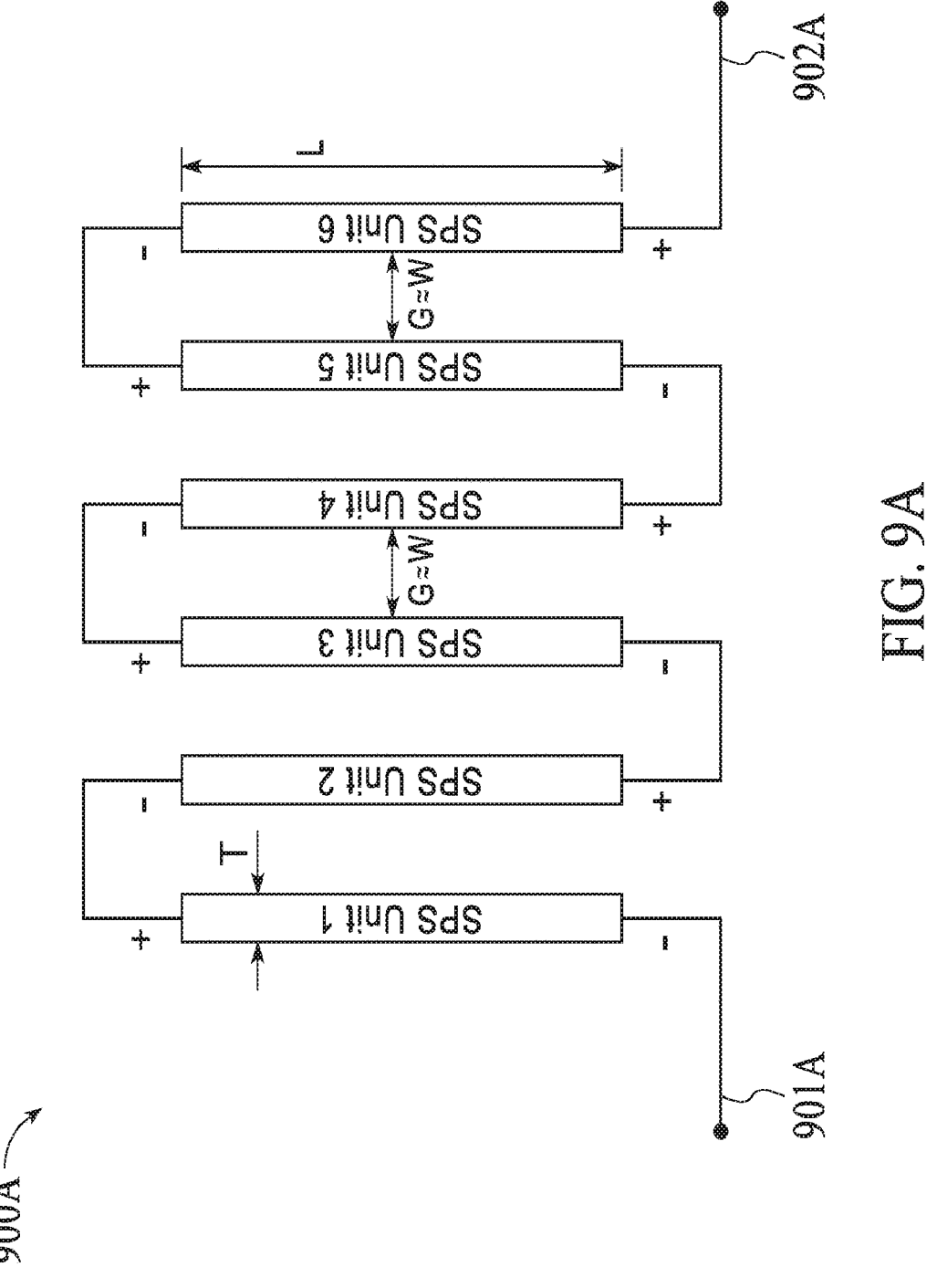
FIGS. 9A-9C show various types of electrical connections between SPS building blocks for a power generating module.

FIG. 9A shows all-series connections of SPS building blocks (e.g., SPS units using Z=1, S=4, M=3×3 using 2 Electrical-Cuts+2 Mechanical-Cuts, U=6, with SPS open-circuit voltage of ~8.4 V) in an RDP-SPG module, resulting in the overall RDP-SPG module maximum open-circuit voltage of $V_{oc} \approx 50.4$ V and maximum short-circuit current of $I_{sc} \approx 3.2$ A (relative dimensions not shown to scale, shown). Here, G=gap between adjacent units: 0.2W≤G≤5W; preferably: 0.5W≤G≤2W; most preferably: G≈W Specifically, the RDP-SPG module 900A in FIG. 9A is shown in deployed (expanded) mode (mechanically adjustable folding or pivoting connectors between adjacent SPS units are not shown for clarity). W is the width (perpendicular to the SPS view shown) of the SPS unit which may be in the range of about half to twice the width of an equivalent full solar cell (e.g., 8 cm≤W≤35 cm). Typically W≈16 cm to 20 cm. Length of SPS Unit for this representative design example is L≈65 cm to 70 cm. SPS Unit thickness T≈1 mm to ~3 mm in this example. 901A and 902A are respectively the negative and positive leads of the RDP-SPG module 900A.

Figure 9B:
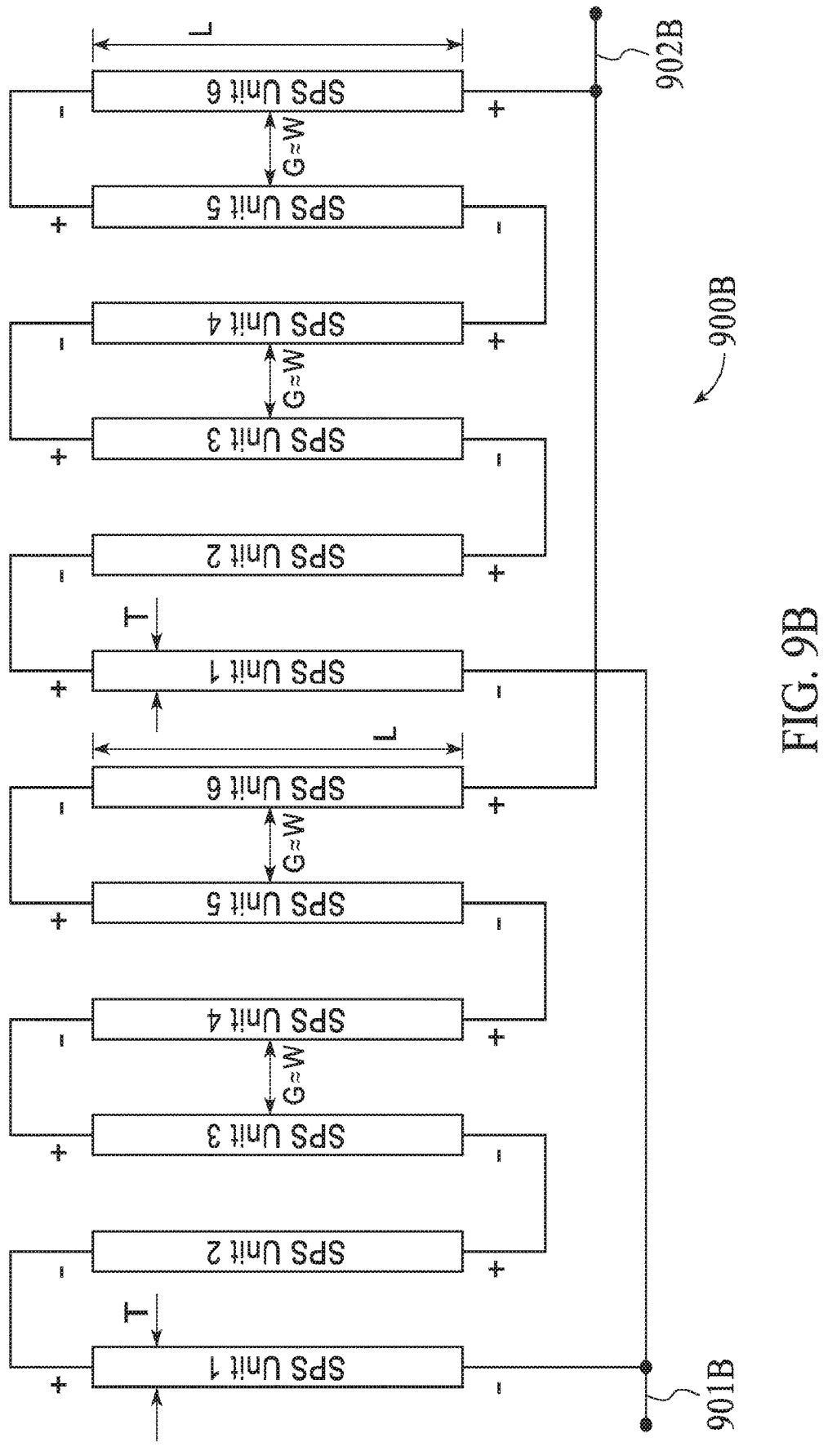

FIG. 9B shows an RDP-SPG module 900B using hybrid series-parallel connections of the SPS unit building blocks. Hybrid series-parallel connections of SPS building blocks (e.g., SPS units using Z=1, S=4, M=3×3 using 2 Electrical-Cuts+2 Mechanical-Cuts, No. of SPS units U=12, with SPS open-circuit voltage of ~8.4 V) in an RDP-SPG module, resulting in the overall RDP-SPG module maximum open-circuit voltage of $I_{sc} \approx 50.4$ V and maximum short-circuit current of $I_{sc} \approx 6.4$ A (relative dimensions not shown to scale, details not shown). G=gap between adjacent units:

$0.2W \leq G \leq 5W$; preferably: $0.5W \leq G \leq 2W$; most preferably: $G \approx W$. W (SPS width) is in the range of about half to twice the width of a full solar cell (e.g., 8 cm$\leq$W$\leq$35 cm.) For hybrid series-parallel connections, first connect the SPS units in series and then in parallel. 901B and 902B are respectively the negative and positive leads of the RDP-SPG module 900B.

Figure 9C:
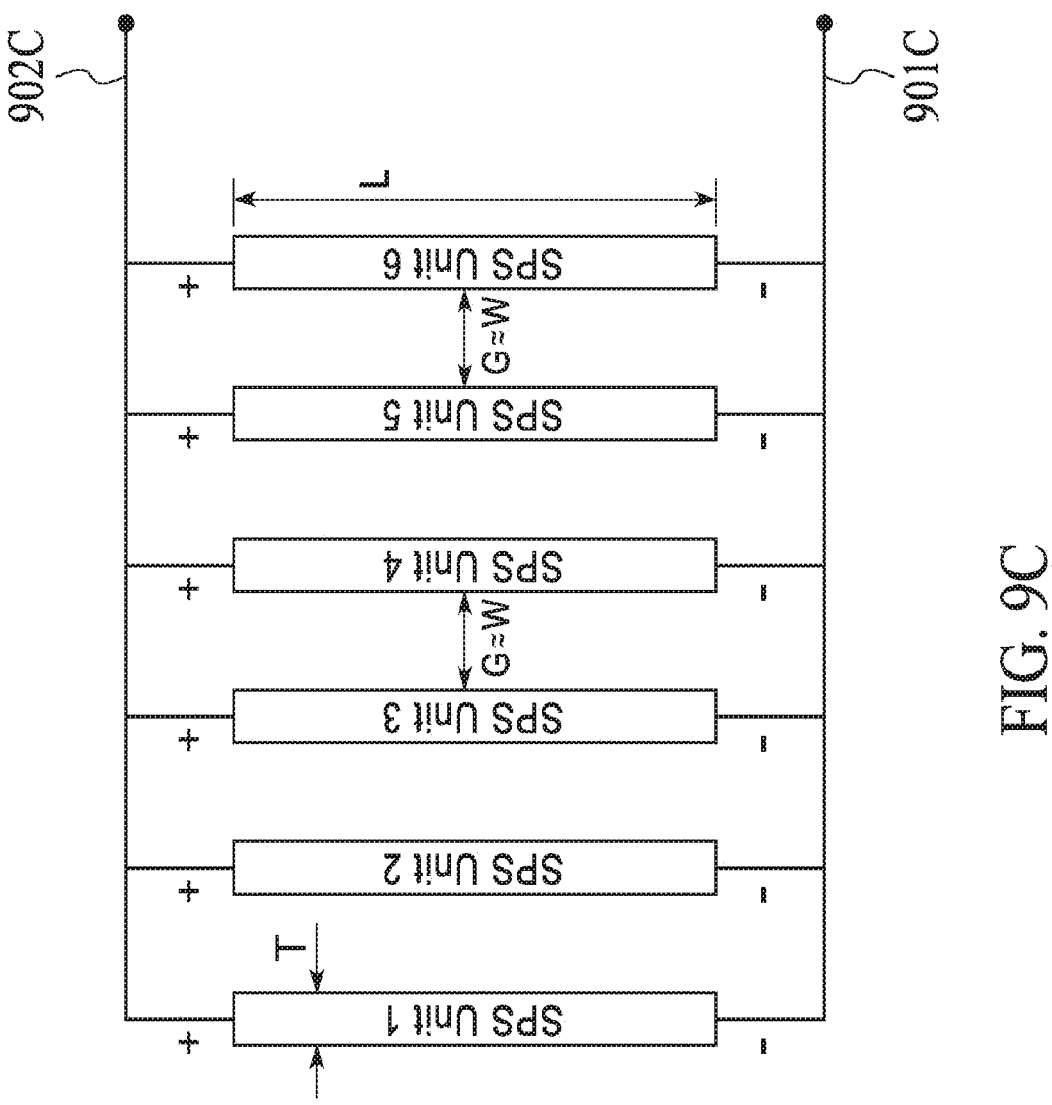

FIG. 9C shows an RDP-SPG module 900C using all-parallel connections of the SPS building blocks. This example shows all-parallel connections of SPS building blocks (e.g., SPS units using Z=1, S=4, M=3×3 using 2 Electrical-Cuts+2 Mechanical-Cuts, U=6, with SPS open-circuit voltage of ~8.4 V) in an RDP-SPG module, resulting in the overall RDP-SPG module maximum open-circuit voltage of $I_{sc} \approx 8.4$ V and maximum short-circuit current of $I_{sc} \approx 19.2$ A (relative dimensions not shown to scale, details not shown). G=gap between adjacent units: $0.2W \leq G \leq 5W$; preferably: $0.5W \leq G \leq 2W$; most preferably: $G \approx W$. Leads 901C and 902C are respectively the negative and positive leads of the RDP-SPG module 900C.

Thin in-Laminate Frame for Bifacial SPS Building Block Units

The bifacial SPS building block unit preferably uses a thin, in-laminate, composite polymeric frame in order to provide further enhanced mechanical support & rigidity for extended lifetime (particularly for SPS building block units which use laminates with fluoropolymer cover sheets, such as ETFE or FEP, instead of glass cover sheets, for less weight and higher power density). The in-laminate frame material is sufficiently thin (e.g., ~0.5 mm to <3 mm depending on the SPS unit dimensions) in order to meet the SPS unit weight and thickness specifications, i.e., provide power densities in the range of >50 W$_p$/kg to ~200 W$_p$/kg and SPS thickness$\leq$3 mm. Width of the frame is typically 5 to 25 mm.

The in-laminate frame material preferably is an electrically-insulating, durable, rigid, proven, composite polymeric material with relatively low mass density (density<1.9 g/cm³), with the composite materials proven in the automotive and electronics industries being among the most preferred choices.

The suitable composite polymeric materials which are applicable to the in-laminate frame include (but are not limited to): composite glass-reinforced polyamide materials (having 15% to 40% glass content by weight), for instance, materials known as Ultramid, or composite glass reinforced polybutylene terephthalate known as Ultradur PBT materials, supplied by BASF Corporation.

Specifically, the thin in-laminate frames may be made of composite glass-reinforced polyamide materials known as Ultramid® 8233G HS BK-106, or composite glass-reinforced polybutylene terephthalate known as Ultradur® B4040G6 HR Black 15029 PBT materials, supplied by BASF.

Ultramid 8233G HS BK-106 is a heat stabilized, weather resistant, 33% glass-fiber-reinforced PA6 composite offering excellent strength, stiffness, high-temp. performance and dimensional stability.

Another material choice, Ultradur B 4040 G6 HR BK15029 is a hydrolysis-resistant, 30% glass-reinforced PBT/PET blend, providing good mechanical properties & melt flow properties. Another material choice, Ultradur B 4300 G6 PBT is an easy-flowing, injection-molding PBT with 30% glass fiber reinforcement for rigid, tough, and dimensionally stable parts. Another suitable material candidate for the in-laminate SPS frame and also the RDP-SPG folding (or pivoting) thin sheet connectors is the class of printed-circuit board (PCB) materials.

The PCB sheet material may serve either solely as a structural material or for the dual purposes of structural support and electrical connections within and between the SPS units. If a PCB material is used for either the in-laminate SPS frame or the RDP-SPG folding (or pivoting) thin sheet connectors (or both), the PCB material may optionally include a thin layer of copper foil for providing copper electrical interconnection runways and pads as needed.

If a PCB material is used for the in-laminate SPS frame, it may also be used to attach the MPPT chip and other components (capacitors, etc.) directly on it (instead of a separate PCB). One of the suitable materials for the above-mentioned RDP-SPG applications is the standard rigid FR4 which is a glass-fiber epoxy PCB laminate, the most commonly used PCB material. FR4 is flame-retardant UL94 VO, woven glass fabric+epoxy resin system, density$\approx$1.9 g/cm³. Another suitable PCB material for the above-mentioned RDP-SPG applications is CEM-3 (CEM: Composite Epoxy Material) which has a milky white color and is fairly similar to FR4.

The primary benefits of the PCB materials (FR4 and CEM-3) for the above-mentioned applications (in-laminate SPS frame and RDP-SPG folding/pivoting sheet connectors, discussed further below) include: mechanical strength and rigidity for thin (~0.5 mm to 3 mm) sheets, excellent adhesion to the encapsulant materials, relatively low cost, excellent stability and lifetime.

The thin in-laminate frame enables production of reliable rigid or semi-rigid SPS building block units without using heavy & thick rigid glass cover sheets. The thin in-laminate frame material must have excellent adhesion to the encapsulant material (EVA or another material) in the SPS laminate structure. The thin in-laminate frame used in the SPS building block unit laminate may either be a single-piece continuous peripheral frame or up to 4 straight pieces of the composite polymeric material arranged to form the frame for rigidity.

The thin composite frame may be either fully contained within the main SPS laminate or its outer edges may protrude or extend somewhat beyond the SPS laminate encapsulation to facilitate the extensions of the SPS electrical leads. It also helps the mechanical and electrical attachments of the SPS building block units to the pair of mechanically or structurally adjustable folding (or pivoting or hinging) sheet or frame connectors.

The width of the peripheral frame (W$_F$) is much smaller than the width of the SPS building block (W$_F$<<W), and is preferably 0.5 cm$\leq$W$_F \leq$3 cm, with the smaller and larger SPS units using smaller and larger widths, respectively. The thickness of the peripheral frame (T$_F$) is smaller than the SPS building block thickness (T$_F$<T$\leq$3 mm), and is preferably 0.5 mm$\leq$T$_F$<3 mm.

A representative example of SPS in-laminate composite frame design is discussed below. The in-laminate SPS frames can serve at least some of the following purposes:

Provide enhanced mechanical rigidity and structural support for the bifacial SPS laminate unit;

Facilitate implementation and attachment of the multimodal MPPT chip and supporting components such as capacitors (components may be mounted on a designated portion of the frame itself, particularly when using a PCB material such as FR4 or CEM-3 for the frame material);

Support the electrical and mechanical (structural) connection leads on the shorter sides of the SPS unit, The in-laminate SPS frame design options include but are not limited to the following:

Continuous frame without any extended segments beyond the SPS laminate boundary;

Continuous frame with two or more extended segments beyond the SPS laminate boundary;

Segmented frame without any extended segments beyond the SPS laminate boundary;

Segmented frame with two or more extended segments beyond the SPS laminate boundary.

The segmented frame design may allow the segments (e.g., 4 pieces per SPS) to be connected or snapped into each other to make an effective single-piece frame. Segmented multi-piece frames may be manufactured using injection molding or laser-cut or stamped pieces from composite materials.

These in-laminate SPS frame design options are shown in FIGS. 10A-F. FIG. 10A-10C show examples with SPS laminate boundary 1001 slightly beyond the outer frame edge 1002. FIG. 10D-10F show examples with outer frame edge 1002 slightly beyond the SPS laminate boundary 1001. FIGS. 10A and 10D show frame design with no protrusion for electrical and mechanical connections to the sheet connectors. FIGS. 10B and 10E show frame design with frame protrusion 1003 (having one on each end) for electrical and mechanical (structural) connections to the sheet connectors. FIGS. 10C and 10F show frame design with frame protrusion 1004 (having two on each end) for electrical and mechanical (structural) connections to the sheet connectors. The continuous single-piece frames may be manufactured using injection molding or laser-cut pieces from composite materials.

Arrangements of Sub-Cells for the Bifacial SPS Building Block Laminates

The plurality of sub-cells in the bifacial SPS building block unit may be arranged with respect to each other based on one of several design and manufacturing options, such as:

1. Co-Planar (Non-Overlapping Sub-Cells) With Tight Sub-Cell Spacing: Co-planar sub-cells with the adjacent series-connected sub-cell to sub-cell spacing of >0 mm up to about 1 mm (i.e., tightly spaced co-planar sub-cells in the bifacial SPS building block);

2. Co-Planar (Non-Overlapping Sub-Cells)) With Larger Sub-Cell Spacing: Co-planar sub-cells with the adjacent series-connected sub-cell to sub-cell spacing of >1 mm up to ~5 mm (i.e., larger spacing of co-planar sub-cells in the bifacial SPS building block);

3. Non-Co-Planar With Overlapping Sub-Cells: Non-co-planar and edge-overlapping adjacent series-connected sub-cells with the current-carrying (i.e., series-connected) edge pairs slightly overlapping (edge subcell-on-subcell overlap width in the range of a fraction of mm up to 2 mm) and stacked together; this design option provides SPS building blocks with smaller surface areas and higher power densities because of the overlapping arrangement of the sub-cells.

The third design option (i.e. non-co-planar with overlapping sub-cells) simplifies the electrical series interconnections among the sub-cells since the top edge (e.g., emitter or positive power lead) of a sub-cell can be electrically connected to the bottom edge (e.g., base or negative power lead) of an adjacent sub-cell using a suitable conductive epoxy (CE) or conductive adhesive (CA) material, hence, eliminating the need for copper ribbon stringing of the sub-cells and soldering, and resulting in better aesthetics, enhanced power density, and possibly improved reliability.

Figures 11A, 11B:
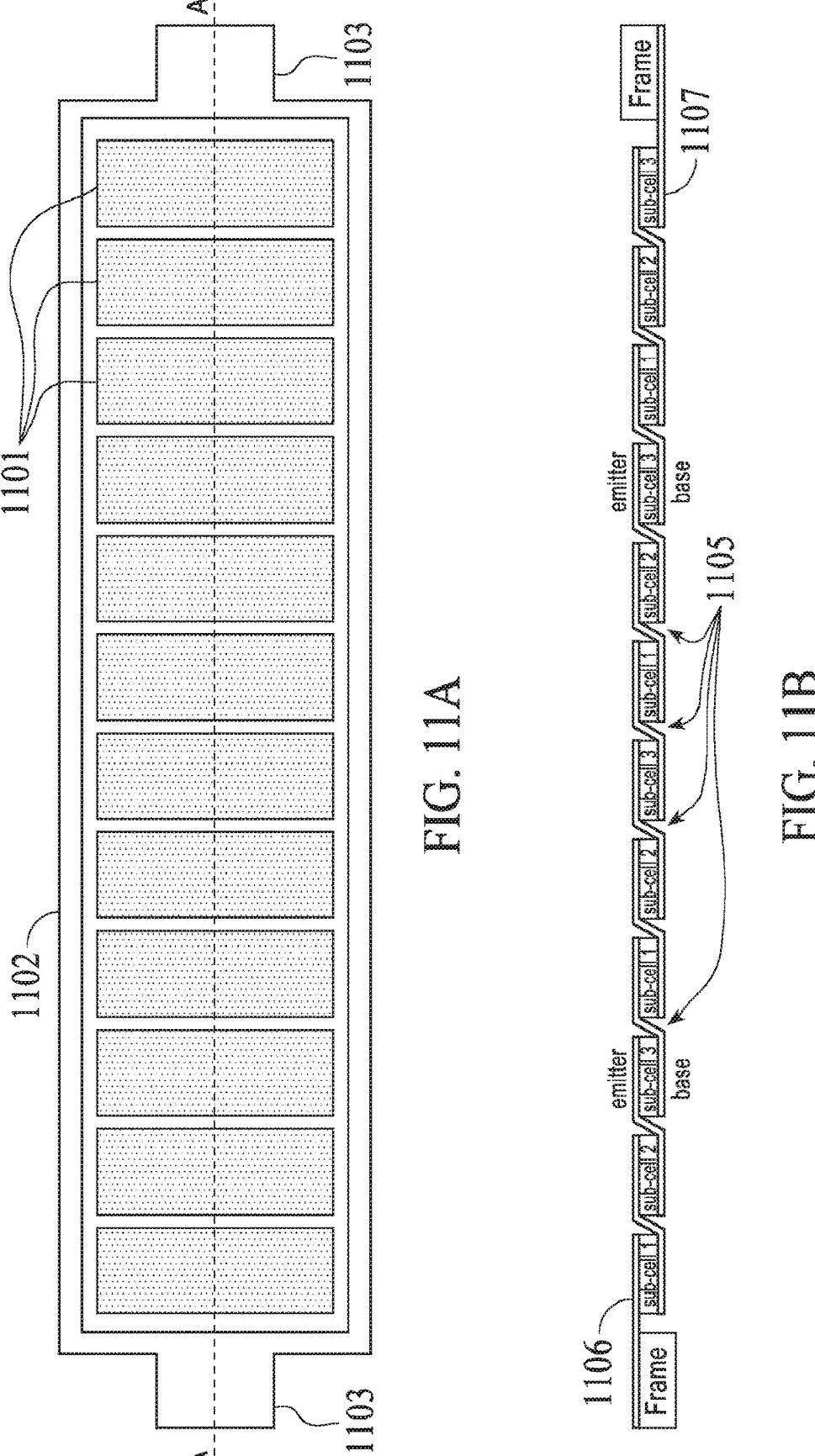
FIGS. 11A-11B show non-overlapping (or spaced apart) arrangement of electrically-connected sub-cells for the bifacial SPS building block laminates.

FIG. 11A shows top view of a schematic diagram of sub-cell arrangement using the "Non-Overlapping Sub-Cells" design (discussed as Options 1 & 2 above for various spacings). In this example, an SPS unit is using Z=1, S=4, M=3×1 (12 sub-cells 1101 in the SPS unit; dimensions not shown to relative scale; most SPS laminate details such as ribbon connection details not shown). FIG. 11B shows the cross-sectional view along the cutline AA shown in FIG. 11A. The in-laminate frame is shown as 1102 with optional frame extensions 1103 for mechanical (structural) and electrical connections. Copper ribbon series connections 1105 connect backside base to frontside emitter of adjacent sub-cells 1101. SPS positive and negative leads 1106 and 1107 respectively carry the electricity generated by the SPS unit to the module-level MPPT power optimizer (AC or DC).

Figures 12A, 12B:
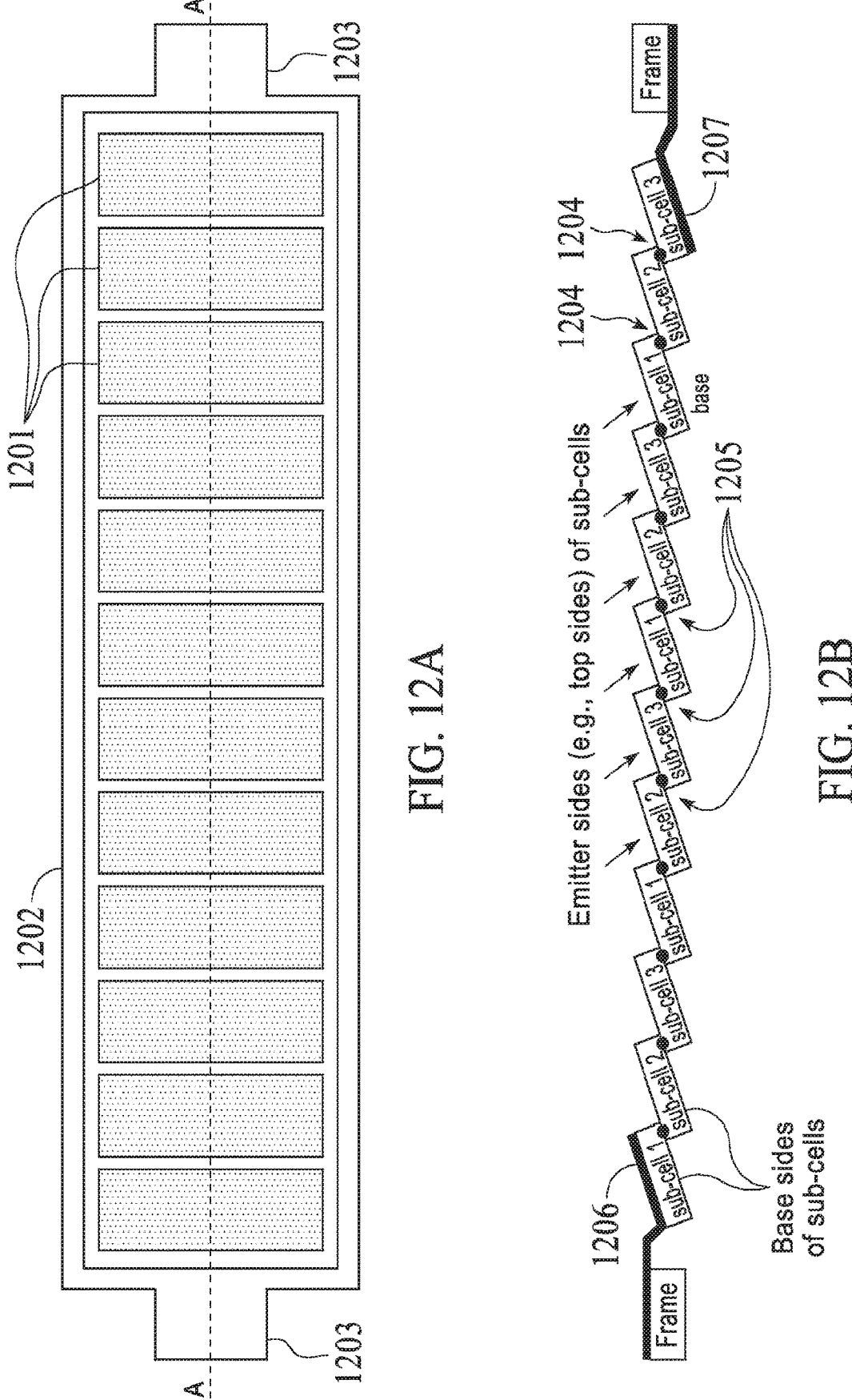
FIGS. 12A-12B show overlapping (or zero-gap) arrangement of electrically-connected sub-cells for the bifacial SPS building block laminates.

FIG. 12A shows top view of a schematic diagram of sub-cell arrangement using the "Non-Co-Planar Overlapping Sub-Cells" design (discussed as Option 3 above). This representative example shown for an SPS unit using Z=1, S=4, M=3×1 (12 sub-cells 1201 in the SPS; various dimensions not shown to relative scale; most SPS laminate details such as the laminate structure details not shown). FIG. 12B shows the cross-sectional view along the cutline AA. The in-laminate frame is shown as 1202 with frame extensions 1203 for mechanical (structural) and electrical connections. SPS positive and negative power leads 1206 and 1207 respectively carry the electricity generated by the SPS unit to the module-level MPPT. Overlapping connections 1205 connect base to emitter of adjacent sub-cells using conductive adhesive at the adhesive joints 1204.

FIG. 13 shows an example flowchart showing the manufacturing process flow for making the SPS building block units for RDP-SPG modules. Persons skilled in the art would appreciate that the steps can be varied within the scope of this disclosure depending on the design of the SPS building block.

Mechanically Adjustable Folding (or Pivoting) Sheet Connectors for Open-Structure RDP-SPG In one embodiment, each RDP-SPG module is made of a plurality of bifacial SPS building block units and preferably a pair of mechanically adjustable folding (or pivoting or hinged) thin sheet connectors attached to the shorter sides of the SPS building blocks (for expansion and retraction). The pair of adjustable folding (pivoting) thin sheet connectors fully enable rapid (e.g., in seconds) expansion (for deployment) and retraction (for portability/transportability), and electrically connect the SPS units in the desired interconnection arrangement (all-series, hybrid series-parallel, or all-parallel) for efficient RDP-SPG power delivery. The electrical connections to both the positive and negative polarities of each SPS building block unit may be made either on just one of or both the shorter sides of the SPS unit via one or both the folding (pivoting) thin sheet connectors, depending on whether the SPS electrical leads (+ and – leads) are provided on one or both ends. The partially extended to fully extended states of the RDP-SPG module correspond to deployment mode from lower to higher power generation amounts, respectively.

The pair of mechanically adjustable folding (or pivoting or hinged) thin sheet connectors are made using durable composite polymeric materials and highly reliable folding or pivoting structures capable of numerous expansion & retraction cycles without failure (other materials such as transparent fiberglass or PET sheets may be used).

To provide allowance for on-demand rapid expansion and retraction with excellent reliability and extended lifetime, the mechanically adjustable thin sheet connectors may use a plurality of rotating pivots or folding axes in their designs, enabling from full retraction to full expansion.

FIGS. 14A-14D show example of an open-structure RDP-SPG module capable of retraction and expansion. Representative example of an RDP-SPG module design with U=10 bifacial SPS building block units showing the module in a fully retracted or compacted condition (various dimensions in the schematic diagram below not shown to relative scale).

Assuming RDP-SPG module using a plurality of (i.e. 'U' number of) SPS building block units, each of the pair of mechanically adjustable thin sheet connectors uses (2U−1) folding axes (or rotational pivots); for instance, an RDP-SPG module using U=10 SPS building block units uses a pair of mechanically adjustable thin sheet connectors, with each connector having 19 rotational pivots or folding axes (with 10 connected to the SPS units and 9 folding or rotating axes located in between the SPS units).

Assuming a fully extended SPS unit-to-unit gap of G≈W and the SPS unit dimensions of W (width), L (length), and T (thickness), the effective dimensions and volume of the RDP-SPG module with U number of SPS units in the fully expanded and retracted states are:

RDP-SPG Module dimensions & volume when fully expanded: $V_E = L \times W \times (U-1) \times W = L \cdot W^2 \cdot (U-1)$. For instance, for L=66 cm, W=18 cm, T=0.2 cm, U=10, then volume is $V = 66 \times 182 \times 9$ cm$^3$ = 192,456 cm.$^3$ RDP-SPG Module dimensions & volume when fully retracted: $V_R = (L+W) \times W \times U \times T$. For instance, for L=66 cm, W=18 cm, T=0.2 cm, U=10 leads to a retracted volume of $V = 84 \times 18 \times 10 \times 0.2$ cm$^3$ = 3,024 cm.$^3$ Ratio of $V_E/V_R = 192,456/2,376 = 81$ in the above example.

For this example, the volume compaction ratio is ~81, meaning that the RDP-SPG unit can be compacted in volume by a factor of ~81 compared to its deployment mode, for ease of portability and transportation.

The mechanically adjustable thin sheet connectors are preferably made of relatively thin (e.g., ~0.5 to 3 mm in thickness), lightweight, durable, composite polymeric material sheet sections with pivoting or folding features (other materials such as transparent fiberglass may be used).

The suitable composite polymeric materials which are applicable to the folding (or pivoting) thin sheet or framed connectors include (but are not limited to): composite glass-reinforced polyamide materials (having 15% to 40% glass content by weight), for instance, materials known as Ultramid, or composite glass reinforced polybutylene terephthalate known as Ultradur PBT materials, supplied by BASF Corporation.

Specifically, the mechanically adjustable folding (or pivoting) thin sheet or framed connectors may be made of composite glass-reinforced polyamide materials known as Ultramid® 8233G HS BK-106, or composite glass-reinforced polybutylene terephthalate known as Ultradur® B4040G6 HR Black 15029 PBT materials, which are supplied by BASF Corporation.

One suitable material of choice, Ultramid 8233G HS BK-106, supplied by BASF, is a heat stabilized, weather resistant, 33% glass-fiber-reinforced PA6 injection molding composite offering excellent strength, stiffness, high temperature performance and dimensional stability Another material choice, Ultradur B 4040 G6 HR BK15029 is a hydrolysis-resistant, 30% glass-reinforced PBT/PET blend, providing good mechanical properties & melt flow properties. Another material choice, Ultradur B 4300 G6 PBT is an easy-flowing, injection-molding PBT with 30% glass fiber reinforcement for rigid, tough, and dimensionally stable parts. Other materials of interest for the adjustable folding/pivoting sheet connectors include other high-durability, lightweight composite polymeric materials used in the automotive industry.

Figure 14A:
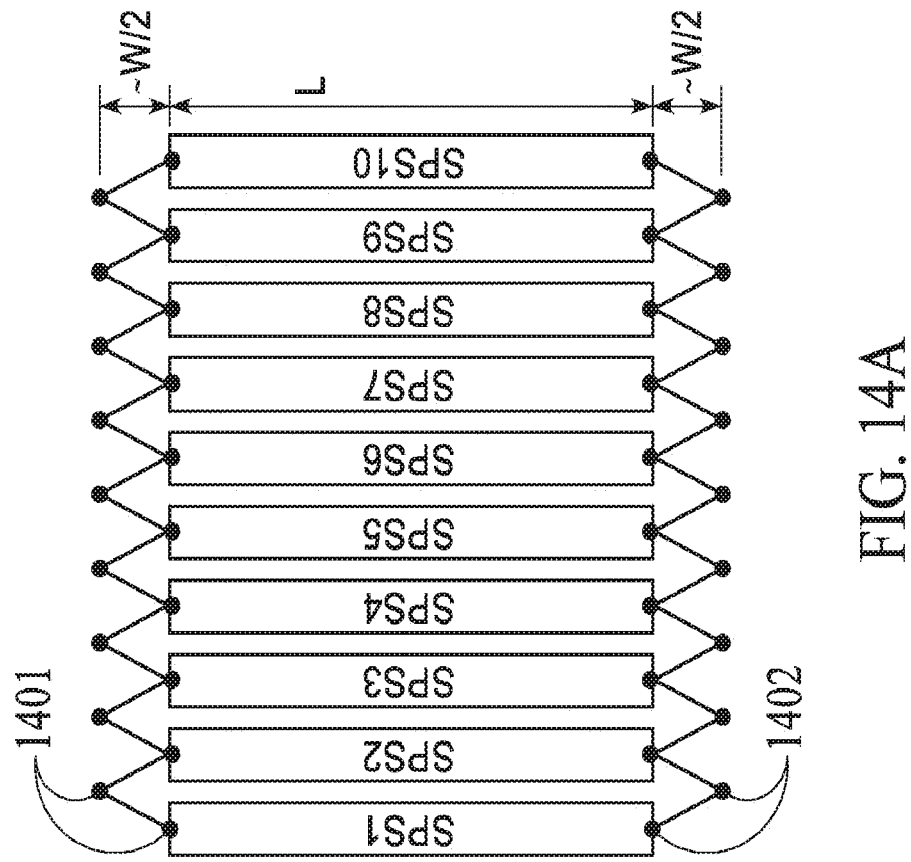
FIG. 14A-14D show example of an open-structure (with through-slat open gaps between adjacent SPS units when expanded) RDP-SPG module in various stages of expansion and retraction.
Figure 14B:
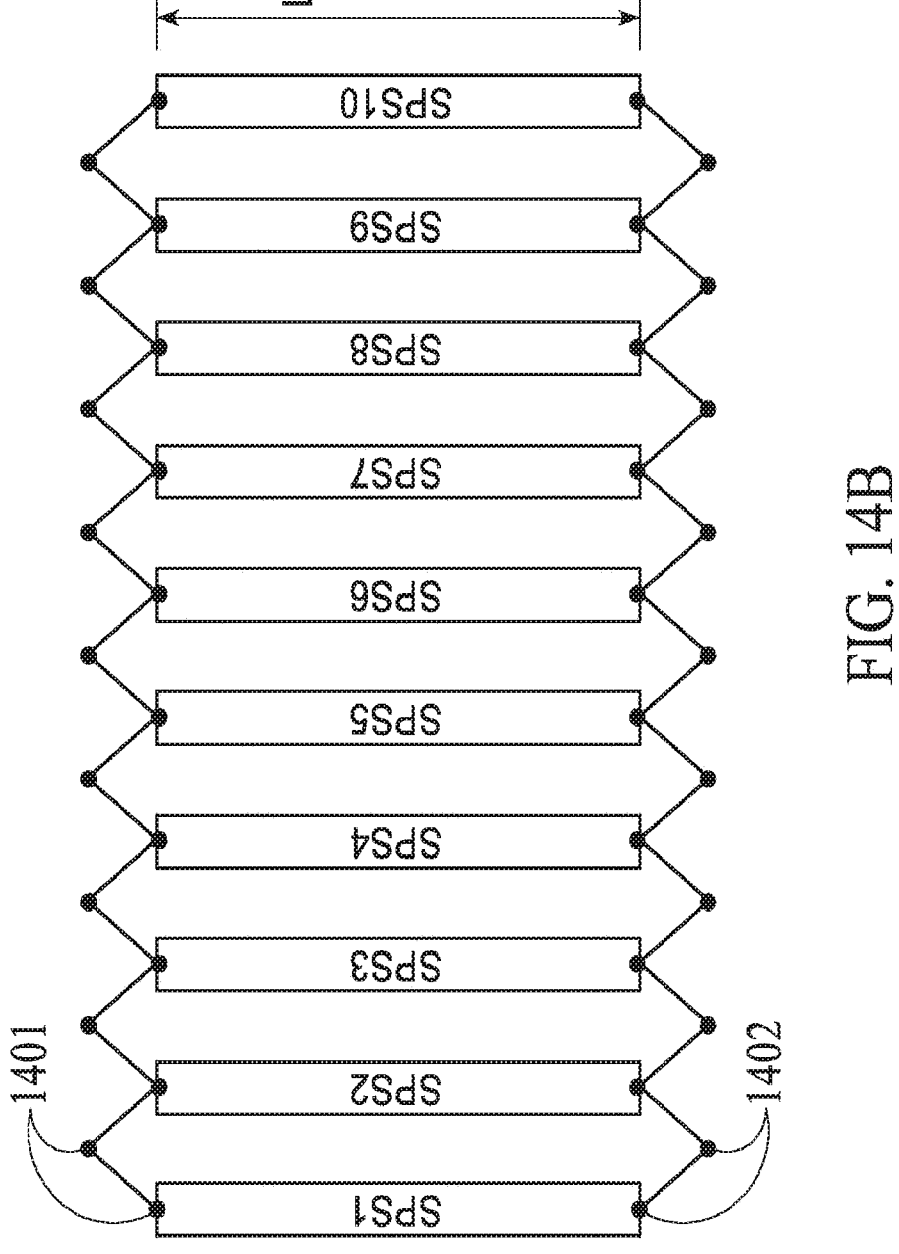
Figure 14C:
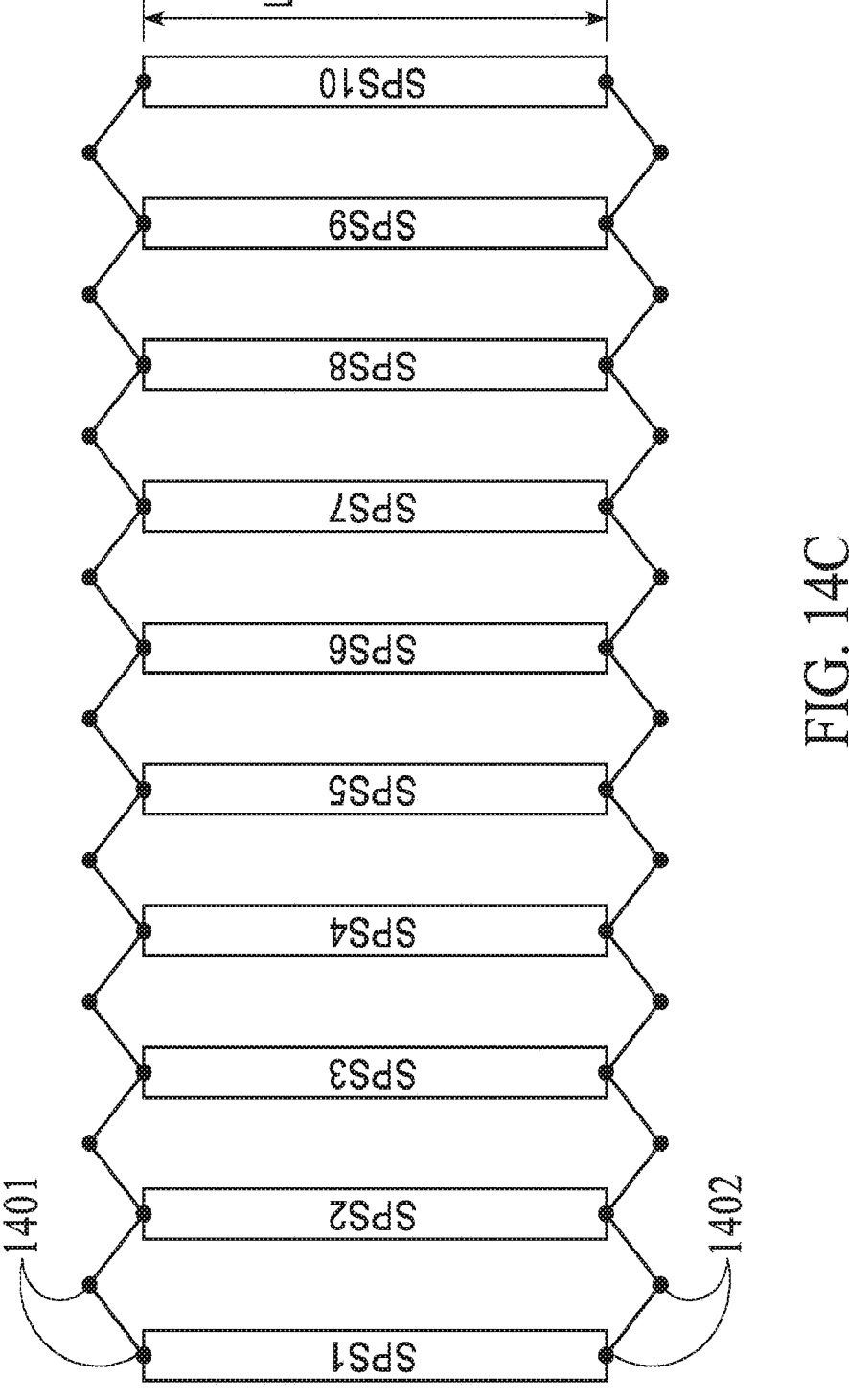
Figure 14D:
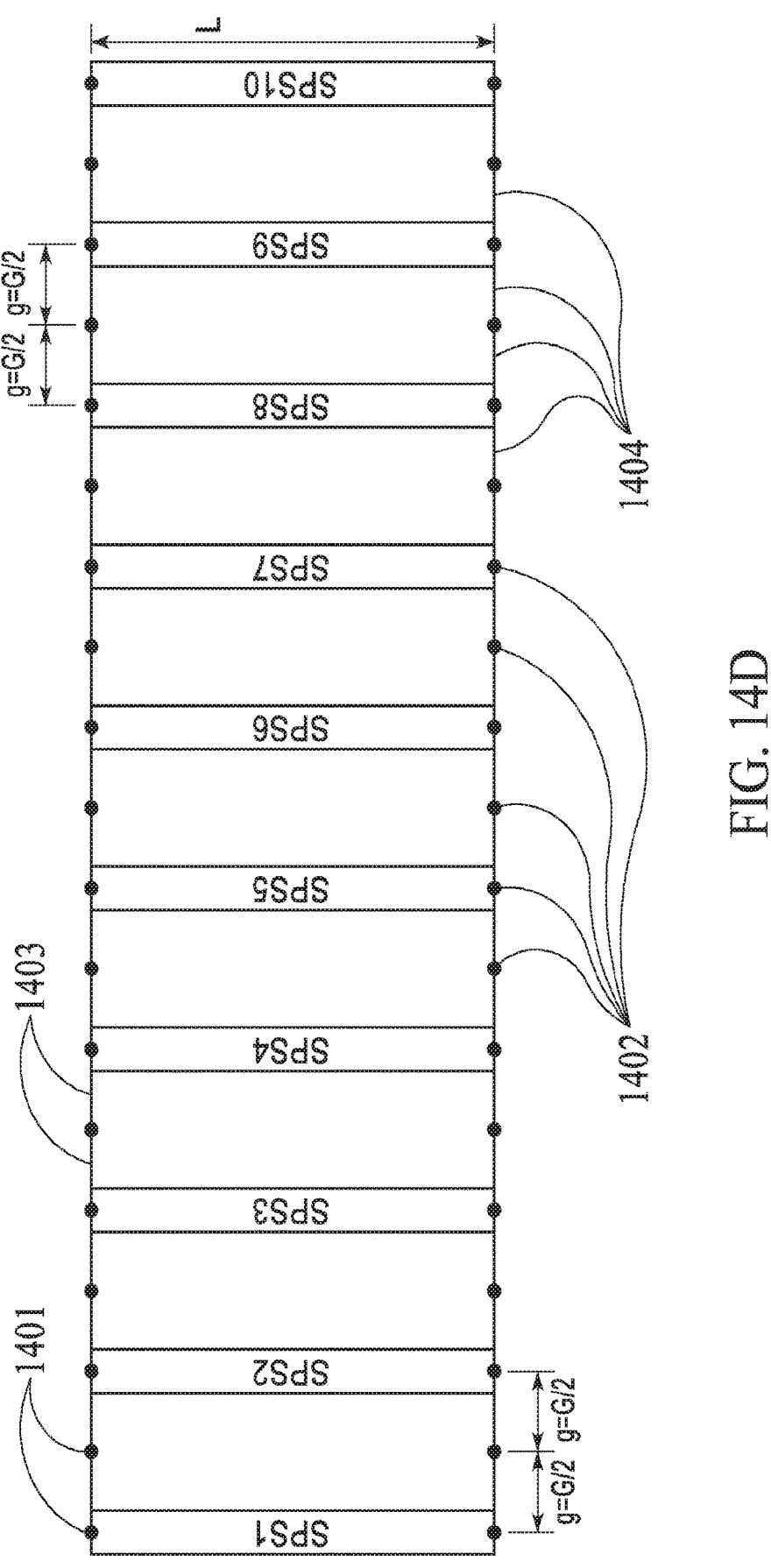

Specifically, FIG. 14A shows a fully retracted RDP-SPG module. $T_{SPS}$ is the thickness of a single unit. Fully retracted virtual enclosure volume: $V_R \approx (L+W) \times W \times U \times T_{SPS}$. FIG. 14D shows fully expanded virtual enclosure volume: $V_E \approx L \times W \times (U-1) \times W = L \times W^2 \times (U-1)$. Elements 1401 show the folding or pivoting axes in adjustable thin sheet connector 1403 (shown in FIG. 14D) on one side, and 1402 show the folding or pivoting axes in adjustable thin sheet connector 1404 (shown in FIG. 14D) on the other side. FIGS. 14B and 14C show partially expanded configurations with the gap between the adjacent SPS units gradually increasing towards full expansion.

Figure 15:
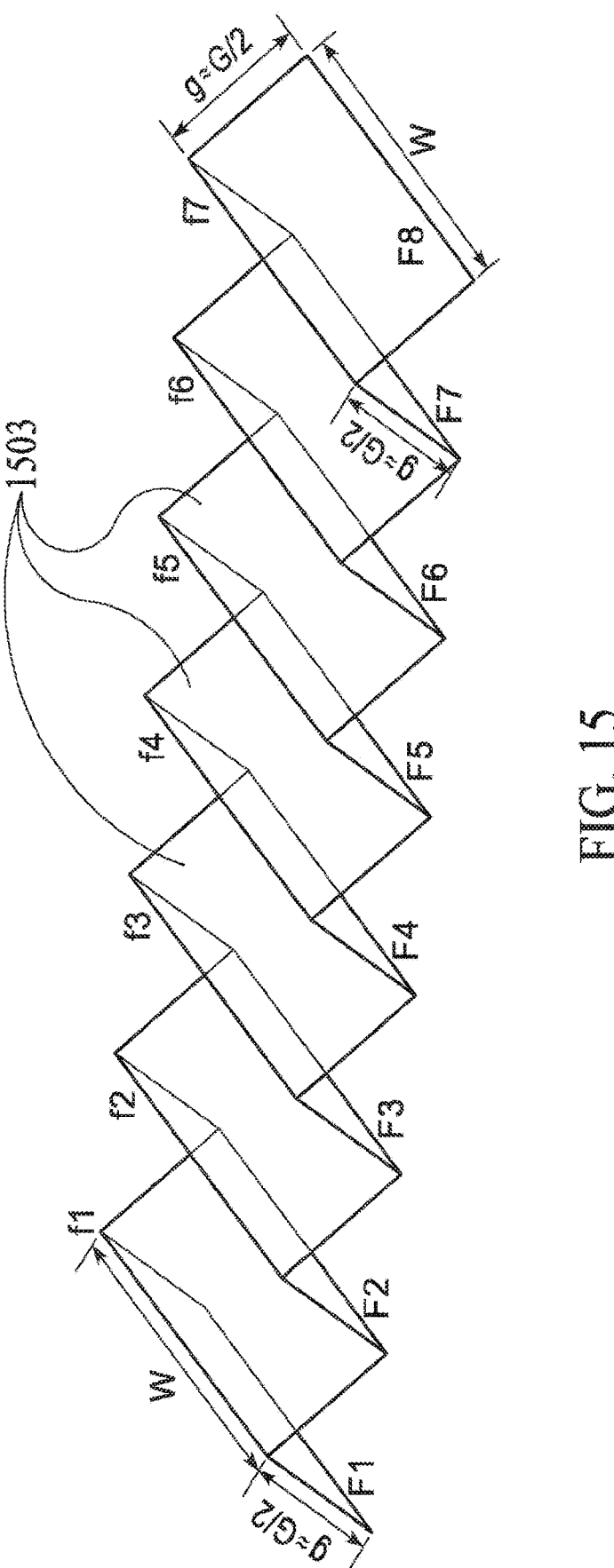
FIG. 15 shows structure of a folding thin-sheet connector used for electrical and structural connections among the plurality of SPS units in an open-structure module.

FIG. 15 shows partially expanded view of a folding-thin-sheet connector structure 1503 for open structure RDP-SPG module. The plurality of the bifacial SPS building block units (not shown in FIG. 15) are preferably connected together in an RDP-SPG module using a pair of expandable and retractable folding-thin-sheet connectors like 1503 on each short end. The bottom end lines F1 and F8, and the bottom folding intersection lines F2 through F7, are attached to one of the two shorter sides of each of the SPS building block units (not shown). The thin connector sheets (which serve as both mechanical and electrical connectors among the SPS units) can pivot around the top folding lines f1 through f8 and the bottom folding lines F2 through F7, providing the capability for rapid extension and retraction of the SPS units. The segments of connector 1503 are made of rigid or semi-rigid thin sheets preferably <2 mm thickness, area≈W·(G/2).

Figure 16:
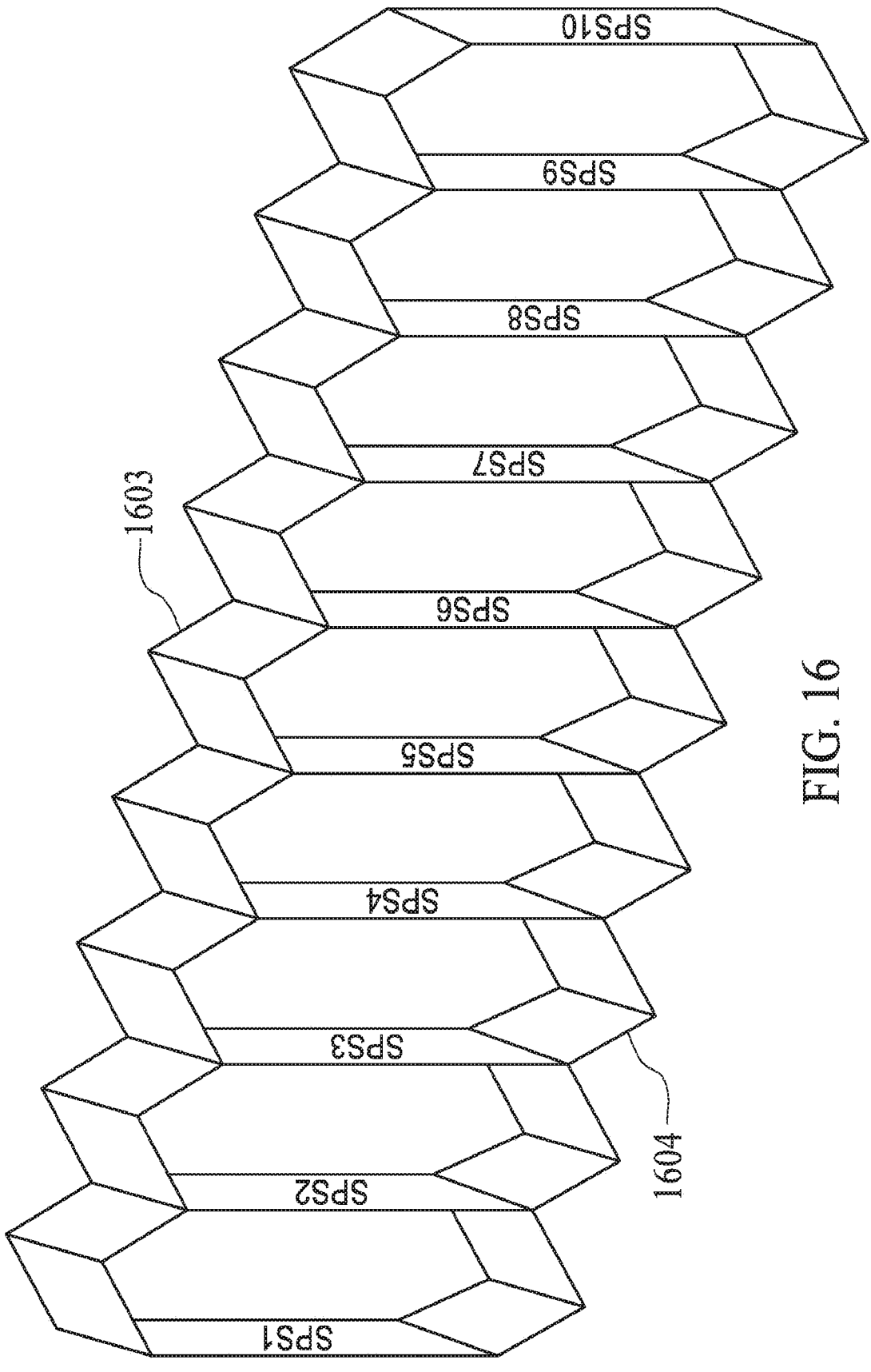
FIG. 16 shows mechanically adjustable folding or pivoting sheet connectors connecting multiple SPS units in an open-structure configuration (with through-slat open gaps between adjacent SPS units when expanded).

FIG. 16 shows a mechanically adjustable folding or pivoting sheet connectors 1603 and 1604 for open-structure RDP-SPG modules. This example shows single-fold-per SPS connector sheet between adjacent SPS units (though designs with multiple folds may be used). The 3D schematic view of FIG. 16 shows an RDP-SPG power module embodiment of this disclosure in a partially extended mode.

The folding connector sheets serve as both mechanical (structural) and electrical connectors among the plurality of bifacial SPS units

1603 is adjustable folding connector sheet 1 attached to one of the two short sides of the Bifacial SPS units (example shown with 10 SPS units). 1604 is adjustable folding connector sheet 2 attached to one of the two-SPG Module Shown in a Partially Expanded Mode. SPS units can effectively capture light from various incoming angles on their bifacial surfaces through their open structures.

There are a variety of preferred angular arrangements (angles of SPS unit planes) to connect and configure a plurality of SPS building block units and the pair of expandable & retractable multi-fold mechanical & electrical sheet connectors in the RDP-SPG modules of this disclosure.

In the preferred RDP-SPG designs, the longer axes of the SPS units are perpendicular to the axes of the pair of expandable & retractable multi-fold mechanical & electrical sheet connectors. In one embodiment of the RDP-SPG modules of this disclosure, the shorter axes of the SPS units (which are perpendicular to the longer axes of the SPS units) are perpendicular (having a fixed 90° angle) to the virtual plane of the RDP-SPG module comprising one set of the long axes of the SPS units, while all the SPS building block unit planes are parallel to each other, as shown in FIGS. 17A-B.

Figures 18A, 18B:
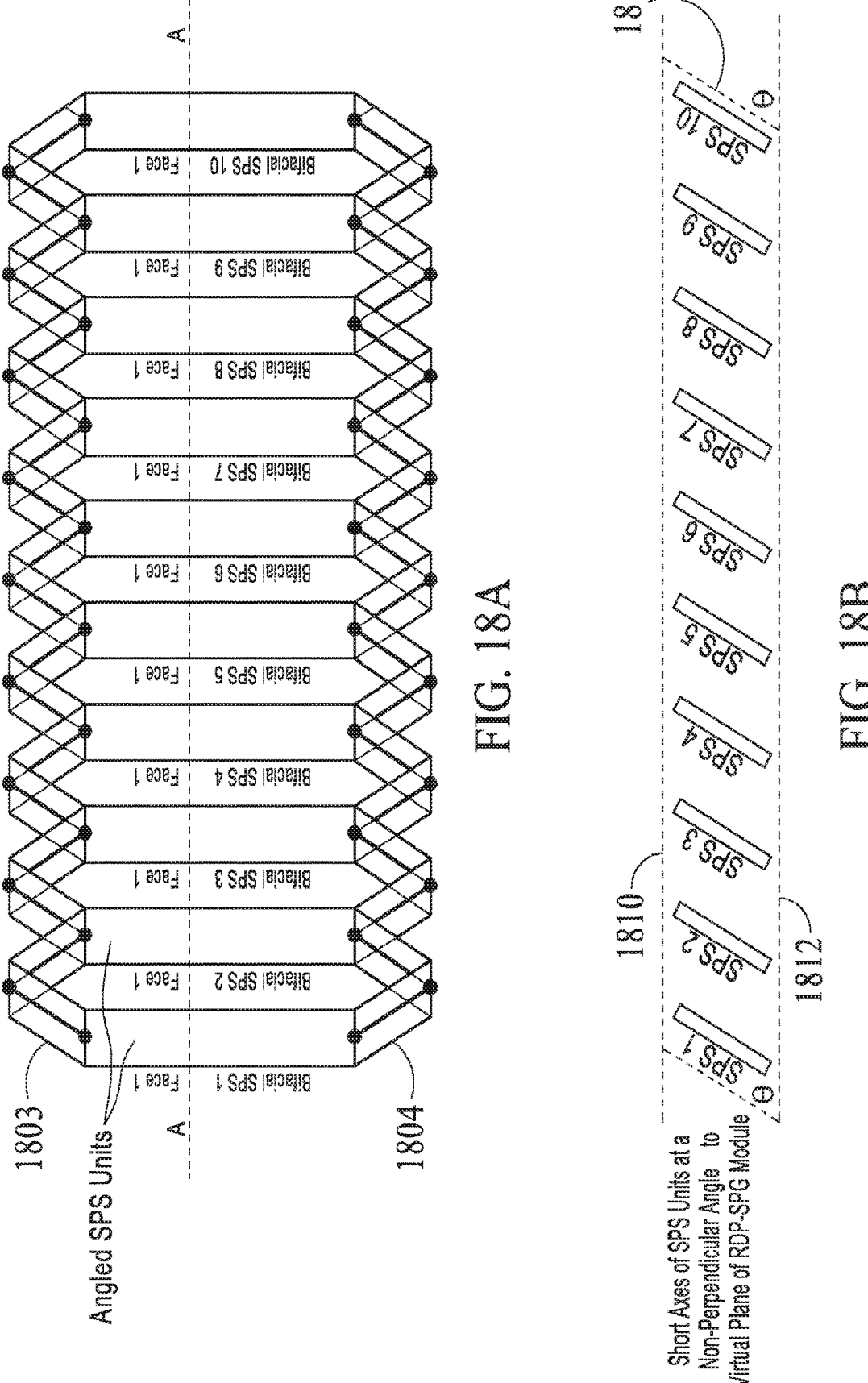
FIGS. 18A-18F show an open-structure configuration (with through-slat open gaps between adjacent SPS units when expanded) where short axes of SPS units are at a non-perpendicular angle with respect to virtual planes of the RDP-SPG module.

In another embodiment of the RDP-SPG modules of this disclosure, the shorter axes of the SPS units (which are perpendicular to the longer axes of the SPS units) are non-perpendicular (having a fixed non-perpendicular angle) to the virtual plane of the RDP-SPG module comprising one set of the long axes of the SPS units, while all the SPS unit planes are parallel to each other, as shown in FIG. 18A-B.

In another embodiment of the RDP-SPG modules of this disclosure, the shorter axes of the SPS units (which are perpendicular to the longer axes of the SPS units) have an adjustable angles (e.g., between >0° and 90°) to the virtual plan of the RDP-SPG module comprising one set of the long axes of the SPS units, while all the SPS unit planes are parallel to each other.

Figures 17A, 17B:
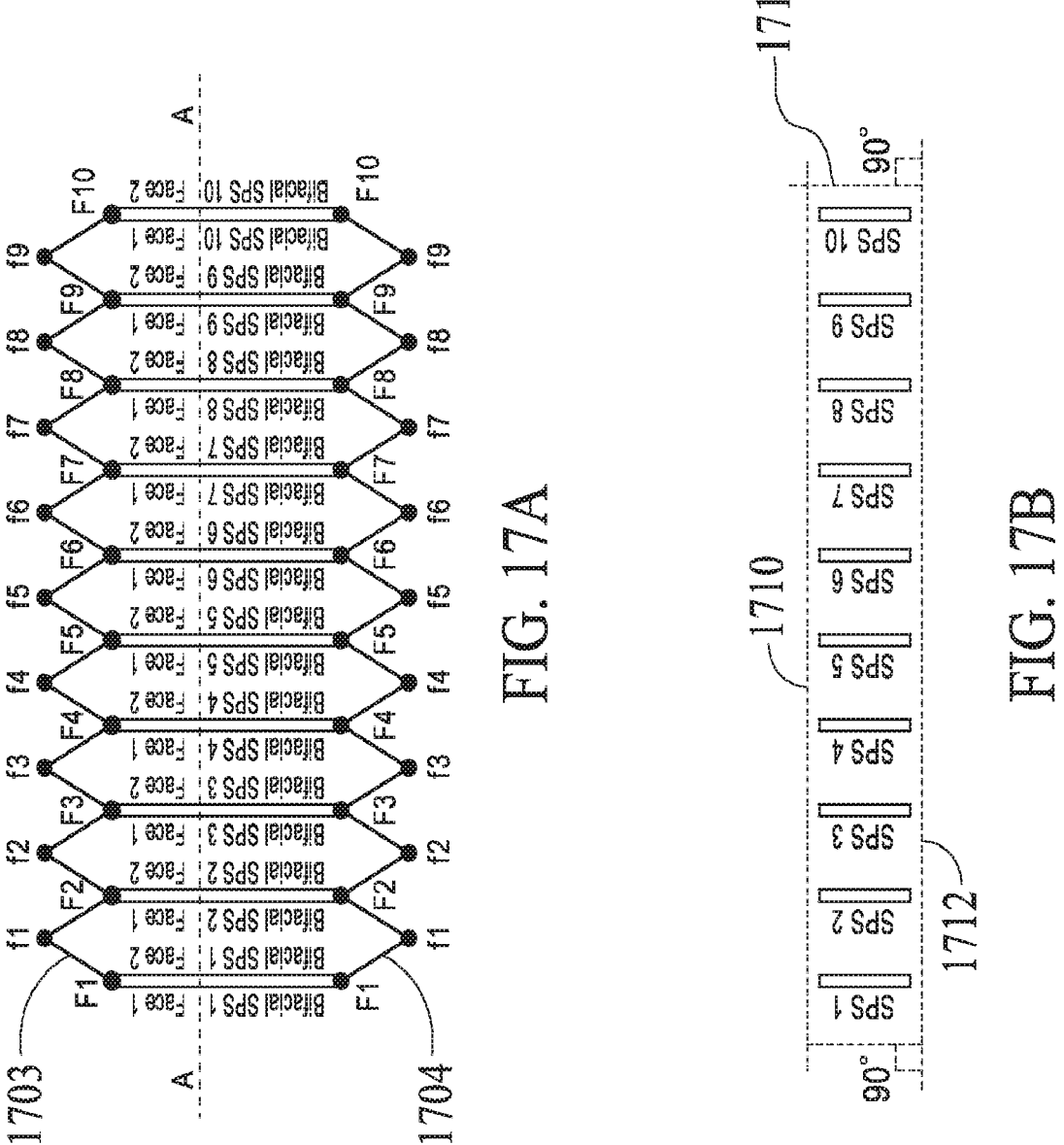
FIGS. 17A-17F show an open-structure configuration (with through-slat open gaps between adjacent SPS units when expanded) where short axes of SPS units are perpendicular to virtual planes of the RDP-SPG module.
Figures 17C, 17D:
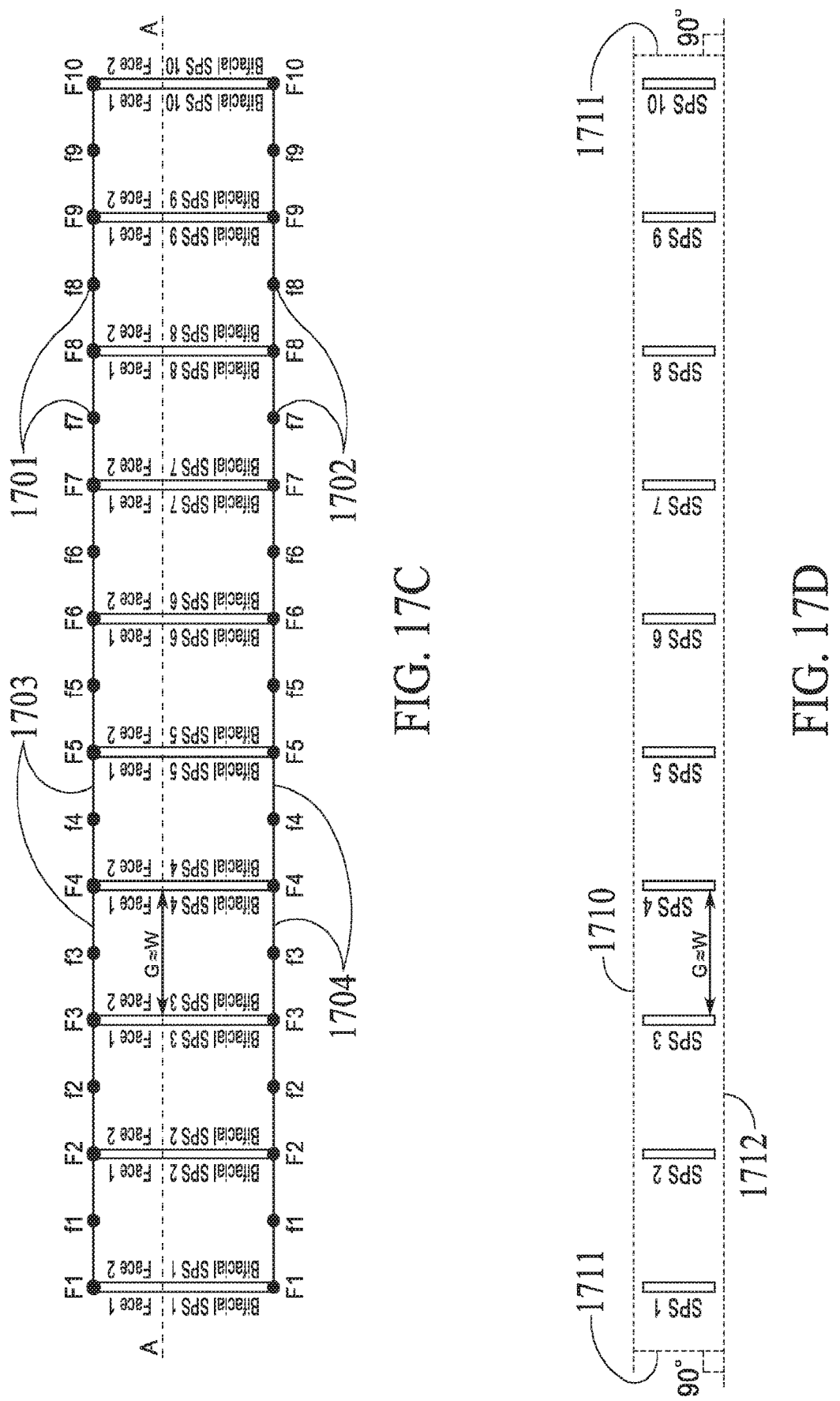
Figures 17E, 17F:
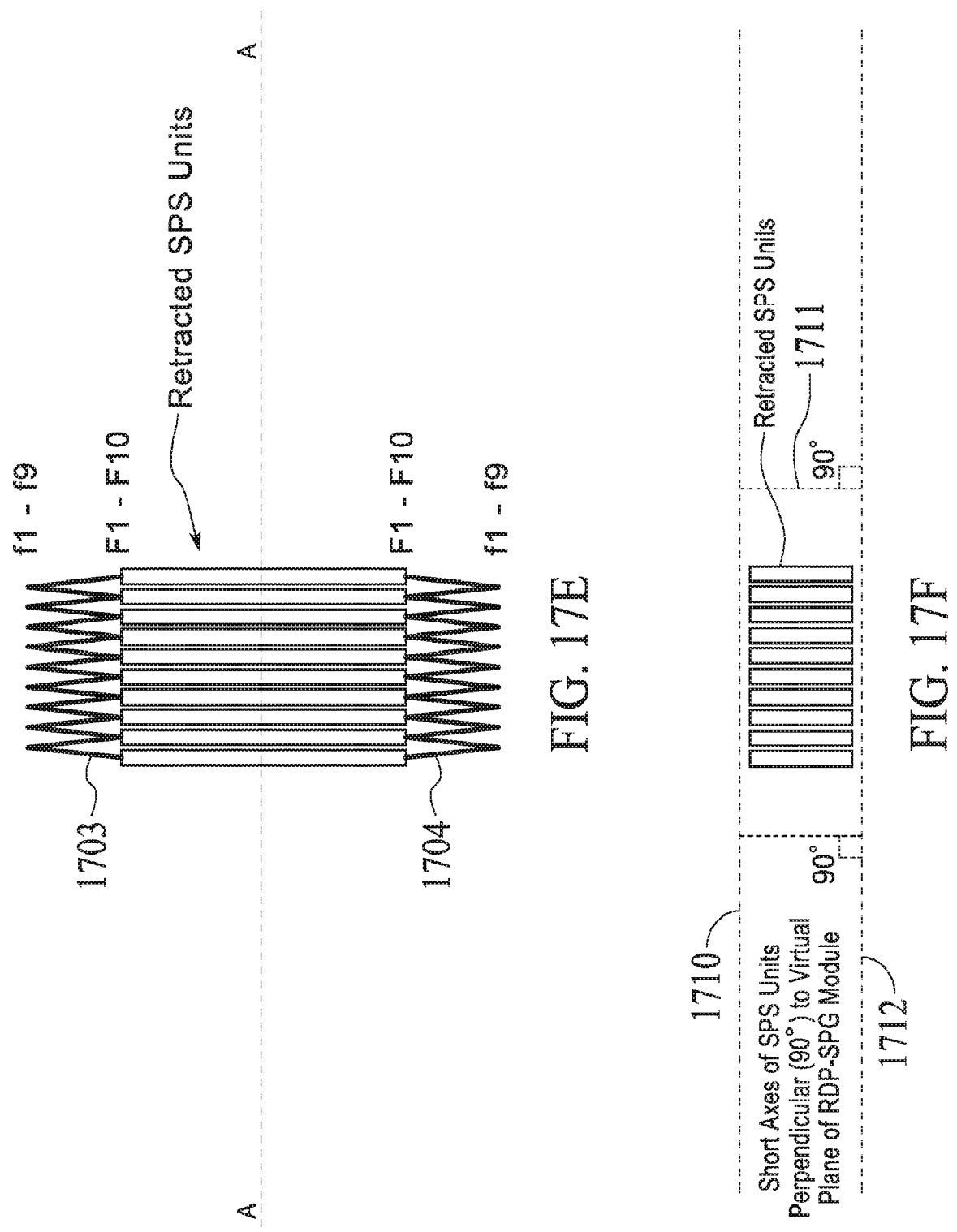

FIG. 17A shows schematic diagram of the top view of an open-structure RDP-SPG module in a partially extended state. Adjustable folding connector sheet 1703 on one side has folding/pivoting axes F1-F10 and f1-f19. Adjustable folding connector sheet 1704 on the other side also has folding/pivoting axes F1-F10 (elements 1701) and f1-f19 (elements 1702). FIG. 17B shows schematic diagram of a cross sectional view (along AA plane shown in FIG. 17A), where the short axes 1711 of SPS units are perpendicular to top virtual plane 1710 and bottom virtual plane 1712 of the RDP-SPG module. FIGS. 17C-D are respectively the top view and the cross-sectional view of the structure shown in FIGS. 17A-B, but in fully extended configuration. FIGS. 17E-F are respectively the top view and the cross-sectional view of the structure shown in FIGS. 17A-B, but in fully retracted configuration.

Figures 18C, 18D:
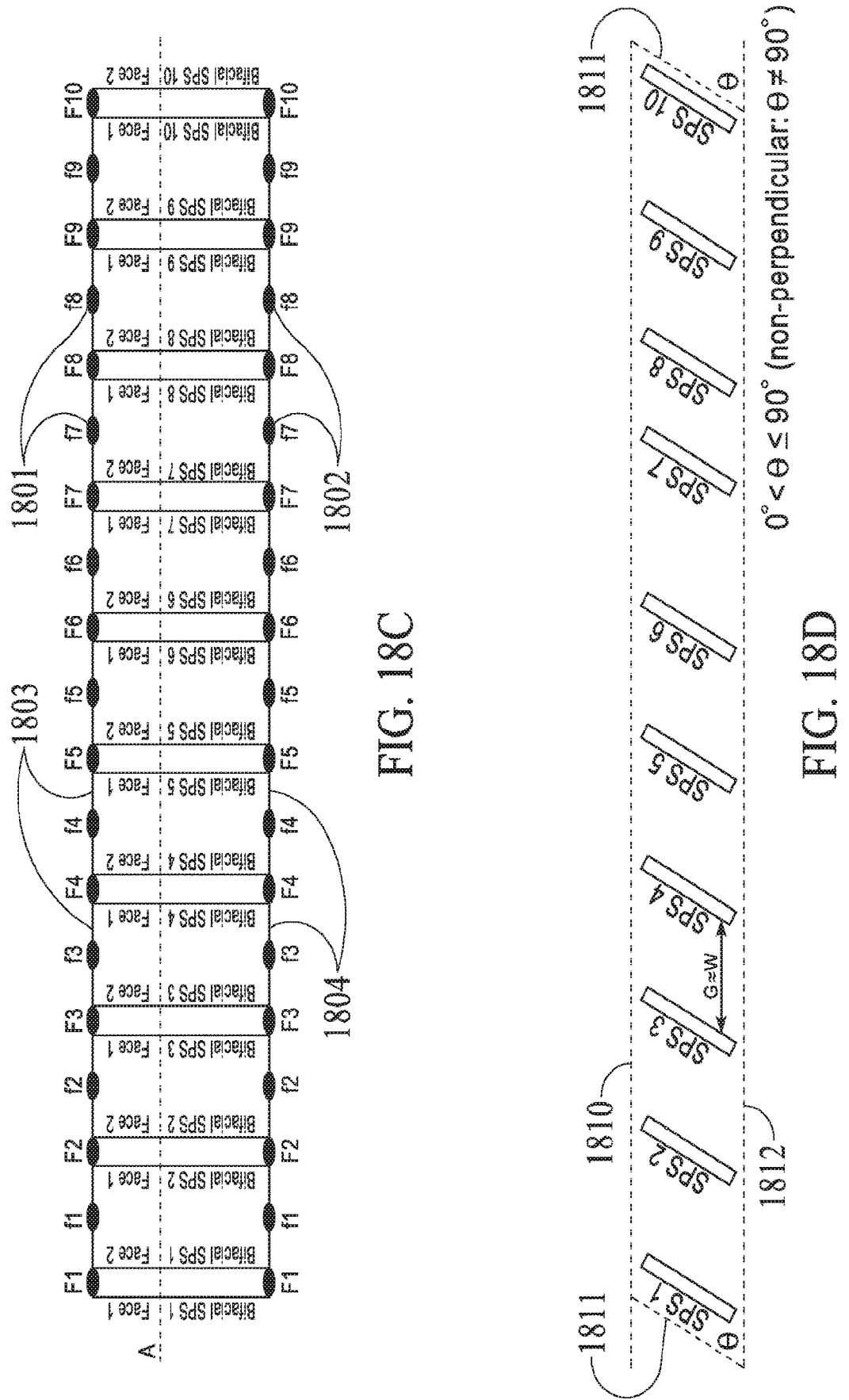
Figures 18E, 18F:
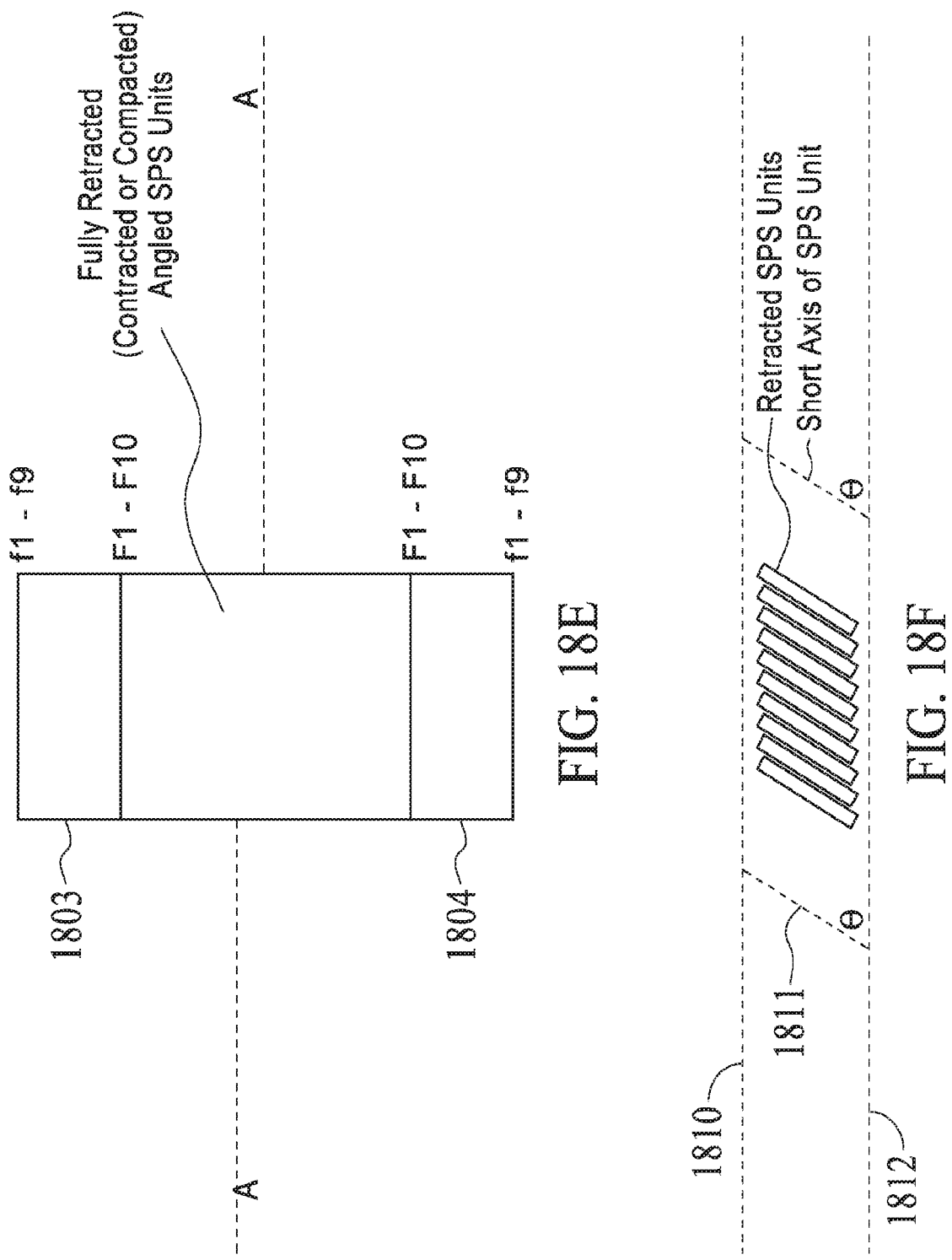

FIG. 18A shows schematic diagram of the top view of an open structure RDP-SPG module in a partially extended state (adjustable folding connector sheets 1803 and 1804 have segments folding outwards), where the short axes 1811 of SPS units are not perpendicular to top virtual plane 1810 and bottom virtual plane 1812 of the RDP-SPG module. The SPS building block units are angularly disposed with respect to the pivoting axes, but the units are parallel to one another. FIG. 18B shows schematic diagram of a cross sectional view (along AA plane shown in FIG. 18A), where it shows that the angle that the short axes of SPS units make with the bottom virtual plane is 0°<θ<90° (non-perpendicular: θ≠90°). FIGS. 18C-D are respectively the top view and the cross-sectional view of the structure shown in FIGS. 18A-B, but in fully extended configuration. FIGS. 18E-F are respectively the top view and the cross sectional view of an open structure shown in FIGS. 18A-B, but in fully retracted configuration.

Closed-Structure RDP-SPG Module

Figure 19A:
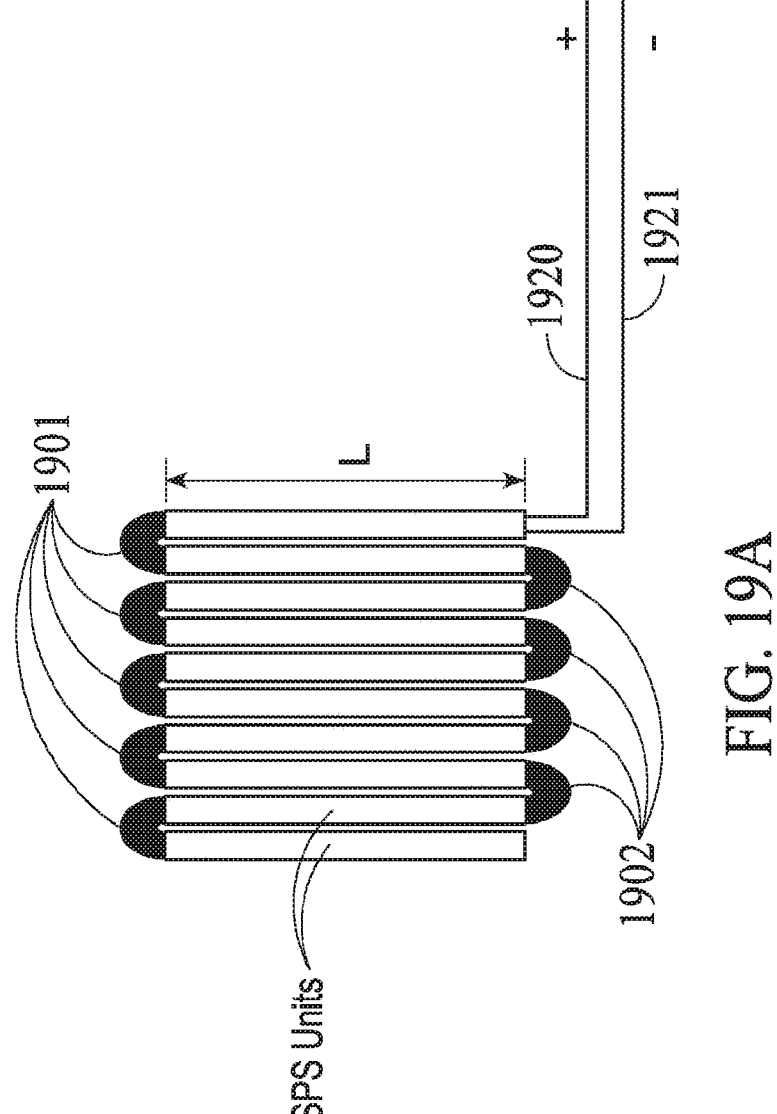
FIGS. 19A-19C show a closed-structure module configuration (without through-slat open gaps between adjacent SPS units).
Figure 19B:
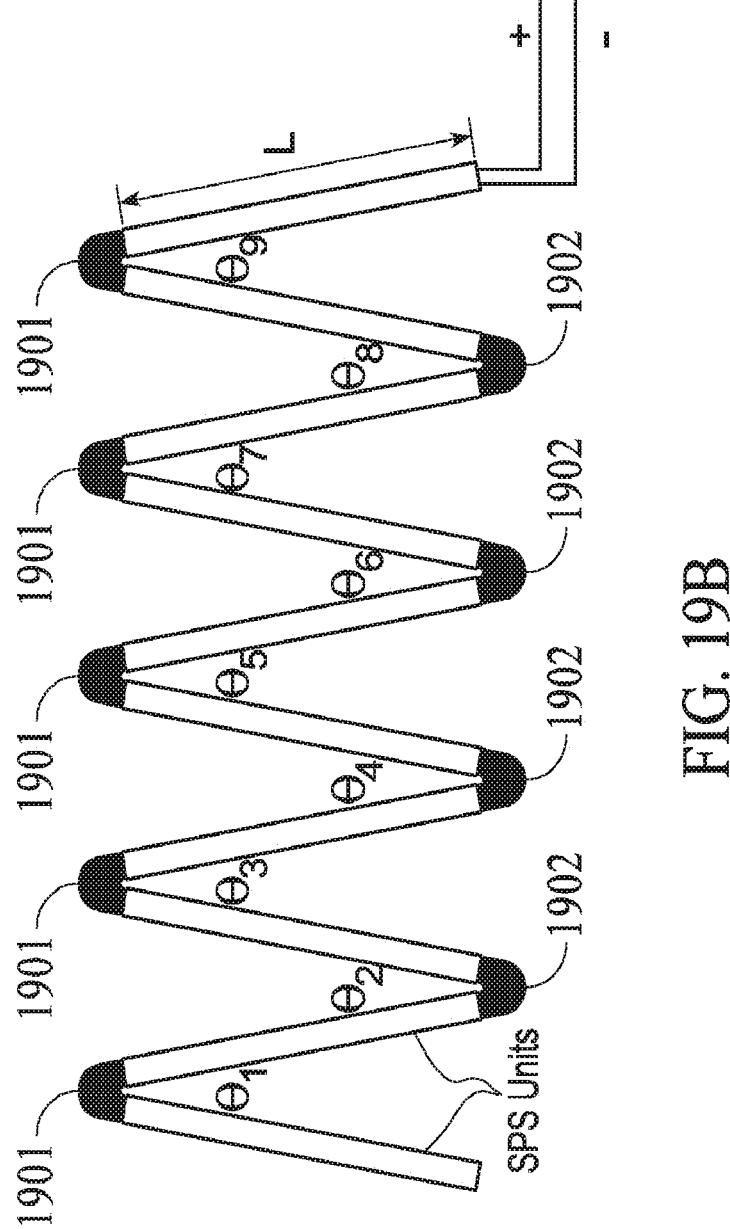
Figure 19C:
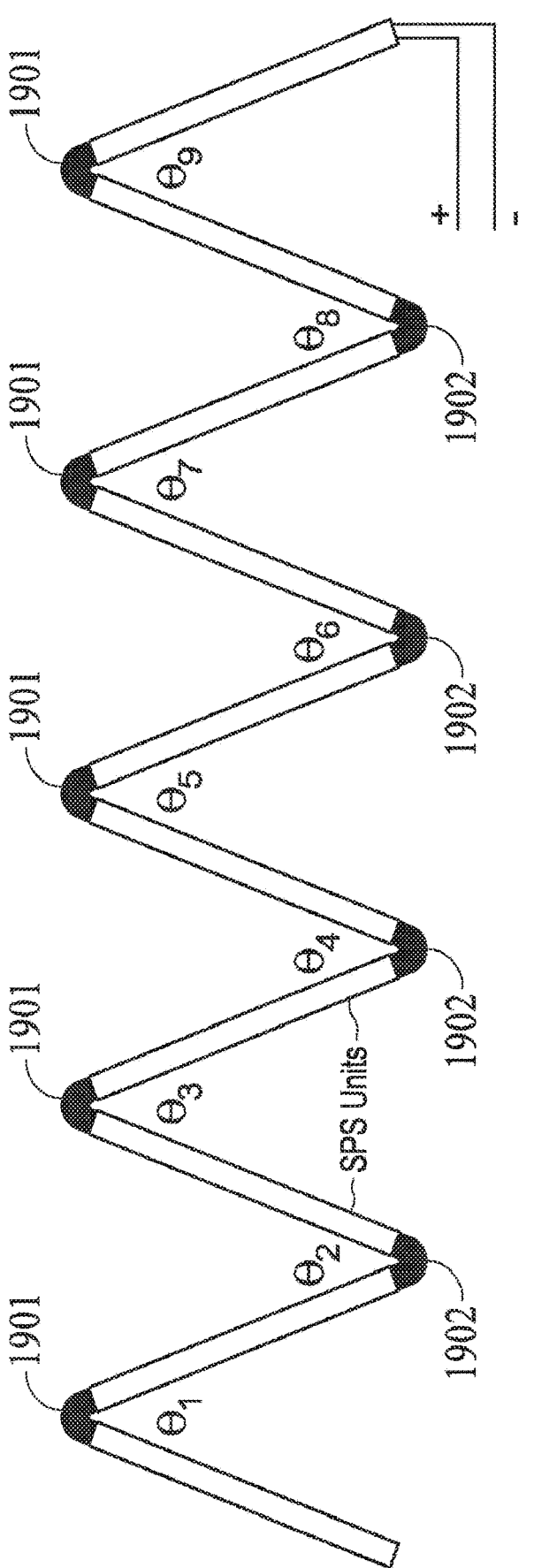

FIG. 19A shows a schematic diagram of a closed structure RDP-SPG module with 10 (i.e. U=10) bifacial SPS building blocks, shown in a fully retracted or compacted condition. Multiple Bifacial SPS Units are connected in series or in parallel or in hybrid series-parallel configuration through their folding or pivoting axes 1901 and 1902 on the opposite ends of SPS units. FIG. 19A-C show a design with the shorter sides of SPS units connected to the folding or pivoting axes. It is also possible to make Closed-structure RDP-SPG modules with the longer sides of SPS units connected to the folding or pivoting axes. In FIGS. 19A-C, L=Length of Bifacial SPS Unit (longer sides of SPS units). Width of Fully Retracted RDP-SPG Module=U×$T_{SPS}$, where $T_{SPS}$ is the SPS building block thickness. Fully Retracted Virtual Enclosure Volume: $V_R≈L×W×U×T_{SPS}$. The positive and negative powers leads are shown as elements 1920 and 1921.

FIG. 19B shows the structure in FIG. 19A in a partially expanded condition. The adjacent SPS pair angles $θ_1$ through $θ_8$ are adjustable in a range between 0° and 360° (or a subset of angles in this range), and these various angles are adjustable and may be equal to one another or different from one another. 1901 and 1902 are folding or pivoting axes comprising mechanical and electrical connectors in partially expanded position. FIG. 19C shows the closed structure of FIGS. 19A-B in a further extended condition.

SPS Building Block Electrical and Mechanical Attachment Leads

Figures 20A, 20B:
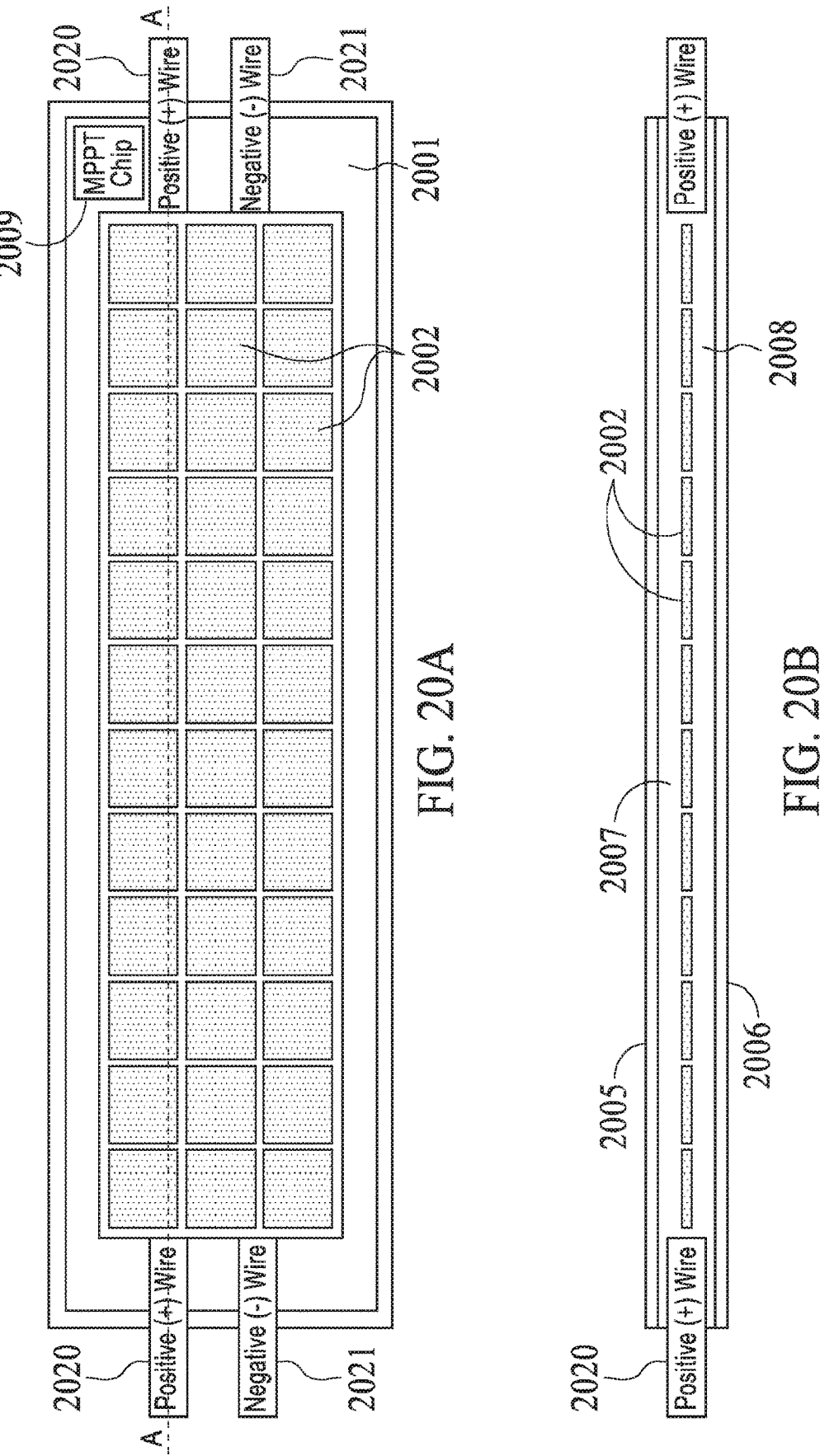
FIGS. 20A-20B show an example SPS building block with electrical and mechanical attachment leads.

FIG. 20A show representative example of an SPS building block electrical and mechanical attachment leads. This particular example shows rigid round wires which provide both mechanical (structural) and electrical support. In this example both sides have both positive and negative wires. In some other embodiment, one side of the module may have only a positive lead, while the other side has only a negative lead. Instead of round wire, positive or negative leads can be made of rigid ribbon connection. Ribbon connections can have dimension shorter than the full width of the SPS building block, or can cover the entire width of the SPS building block.

Referring back to the example of FIG. 20A, two pairs of electrical leads 2020 and 2021 provided as rigid metallic (e.g., copper or aluminum or their alloys) cylindrical wires from the opposite shorter sides of the SPS building block (positive & negative lead wires available on both ends). Wire leads are used for electrical and mechanical connections to the RDP-SPG folding (or pivoting) sheet connectors.

In the example shown in FIG. 20A, Z=1, S=4, M=3×3 (dimensions not shown to relative scale). The multi-modal MPPT chip 2009 is on the in-laminate frame 2001.

FIG. 20B shows the cross-sectional view along the plane AA shown in FIG. 20A. Thin (e.g., 0.025 to 0.500 mm) transparent Fluoroplastic (or Glass) cover sheet 2005 on face 1 and cover sheet 2006 on face 2 of the SPS unit protects the solar cells. Solar encapsulant layers 2007 and 2008 (e.g. EVA or POE or IBE) is used to encapsulate bifacial sides 1 and 2 of the sub-cells 2002.

The SPS building block units (each SPS unit having one or two pairs of connectors, for instance, combined electrical and mechanical connectors provided by the SPS frame protrusions or extensions at the shorter sides of the SPS units), may be easily attached to a pair of retractable & expandable folding (or pivoting) sheet connectors through one of a number of possible RDP-SPG design configurations, as follows:

Snap-in connections of the wire leads from the SPS units into the sheet connectors (for the designs using 1 or 2 pairs of rigid round wire leads, with the wires having a snap-in design;

Snap-in connections of the ribbon leads from the SPS units into the sheet connectors (for the designs using 1 or 2 pairs of rigid ribbon leads, with the ribbons having a snap-in design.

There are other possible designs for easy plugging of the SPS units into the sheet connectors. For example, notches or teeth in the frame extension can keep the SPS units attached to the sheet connectors after they are plugged in. The SPS frame extension may have copper covering, serving as mechanical and electrical connector.

Various Applications and Markets for the RDP-SPG Modules

Some possible applications for the RDP-SPG module include, but are not limited to the following:

Portable chargers for consumer power-on-the-go applications (~30 W to ~100 W modules);

Portable uninterrupted power supplies (e.g., ~100 W to 300 W modules);

Transportable modules for recreational vehicles and applications (~300 W to 1 kW modules);

Transportable modules for military applications (~300 W to ~1 kW modules);

Transportable electric vehicle chargers (~1.5 kW to 3 kW deployable canopies; 20-40 miles/day);

Quick-install residential & commercial applications (~300 W to 1 kW)—The RDP-SPG modules can be rapidly deployed and retracted for removal or relocation in these applications, either as rooftop modules or as lay-on-the-ground super-fast-install PV modules;

Portable power generators (~100 to 400 W modules) for the places where electrical infrastructure is inadequate. A wide range of other off-grid and grid-tied as well as portable and transportable power applications are possible.

FIG. 21 shows a table showing various representative preferred SPS building block unit and RDP-SPG module designs. In this table. E-cut means electrical cut, and M-cut means mechanical cut. $V_{oc}$ is open circuit voltage, and $I_{sc}$ is STC short-circuit current.

To summarize, this disclosure teaches various embodiments of RDP-SPG modules. Some non-limiting illustrative structural attributes of the SPS building block units are:

Each unit is (semi) rigid, planar, and elongated (preferably rectangular) with aspect ratio of ~2 to ~20;

Each unit is thin (≤3 mm), and lightweight to provide high power density (~50 $W_p$/kg to ~200 $W_p$/kg);

Each unit has a thin (<3 mm) in-laminate composite polymeric frame (e.g., made from light-density glass-filled polymers such as Ultramid or Ultradur or FR4 or other fiber-reinforced composites) for mechanical rigidity and support;

Each unit is bifacial to receive and convert light to electricity on both its opposite faces;

Each unit uses sub-cells based on a partitioning pattern providing a plurality of M=K×L (2≤M≤16; K & L from 1 to 8) bifacial sub-cells made from full bifacial solar cells using 1 to 5 electrical cuts;

Each unit uses at least one in-laminate super-cell having a plurality of (at least 10) sub-cells which are electrically connected together either as all-series or as hybrid parallel-series connections, and with super-cell voltage scale-up factor of 10 to 16, and current scale-down factor of 2 to 6, and super-cell block power in the preferred range of about 10 $W_p$ to ~30 $W_p$ per super-cell;

Arranged either as co-planar sub-cells or edge-overlapping sub-cells (with the latter sub-cell arrangement providing higher power densities than the co-planar arrangement);

Each unit uses at least one multi-modal MPPT chip attached to the power leads of the super-cell;

Each unit has a laminate structure with a pair of durable, high-optical transmissivity, impact resistant, weather resistant, flame resistant, lightweight, thermally stable, protective cover sheets (preferably ~0.025 to 0.125 mm thick sheets of fluoroplastics such as ETFE or FEP);

Each unit uses a pair of transparent encapsulant sheets (EVA, POE, or IBE) under both cover sheets;

Each unit has at least a pair of electrical leads (positive & negative power leads) on one or both shorter sides;

Each unit has mechanical connectors on both (and electrical connectors on 1 or both) shorter sides.

Some non-limiting illustrative structural attributes of the RDP-SPG modules are:

A module can have at least U=2 and up to U=45 bifacial SPS building block units used in its structure;

A module has U×Z multi-modal MPPT power optimizer chips attached to or embedded within the SPS building block units (Z is the number of super-cells per SPS building block unit and is typically between 1 and 5);

Provides a volume compaction ratio (ratio of the module's virtual enclosure volume when fully expanded to the module's virtual enclosure volume when fully retracted) of at least 10 and up to over 100, with typical module volume compaction ratios of 50 to 100;

Can be made using various design configurations, such as:

1. Open Structure (or Parallel-Spaced Structure) wherein the SPS building block units are spaced apart from each other (not contacting each other directly in the expanded or deployed mode; but stacked on each other when retracted), are parallel to one another, and can be either perpendicular (fixed 90° angle) or non-perpendicular (tilted with an angle of <90°) with respect to its virtual enclosure planes; the Open-Structure RDP-SPG modules may have a fixed SPS angle (perpendicular or tilted non-perpendicular), or may be designed to allow for adjustable SPS-to-virtual plane tilt angle in a range between 0° to 90°. The Open-Structure RDP-SPG modules utilize a pair of adjustable folding (or pivoting or hinged) thin sheet or framed connectors attached to the shorter sides of the SPS building blocks, providing electrical & mechanical connections to the SPS building blocks and allowance for full scale retraction and expansion of module. The Open-Structure RDP-SPG modules have negligible wind resistance forces, enabling easy drop-in outdoor installations in applications susceptible to high winds (e.g., commercial & industrial rooftop PV power generation.)

2. Closed Structure (or Connected Structure) wherein the adjacent SPS building block units are physically connected to each other (either on their longer sides or on their shorter sides), and are angled with respect to each other (with adjacent SPS-to-SPS angle of greater than 0° to less than 360° when deployed for power generation, or a subset thereof; the adjacent SPS-to-SPS angles=~0° or ~360° when in fully retracted mode); the Closed-Structure (or Connected Structure) RDP-SPG modules provide capability and allowance for adjusting the individual SPS-to-SPS plan angles between each pair of the adjacent SPS building block units, and various angles for various adjacent SPS pairs in the module may have equal or dissimilar SPS-pair angles.

The included descriptions and figures depict specific implementations to teach those skilled in the art how to make and use the best mode. For the purpose of teaching inventive principles, some conventional aspects have been simplified or omitted. Those skilled in the art will appreciate variations from these implementations that fall within the scope of the disclosure. Those skilled in the art will also appreciate that the features described above can be combined in various ways to form multiple implementations. As a result, the disclosure is not limited to the specific implementations described above, but only by the claims and their equivalents.

What is claimed is:

1. A solar photovoltaic (PV) module comprising:

a plurality of parallel smart power slat (SPS) units, each SPS unit having two shorter sides and two longer sides defining a plane, and said each SPS unit comprising a laminate comprising:

a single layer of a plurality of coplanar bifacial solar cells having electrical cuts and electrically connected together along said longer sides; and an in-laminate peripheral frame made of an electrically-insulating material for structurally supporting said single layer of a plurality of coplanar bifacial solar cells having electrical cuts, wherein said material is one material or a combination of materials comprising injection-moldable material;

wherein the plurality of parallel SPS units are mechanically connected such that the SPS units can be retracted for volume compaction of the module, and can be expanded for increasing PV electricity generation by the module; wherein a collapsible mechanical connector attached to the plurality of parallel SPS units has a first part and a second part, the first part connecting one edge of all the SPS units, and the second part connecting the opposite edge of all the parallel SPS units, thereby producing a retractable and expandable module structure, where all the parallel SPS units are structurally and electrically connected, wherein the planes of each of the SPS units remain parallel during retraction and expansion of the module.

2. The module of claim 1, wherein the plurality of coplanar solar cells having electrical cuts are bifacial crystalline solar cells.

3. The module of claim 2, wherein the bifacial crystalline solar cells comprise monocrystalline silicon solar cells.

4. The module of claim 3, wherein the bifacial crystalline solar cells comprise monocrystalline silicon heterojunction solar cells.

5. The module of claim 2, wherein the bifacial crystalline solar cells have STC conversion efficiency of approximately 21% or more, and comprise bifacial silicon passivated-emitter rear contact (PERC) solar cells or bifacial silicon heterojunction solar cells.

6. The module of claim 1, wherein the coplanar solar cells having electrical cuts are connected in electrical series or a hybrid of electrical parallel and series.

7. The module of claim 1, wherein the laminate of each SPS unit comprises an optically transparent protective cover sheet comprising a fluoropolymer material.

8. The module of claim 1, wherein the in-laminate frame of each SPS unit nests and structurally supports the coplanar solar cells having electrical cuts.

9. The module of claim 8, wherein the composite material is a lightweight injection moldable composite material made of a combination of a polymeric material and glass fibers providing high mechanical strength, rigidity, impact resistance, and thermal stability.

10. The module of claim 9, wherein the polymeric material is a glass-fiber reinforced polyamide.

11. The module of claim 1, wherein each SPS unit generates a peak solar PV power in the range of about 10-100 watts.

12. The module of claim 1, wherein the module delivers DC electric power output to one or both of a storage battery and a DC consumption load.

13. The module of claim 1, wherein the module delivers AC electric power output to an AC consumption load.

14. The module of claim 1, wherein a volume compaction ratio for the module is in the range of 10 to 100, wherein there is negligible spacing between adjacent parallel SPS units when the module is fully retracted for storage or portability.

15. The module of claim 1, wherein the first part and the second part of the collapsible mechanical connector comprise hinged connectors that pivot around the hinges.

16. The module of claim 1, wherein each SPS unit has a slat length larger than a slat width, and both slat length and slat width being substantially larger than a slat thickness.

17. The module of claim 16, wherein the slat width ranges between half the width of a non-partitioned crystalline solar cell without electrical cuts and twice the width of a non-partitioned crystalline solar cell without electrical cuts.

18. The module of claim 1, further comprising at least one power maximizing integrated circuit collecting electricity generated by the plurality of solar cells.

19. The module of claim 18, wherein each SPS unit has electrical power leads connected to output power leads of the at least one power maximizing integrated circuit collecting electricity generated by the plurality of coplanar solar cells having electrical cuts in that SPS unit.

20. The module of claim 19, wherein output power leads of all the power maximizing integrated circuits in the module are connected together according to an electrical interconnection design to deliver power generated by the module with a desired electrical voltage and current ranges.

* * * * *